(12) United States Patent
Sperry et al.

(10) Patent No.: US 11,950,509 B2
(45) Date of Patent: Apr. 2, 2024

(54) WOVEN GRAPHITE FIBER HEAT EXCHANGER

(71) Applicant: Technology Applications, Inc., Boulder, CO (US)

(72) Inventors: Brian Sperry, Boulder, CO (US); Trevor Sperry, Firestone, CO (US); Jamie Eyre, Boulder, CO (US)

(73) Assignee: Technology Applications, Inc., Boulder, CO (US)

( * ) Notice: Subject to any disclaimer, the term of this patent is extended or adjusted under 35 U.S.C. 154(b) by 682 days.

(21) Appl. No.: 16/699,381

(22) Filed: Nov. 29, 2019

(65) Prior Publication Data

US 2020/0279989 A1    Sep. 3, 2020

Related U.S. Application Data

(60) Provisional application No. 62/773,527, filed on Nov. 30, 2018.

(51) Int. Cl.
*H10N 10/13* (2023.01)
*F28F 21/02* (2006.01)
*H10N 10/17* (2023.01)

(52) U.S. Cl.
CPC .............. *H10N 10/13* (2023.02); *F28F 21/02* (2013.01); *H10N 10/17* (2023.02)

(58) Field of Classification Search
CPC .......... H01L 35/30; H01L 35/32; F28F 21/02; H10N 10/13; H10N 10/17
See application file for complete search history.

(56) References Cited

U.S. PATENT DOCUMENTS

| | | | | |
|---|---|---|---|---|
| 4,832,118 | A * | 5/1989 | Scanlon | F28F 21/02 165/179 |
| 5,471,367 | A * | 11/1995 | Krumweide | H05K 7/20545 165/185 |
| 5,520,976 | A | 5/1996 | Giannetti et al. | |
| 5,542,471 | A * | 8/1996 | Dickinson | F28F 21/02 165/185 |
| 5,962,348 | A * | 10/1999 | Bootle | H05K 7/20545 165/185 |
| 9,600,041 | B2 | 3/2017 | Ady et al. | |
| 2001/0047862 | A1 | 12/2001 | Anderson et al. | |
| 2007/0000642 | A1 * | 1/2007 | Yamazaki | H01L 23/3677 257/E23.105 |

(Continued)

FOREIGN PATENT DOCUMENTS

WO    WO 01/000913 A1    1/2001

OTHER PUBLICATIONS

Echigo et al. (1992) "Fine-tube heat exchanger woven with threads," Int. J. Heat Mass Transfer., 35(3), 711-717.

(Continued)

*Primary Examiner* — Tho V Duong
(74) *Attorney, Agent, or Firm* — Leydig, Voit & Mayer, Ltd.

(57) ABSTRACT

The present invention provides heat exchanger systems, and associated methods, using thermally anisotropic carbon fiber materials, preferably woven graphite fiber sheets, where convection is used to transfer heat from the heat exchanger to a lower temperature fluid, such as circulating air or cooling liquid.

24 Claims, 45 Drawing Sheets

(56) References Cited

U.S. PATENT DOCUMENTS

2011/0067864 A1*  3/2011  Reddy .................... C09K 8/467
                                                              427/136
2014/0248515 A1*  9/2014  Wayne ................ H01M 10/655
                                                               429/82
2016/0090184 A1*  3/2016  Ghoshal .................. H01L 35/32
                                                              136/205

OTHER PUBLICATIONS

Hemrick et al. (2011) "Woven graphite fiber structures for use in ultra-light weight heat exchangers," Carbon, 49, 4820-4829.
Raudensky et al. (2016) "Polymeric hollow fiber heat exchangers," WIT Trans. Eng. Sci., 106(11), 95-105. doi: 10.2495/HT160101.

* cited by examiner

|  | h = 1 | h = 5 | h = 10 |
|---|---|---|---|
| Temperatures | | | |
| TEG hot side | 253 C | 400 C | 483 C |
| TEG cold side | 166 C | 125 C | 104 C |
| Heat Flows | | | |
| Total heat flow | 165 W | 522 W | 720 W |
| Through TEGs | 151 W | 476 W | 654 W |
| Efficiencies | | | |
| % of heat flow through TEGs | 92 % | 91 % | 91 % |
| TEG Efficiency | 2.1 % | 6.8 % | 9.4 % |
| Power Output | 3.2 W | 32 W | 61 W |

(1) TEGs, no fan, (2) 2 TEGs, fan included, and (3) 3 TEGs, fan included. The star (*) is the current 35 W module.

Power density (W/kg) of the "Book" configuration on the cold side being (1) 4 TEGs, no fan, (2) 2 TEGs, fan included, and (3) 3 TEGs, fan included. The star (*) is the current 35 W module.

WOVEN GRAPHITE FIBER HEAT EXCHANGER

CROSS-REFERENCE TO RELATED APPLICATIONS

This application claims priority from U.S. Provisional Patent Application No. 62/773,527, filed Nov. 30, 2018, which is incorporated by reference herein to the extent that there is no inconsistency with the present disclosure.

STATEMENT REGARDING FEDERALLY SPONSORED RESEARCH OR DEVELOPMENT

This invention was made with Government support under contract no. W911QX-17-C-0048 awarded by the U.S. Department of Defense. The Government has certain rights in the invention.

BACKGROUND OF INVENTION

A heat exchanger is a device typically used to transfer heat between an object and a fluid, or between two fluids. For instance, a heat exchanger may be used to transfer heat from an electronic component (or from air surrounding an electronic component) to a moving fluid, such as air or a liquid coolant. Heat can be transferred to and from the heat exchanger through conduction, convection, or both.

Heat exchangers come in a wide variety of shapes, sizes, and materials and are employed in many industries, ranging from commodity chemicals manufacturing to microelectronic devices. Heat exchanger design and materials often depend on the specific industries and situational needs and parameters. For example, microelectronics may require high thermal transfer rates (conductive and/or convective), compactness, and low cost. Spacecraft may require high thermal transfer rates, low weight, and long-term durability. Certain applications may require high flexibility of the components, low cost, durability during repeated bending, and/or durability against vibration or shock. In some applications, conductive point-to-point heat transfer is not available or convective heat transfer is preferable, such that the heat exchanger must be capable of effective convective heat transfer. No single conventional heat exchanger technology offers all of these advantages. For example, metal heat pipes formed of copper or aluminum have high thermal conductivities but are heavy and lack flexibility.

Materials and heat exchangers which are able to provide high point-to-point heat transfer through conduction may not be suitable for providing additional heat transfer through convection. Graphite is a material used in heat exchangers due to its thermal conductivity and other physical properties. However, graphite is known to be very anisotropic, meaning that thermal and electrical conductivity are very high in one direction or plane but are much lower in a different direction or plane. While graphite may be very efficient in providing point-to-point heat transfer through conduction in one direction, very little heat transfer would be expected through convection in other directions. As a result, graphite fibers or sheets have often been precluded from being used for applications requiring convective heat transfer.

It will therefore be appreciated from the foregoing that there remains a need in the art for heat exchangers that can effectively utilize both conductive and convective heat transfer and which can offer advantages such as high flexibility, high conductive and convective thermal transfer rates, compactness, and long term durability, particularly against bending, vibration, and shock.

SUMMARY OF THE INVENTION

The present invention provides heat exchanger systems, and associated methods, using thermally anisotropic carbon fiber materials. The heat exchangers disclosed herein have properties which allow them to be used across a wide array of industries and applications. In an aspect of the invention, the heat exchangers are lightweight, flexible, and exhibit minimal wear and tear despite repeated bending and movement and have substantial durability against vibration and shock. In additional aspects, the heat exchangers may also be adapted for small volumes, including electronics, and may be retrofitted for currently existing applications. Heat exchangers disclosed herein include, but are not limited to, anisotropic graphite fiber sheets, such as woven graphite fiber sheets, and offer high thermal conductive heat transfer rates as well as effective convective heat transfer.

In an embodiment, the invention provides a heat exchanger comprising: (a) one or more carbon fiber sheets, each carbon fiber sheet having a first end and a second end and comprising a plurality of carbon fibers oriented in a direction extending from the first end to the second end, wherein said carbon fiber sheets are thermally anisotropic in the direction extending from the first end to the second end; and (b) a support structure comprising one or more holding regions, wherein the one or more carbon fiber sheets are connected to the support structure at the one or more holding regions. Preferably, the carbon fiber sheets are graphite fiber sheets, even more preferably woven graphite fiber sheets.

In an embodiment, the invention provides a heat exchanger comprising: (a) one or more carbon fiber sheets, each carbon fiber sheet having a first end and a second end and comprising a plurality of carbon fibers oriented in a direction extending from the first end to the second end, wherein said carbon fiber sheets are thermally anisotropic in the direction extending from the first end to the second end; (b) a high temperature heat source adjacent to and in thermal communication with the first ends of the one or more carbon fiber sheets; and (c) a lower temperature source adjacent to and in thermal communication with the second ends of the one or more carbon fiber sheets. Optionally, the heat exchanger further comprises at least one of: (i) a first fluid contacting the high temperature heat source and the one or more carbon fiber sheets near the first ends, and (ii) a second fluid contacting the lower temperature source and the one or more graphite fiber sheets near the second ends. The first fluid and second fluid are, independently from one another, a liquid or a gas. Preferably, the carbon fiber sheets are graphite fiber sheets, even more preferably woven graphite fiber sheets.

Optionally, heat transfer between the one or more carbon fiber sheets and the high temperature heat source occurs substantially by convection or substantially by convection and radiation through the first fluid. Similarly, heat transfer between the one or more carbon fiber sheets and the lower temperature source optionally occurs substantially by convection or substantially by convection and radiation through the second fluid.

The ability of the heat exchangers of the present invention to effectively use convection to transfer heat, particularly to the second fluid, is surprising given that the carbon fibers are thermally anisotropic. Normally, heat exchange systems which utilize thermally anisotropic materials would only be expected to transport heat along a single direction, such as heat transfer through point-to-point conduction. However, the carbon fiber sheets of the present heat exchange systems have dimensions which allow for sufficient convection over the length of the carbon fiber sheets to effectively transfer the heat and cool the heat source. This further allows for greater flexibility and configurations of the heat exchange system. Additionally, this allows the heat exchange systems to be used in smaller confined spaces as well as for portable light-weight applications.

In a further embodiment, the heat exchanger includes a support structure. Certain elements of the support structure may be configured to connect two or more carbon fiber sheets to each other and/or to connect (e.g., conductively couple) one or more carbon fiber sheets to a high temperature source or a low temperature source.

For example, a heat exchanger may comprise a support structure having or more holding regions, where the one or more carbon fiber sheets are connected to the support structure at the one or more holding regions. Each of the one or more holding regions is connected to a portion of a carbon fiber sheet at the first end, the second end, or between the first and second ends of the graphite sheet. The holding regions may surround a portion of a carbon fiber sheet, and may be connected using one or more epoxies, friction fittings, compression fittings, clamps, bolts, screws, brackets, or any combination of these.

In an embodiment, the carbon fiber sheets are connected to the holding regions using an end-mounted configuration or a side-mounted configuration. The end-mounted configuration places a portion of the carbon fiber sheets perpendicular to the heat source, while the side-mounted configuration places a portion of the carbon fiber sheets parallel to the heat source. Optionally, the first end of the carbon fiber sheet is in direct contact with the high temperature source to minimize thermal resistances at the interface contacts. Alternatively, the first end of the carbon fiber sheet is optionally separated from the high temperature source by a thin plate, such as a thin aluminum plate or other type of metal plate. In an embodiment, the heat exchanger comprises one or more carbon fiber sheets connected to at least one holding region using a side-mounted configuration where a portion of the one or more carbon fiber sheets is optionally separated from the high temperature source by a thin metal plate. Optionally, the ends of the carbon fibers within the carbon fiber sheet have different length. In certain attachments, the uneven ends of the different carbon fibers may allow for more efficient heat transfer.

The high temperature source and a lower temperature source are, independently from one another, selected from a wide variety of elements, materials, or systems. For example, a high temperature source may include, but is not limited to, electronics, electronic enclosure/casings, a stove, a furnace, a hot fluid, a conduit or enclosed space with hot fluid therein, or a heating element. A lower temperature source may include, but is not limited to, a cooling element, a cool fluid (relative to the high temperature source), circulating air, or a conduit or enclosed space with cooler fluid therein. An element or system may have different surfaces or portions that are a high temperature source (e.g., a surface to be cooled) or a low temperature source (e.g., a surface to be heated), such as a thermoelectric generator (TEG).

Thermoelectric generation via camp fires or stoves is a new and innovative method for charging small devices while in a remote location. Several products currently on the market use fire from burning gas or wood with a power outage of up to 10 W via a thermoelectric generator (TEG). One of these products uses a copper heat pipe to transfer heat from a fire to the TEG while a fan is used for cooling, that can produce 5V, 2A of live power. Another design uses boiling water and a heat sink to produce the same power outage of 5V, 2A. These devices are small and compactable; however the power outage is too small for wide application and utilizes fans or water. It is one goal of the present invention to create a heat exchanger device that will accommodate 35 W of power or more that is lightweight and compact, while using an uncomplicated method of cooling without the use of water or fans.

In an embodiment, the high temperature heat source is a surface of a thermoelectric generator and the heat exchanger is designed to transfer heat away from this surface of the thermoelectric generator. Optionally, the high temperature heat source and the lower temperature source are a first surface and a second surface of a thermoelectric generator, respectively, where the first and second surfaces being opposite of each other. In an embodiment, the first surface is at a lower temperature surface of the thermoelectric generator and the second surface is at a higher temperature surface of the thermoelectric generator.

The first fluid and second fluid are, independently from one another, a gas (including but not limited to air) or a liquid. For example, in an embodiment, the first fluid is a gas and the second fluid is a liquid. Alternatively, the first fluid is a liquid and the second fluid is a gas.

At least a portion of the first end of each carbon fiber sheet is in thermal communication with a high temperature source and at least a portion of the second end of each carbon fiber sheet is in thermal communication with a lower temperature source. Thermal communication between a carbon fiber sheet and a high temperature source may include convective heat transfer, conductive heat transfer, or both. Thermal communication between a carbon fiber sheet and a lower temperature source may also include convective heat transfer, conductive heat transfer, or both, but preferably contains a substantial amount of convective heat transfer. As used herein, convection is natural convection, forced convection, or both natural and forced convection.

In an embodiment, at least one or both of the first and second ends, independently from one another, of the one or more carbon fiber sheets are not conductively coupled with the high and low temperature heat sources. Optionally, at least one of the first and second ends, independently from one another, of the one or more carbon fiber sheets is conductively coupled with the high and low temperature heat sources.

In an embodiment, heat transfer between the one or more carbon fiber sheets and the high temperature heat source may occur substantially by conduction, by convection, by radiation through the first fluid, or by any combination thereof. Similarly, in an embodiment, heat transfer between the one or more carbon fiber sheets and the lower temperature source occurs substantially by convection, or by convection and radiation through the second fluid. Optionally, heat transfer between the one or more carbon fiber sheets and both the high temperature heat source and low temperature source occurs substantially only by convection or substantially only by convection and radiation through the first fluid and second fluid.

A heat exchanger may have a variety of shapes, sizes, and configurations. For example, a heat exchanger may include multiple carbon fiber sheets, preferably graphite fiber sheets, optionally arranged in bundles or rows. Additionally, at least one of the one or more carbon fiber sheets may be wrapped around a fluid conduit or arranged in a curve around the high temperature heat source.

The heat exchangers may further comprise additional components to move or circulate gas or other fluids around the carbon fiber sheets, such as a fan, a blower, a pump, or a combination thereof.

In an embodiment, the heat exchanger comprises two or more carbon fiber sheets, four or more carbon fiber sheets, 10 or more carbon fiber sheets, 50 or more carbon fiber sheets, or 100 or more carbon fiber sheets. Preferably, the carbon fiber sheets are graphite fiber sheets, such as woven graphite fiber sheets. In an embodiment, the carbon fibers are oriented in the same direction in the direction extending from the first end to the second end of the carbon fiber sheet.

Each or a fraction of the carbon fiber sheets of a heat exchanger having two or more carbon fiber sheets may have different mechanical and/or thermal properties. For example, the mechanical and thermal properties of the carbon fiber sheets may be affected by the type(s) of carbon fibers used, the configuration of the carbon fibers into tows, and the way the carbon fibers are arranged in the sheets. For example, the carbon fiber sheets may be woven and/or braided. Optionally, the carbon fiber sheets have one or more types of carbon fibers therein. The carbon fiber sheets may further comprise natural and/or synthetic fibers used to bind at least a portion of the carbon fibers together or to provide a shape to the carbon fiber sheet.

In certain embodiments, coatings and resins are applied to the carbon fiber sheets and woven cloths to provide improved durability to physical damage, protection from fire damage, conductivity, structural support, and/or other desired properties. For example, polymer resins are cured under heat and pressure to create a composite woven carbon fiber material with varying rigidity. Alternatively, or in addition to such resins, thin coatings can be added to protect and improve the performance of the carbon fibers.

Coatings include, but are not limited to, boron nitride, especially hexagonal boron nitride. Boron nitride has high conductivity properties similar to that of graphite, and is often used as a thermal interface material. Such coatings can be applied using know deposition techniques, but are preferably applied using methods such as spraying or with a plasma type deposition chamber.

In an embodiment, the heat exchanger comprises one or more graphite sheets, preferably woven graphite sheets, where each graphite sheet conducts heat substantially only along a length of each graphite fiber between the first and the second ends.

In an embodiment, the one or more graphite fiber sheets have a bend radius selected from the range of the range of 1 mm to 5 in. Optionally, the one or more graphite fiber sheets have a vibration resistance of at least 125 HZ, 800 HZ, or 2000 HZ, and/or a shock resistance of at least 1000 Hz, 3500 HZ, or 10,000 Hz.

In an embodiment, the graphite fiber sheets have a thermal conductivity of at least 400 W m$^{-1}$ K$^{-1}$, at least 600 W m$^{-1}$ K$^{-1}$, at least 800 W m$^{-1}$ K$^{-1}$, at least 900 W m$^{-1}$K$^{-1}$ or at least 1000 W m$^{-1}$ K$^{-1}$. Optionally, the graphite fiber sheets have a per unit mass thermal conductance that is at least five times greater than the per unit mass thermal conductance of copper fins in a conventional heat exchanger. Preferably, the graphite fiber sheets are capable of withstanding temperatures of 400° C. or greater, 600° C. or greater, 800° C. or greater, 1000° C. or greater, or 2,000° C. or greater. Aluminum heat exchangers typically melt or structurally fail at temperatures of or greater.

In an embodiment, a ratio of an in-plane thermal conductivity to a transverse thermal conductivity of one or more graphite fiber sheets is greater than or equal to 1.10, preferably greater than or equal to 5.00. In an embodiment, a ratio of thermal conductivity in a first in-plane direction to thermal conductivity in a second in-plane direction of one or more carbon fiber sheets is greater than or equal to 1.50.

In an embodiment, the graphite fibers may be selected from the group consisting of pitch-based fibers, polyacrylonitrile-based fibers, or a combination of these coal tar pitch-based carbon fibers. Optionally, the graphite fibers are coal tar pitch-based carbon fibers.

In an embodiment, the present invention provides a thermoelectric generator system comprising: (a) thermoelectric circuit having a high temperature surface, a lower temperature surface, and two different thermoelectric materials able to generate an electric current when a temperature difference is present between the high temperature surface and a low temperature surface; and (b) a heat exchanger comprising a first set of carbon fiber sheets, each carbon fiber sheet having a first end and a second end and comprising a plurality of carbon fibers oriented in a direction extending from the first end to the second end, wherein said carbon fiber sheets are thermally anisotropic in the direction extending from the first end to the second end. The first ends of the first set of carbon fiber sheets are attached and are in thermal connection with the lower temperature surface of the thermoelectric circuit, and the second ends of the first set of carbon fiber sheets are able to transfer heat away from the lower temperature surface. Optionally, the thermoelectric generator comprises a second set of carbon fiber sheets where the first ends of the second set of carbon fiber sheets are in thermal connection with a high temperature heat source, and the second ends of the second set of carbon fiber sheets are attached and are in thermal connection with the high temperature surface of the thermoelectric circuit.

In an aspect of the invention, the invention provides for methods for transferring heat. In an embodiment, the method comprises the steps of: (a) providing a heat exchanger, said heat exchanger comprising one or more carbon fiber sheets, each carbon fiber sheet having a first end and a second end and comprising a plurality of carbon fibers oriented in a direction extending from the first end to the second end, wherein said carbon fiber sheets are thermally anisotropic in the direction extending from the first end to the second end; (b) positioning the first ends of the one or more carbon fiber sheets to be in thermal communication with a high temperature heat source, and the second ends of the one or more carbon fiber sheets to be in thermal communication with a lower temperature source; and (c) transferring heat between the high temperature heat source and the lower temperature source. Preferably, the carbon fiber sheets are graphite fiber sheets. Preferably, the graphite fiber sheets are woven, braided, or a combination thereof, to form the graphite fiber sheets.

In a further embodiment, heat transfer between the one or more carbon fiber sheets and the high temperature heat source occurs substantially by conduction, by convection, by radiation through a first fluid, or by a combination thereof. Optionally, heat transfer between the one or more carbon fiber sheets and the lower temperature source occurs substantially only by convection or substantially only by convection and radiation through a second fluid; wherein the first fluid and second fluid are, independently from one another, a liquid or a gas.

In further embodiments, the method further comprises the step of pumping, blowing, or pushing the first fluid, second fluid, or both fluids, over one or more surfaces of the one or more carbon fiber sheets.

Without wishing to be bound by any particular theory, there may be discussion herein of beliefs or understandings of underlying principles relating to the devices and methods disclosed herein. It is recognized that regardless of the ultimate correctness of any mechanistic explanation or hypothesis, an embodiment of the invention can nonetheless be operative and useful.

DETAILED DESCRIPTION OF THE INVENTION

Figure 1:
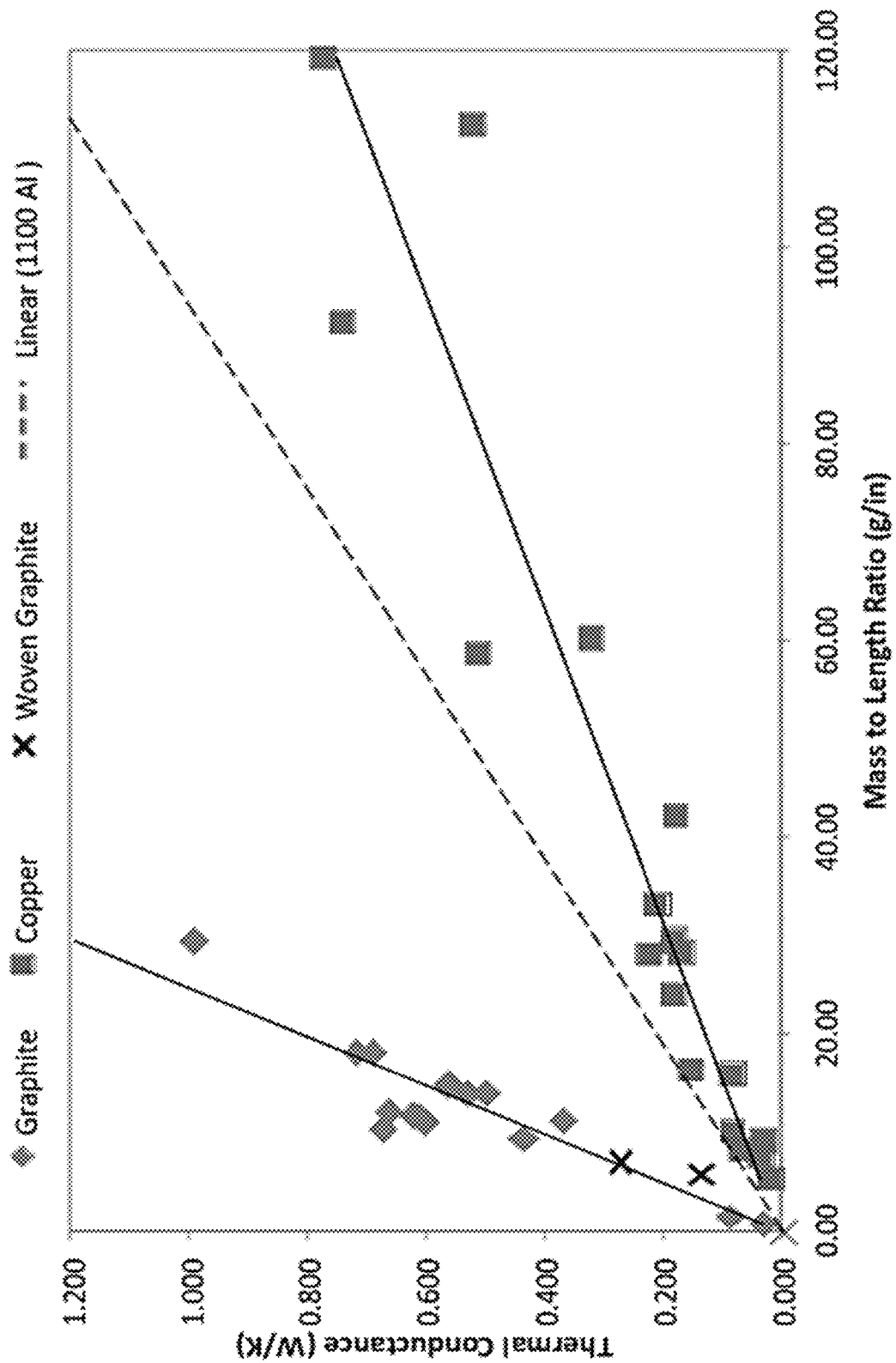
FIG. 1 is a chart of thermal conductance versus mass and length of thermal strap materials, such as graphite, copper and woven graphite. The linear trend line represents thermal straps made from 1100 aluminum.

In general the terms and phrases used herein have their art-recognized meaning, which can be found by reference to standard texts, journal references and contexts known to those skilled in the art. Referring to the drawings, like numerals and descriptions indicate like elements and the same number and descriptions appearing in more than one drawing refers to the same element. The following definitions are provided to clarify their specific use in the context of the invention.

"Thermal contact" and "thermal communication" are used synonymously and refer to an orientation or position of elements or materials, such as a graphite fiber sheet, a heat source, or a thermoelectric generator, such that there is more efficient transfer of heat between the two elements than if they were thermally isolated or thermally insulated. Elements or materials may be considered in thermal communication or contact if heat is transported between them more quickly than if they were thermally isolated or thermally insulated. Two elements in thermal communication or contact may reach thermal equilibrium or thermal steady state and in some embodiments may be considered to be constantly at thermal equilibrium or thermal steady state with one another. In some embodiments, elements in thermal communication with one another are separated from each other by a thermally conductive material or intermediate thermally conductive material or device component. Heat transfer between elements in thermal communication may occur by convection, radiation, and/or conduction. In some embodiments, elements in thermal communication with one another are separated by a distance of 1 mm or more, 1 cm or more, 1 inch or more, or 12 inches or more. In some embodiments, elements in thermal communication with one another are provided in direct physical contact.

Unless otherwise noted, the term "convection" includes natural and/or forced convection. Forced convection refers to induced fluid flow, such as via a fan, blower, pump, and/or wind. Natural convection refers to fluid flow caused by differences between fluid densities as a result of temperature change or difference.

The term "fluid" refers to a gas (e.g., air), a liquid (e.g., water), or a combination of gas and liquid.

As used herein, the term "conductively coupled" refers to elements in thermal communication via conduction due to direct or indirect physical contact.

The terms "heat source" and "high temperature source" are used interchangeably to refer to a source of higher temperature from which heat is transferred, directly or indirectly, to a source of lower temperature via a heat exchanger. Useful examples of high temperature sources include fire, furnace, stove, one or more electronic circuits (e.g., battery or processor), enclosure of one or more electronic circuits (e.g., box containing electronics, a battery case, or a cell phone), a fluid, and a conduit containing a fluid (e.g., a pipe). The term "lower temperature source" refers to a source of lower temperature relative to the high temperature source, such that heat is transferred, directly or indirectly, to the lower temperature source via a heat exchanger. Useful lower temperature sources include a fluid (e.g., air or water) and a conduit containing a fluid.

The term "heat exchanger" or "heat exchanger system" refers to a system used to transfer heat between elements or materials, such as between two solids, between a solid and a fluid, or between two fluids. The heat exchangers disclosed herein include sheets of carbon fibers (e.g., woven graphite fiber sheets) to transfer heat via conduction, convection, and/or radiation. One or more of the carbon fiber sheets of the heat exchangers disclosed herein transfer heat by convection. For example, any of the heat exchangers disclosed herein may include a set of carbon fiber sheets having an end conductively coupled to a surface of a thermoelectric generator to least convectively transfer heat between the thermoelectric generator and a fluid such as air surrounding at least one other end of the set of carbon fiber sheets (e.g., heat is transferred by conduction within or along the carbon fiber sheet and heat is transferred convectively to the adjacent fluid(s)). Any of the heat exchangers disclosed herein may include two or more carbon fiber sheets, four or more carbon fiber sheets, 10 or more carbon fiber sheets, 20 or more carbon fiber sheets, 50 or more carbon fiber sheets, 100 or more carbon fiber sheets. Any of the heat exchangers disclosed herein may include two or more bundles or sets of graphite fiber sheets, each bundle or set being connected at least one end. Any of the heat exchangers disclosed herein may include one or more rows each having one or more bundles or sets of carbon fiber sheets.

The terms "carbon fiber sheet" or "sheet of carbon fiber" refer to a sheet (e.g., rectangular flat piece of material) comprising carbon fibers. Useful carbon fibers include graphite fibers, graphene fibers, carbon nanotube (CNT) fibers, pyrolytic carbon fibers. As used herein, graphite fibers include graphitic fibers, turbostratic fibers, or a combination of these. As used herein, graphite fibers may formed, at least in part, from polyacrylonitrile (PAN), pitch (e.g., coal tar pitch, mesophase pitch, etc), or a combination of these. Carbon fiber sheets may include a combination of two or more types of carbon fibers, such as any of those listed above. The carbon fibers may be configured in the form of a tow (also generally referred to as a bundle or strap), each comprising a plurality of carbon fibers. Each tow of carbon fibers may include polymeric material(s), resin(s) and/or epoxy(ies), for example for the purpose of holding the fibers together and/or providing a protective coating. Useful polymeric materials, resins, and/or epoxies include polyethylene oxide (PEO) and polyvinyl alcohol (PVA). Each tow may also include one or more natural and/or synthetic fibers surrounding the tow to aid in holding the carbon fibers together (e.g., seen in FIG. 4). A carbon fiber sheet may be formed of a weave of carbon fiber tows, for example. A carbon fiber sheet may be formed of a braid of carbon fibers or of a combination of woven and braided carbon fiber tows. Any of the heat exchangers described herein as having woven graphite fibers and woven graphite fiber sheets may likewise include, instead or in addition, other carbon fibers and/or other carbon fiber sheets, such as any of those listed above, including braided or woven and braided carbon fibers. Woven graphite fiber sheets refer to sheets having woven tow, bundle or strap which include graphite fibers. Unless otherwise noted, hereinafter the term "carbon fibers" (e.g., "graphite fibers") may interchangeably refer to the carbon fibers themselves or tows formed of the carbon fibers (e.g., tow of graphite fibers). As used herein, carbon fiber sheets (e.g., woven graphite fiber sheets) at least partially comprise carbon fibers that are thermally anisotropic.

As used herein, the term "thermally anisotropic" refers to an element or material (e.g., carbon fiber, carbon fiber tow, or carbon fiber sheet) that exhibits anisotropic thermal conductivity. Thermally anisotropic materials or elements have non-isotropic thermal conductivity. In other words, thermally anisotropic materials or elements exhibit higher thermal conductivity in one or more directions or axis than in one or more other direction or axis. For example, carbon fiber such as graphite fiber exhibits significantly higher thermal conductivity along the length of the fiber (i.e., in the longitudinal or length-wise direction of the fiber) than in a direction perpendicular to the length of the fiber. Thermally anisotropic carbon fiber sheets refer to sheets including thermally anisotropic carbon fibers. A thermally anisotropic carbon fiber sheet (e.g., woven graphite fiber sheet) exhibits higher thermal conductivity in any direction along the plane of the sheet (in-plane conductivity) than in a direction transverse to the sheet (transverse conductivity; i.e., through the sheet).

A thermally anisotropic carbon fiber sheet may also exhibit in-plane thermal anisotropies: (a) for example, a carbon fiber sheet may be formed such that thermal conductivity in the sheet is highest between a first end and a second end than in any other in-plane direction and between any other two ends; or (b) for example, a carbon fiber sheet may be formed such that thermal conductivity in the sheet is higher in two or more in-plane directions than in any other one or more in-plane directions. For example, a thermally anisotropic carbon fiber sheet may have a majority of the carbon fibers generally oriented in the same direction (i.e., the length of the carbon fibers extending generally in a direction from a first end to a second end of the sheet) such that in-plane thermal conductivity in the sheet is highest between a first end and a second end than between any other two ends.

In some embodiments of the heat exchangers disclosed herein, the ratio of in-plane thermal conductivity (in one or more directions) to transverse thermal conductivity of one or more carbon fiber sheets (e.g., woven graphite fiber sheets) is greater than or equal to 1.10, greater than or equal to 1.20, greater than or equal to 1.50, greater than or equal to 2.00, greater than or equal to 5.00, greater than or equal to 10.0, greater than or equal to 50.0, greater than or equal to 100, or greater than or equal to 1000. In some embodiments of the heat exchangers disclosed herein, the ratio of thermal conductivity in one or more in-plane directions to thermal conductivity in one or more other in-plane directions of one or more carbon fiber sheets (e.g., woven graphite fiber sheets) is greater than or equal to 1.05, greater than or equal to 1.10, greater than or equal to 1.20, greater than or equal to 1.50, greater than or equal to 2.00, greater than or equal to 5.00, greater than or equal to 10.0, greater than or equal to 50.0, greater than or equal to 100, or greater than or equal to 1000. In some embodiments of the heat exchangers disclosed herein, the in-plane thermal conductivity of one or more carbon fiber sheets in one or more directions is greater than or equal to 400 W m$^{-1}$ K$^{-1}$, greater than or equal to 500 W m$^{-1}$ K$^{-1}$, greater than or equal to 600 W m$^{-1}$ K$^{-1}$, greater than or equal to 800 W m$^{-1}$ K$^{-1}$, greater than or equal to 900 W m$^{-1}$ K$^{-1}$, or greater than or equal to 1000 W m$^{-1}$ K$^{-1}$. Any of the heat exchangers disclosed herein may include a combination of carbon fiber sheets characterized by different thermal conductivities and/or thermal anisotropies (e.g., ratio of in-plane to transverse thermal conductivity and/or ratio of two different in-plane thermal conductivities).

The term "bend radius" of a material or element (e.g., carbon fiber tow or carbon fiber sheet) refers to a minimum radius of curvature of the material or element. Generally, a smaller bend radius indicates a greater flexibility. Any of the heat exchangers disclosed herein may include one or more carbon fiber sheets having a bend radius of less than or equal to 1 mm, less than or equal to 1 cm, less than or equal to 1 in., less than or equal to 2 in., less than or equal to 5 in., less than or equal to 10 in., or less than or equal to 12 inches.

The term "vibration resistance" refers to a maximum vibration frequency that can be applied to an element or material (e.g., carbon fiber or carbon fiber sheet) before inducing failure. Any of the heat exchangers disclosed herein may include one or more carbon fiber sheets have a vibration resistance of at least 20 Hz, at least 50 Hz, at least 125 Hz, at least 800 HZ, or at least 2000 Hz.

The term "shock resistance" refers to a maximum shock frequency that can be applied to an element or material (e.g., carbon fiber or carbon fiber sheet) before inducing failure. Any of the heat exchangers disclosed herein may include one or more carbon fiber sheets have a shock resistance of at least 100 Hz, 500 Hz, 1000 Hz, 3500 Hz, or 10,000 Hz.

As used herein, the term "holding region" refers to a region where one or more carbon fiber sheets are connected to one or more elements of a support structure. Optionally, the holding region corresponds to the region where one or more carbon fiber sheets are conductively coupled to a high temperature source or a lower temperature source. Useful support structure elements at a holding region may include one or more epoxies, fiction fitting(s), compression fitting(s), clamp(s), nut(s) and bolt(s), screw(s), bracket(s), and any combination of these. For example, two or more carbon fiber sheets may be connected to each other at an end via epoxy and/or brackets and nuts and bolts. For example, one or more carbon fiber sheets may be connected to a high temperature source (e.g., a side of a thermoelectric generator that is to be cooled, or an enclosure for electronics) via epoxy.

Overview

In the following description, numerous specific details of the devices, device components and methods of the present invention are set forth in order to provide a thorough explanation of the precise nature of the invention. It will be apparent, however, to those of skill in the art that the invention can be practiced without these specific details.

The present invention provides improved heat exchanger systems and associated methods using thermally anisotropic carbon fiber materials, preferably woven graphite fiber sheets, able to transfer heat away from a heat source and then convectively transfer heat to a lower temperature fluid, such as circulating air or cooling liquid.

Figure 8:
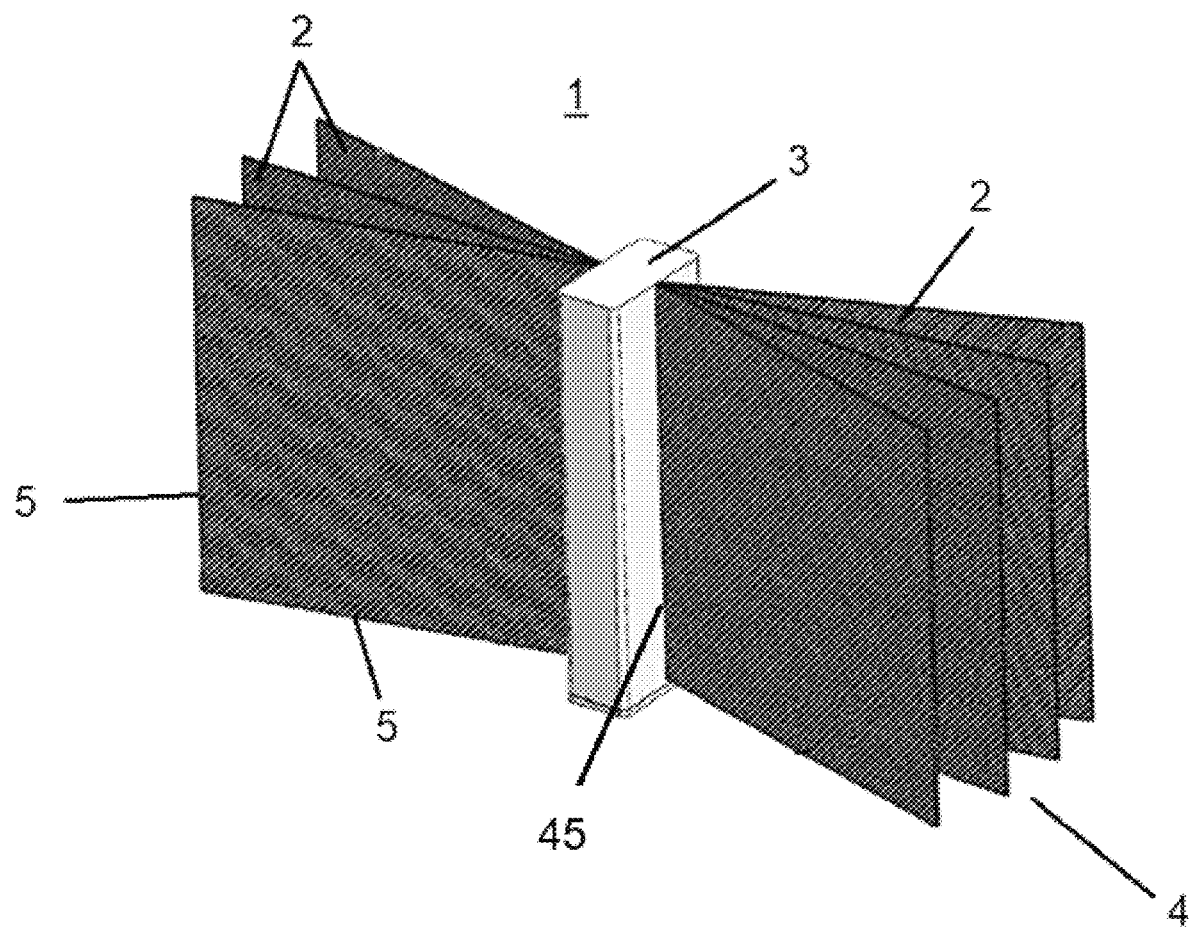
FIG. 8 is an illustration of an exemplary heat exchanger system in an embodiment of the invention. The heat exchanger includes a set of woven graphite fiber sheets facing a heat source (e.g., below or in front of the sheets, as drawn) and a set of woven graphite fiber sheets facing a colder temperature source. The colder temperature source is air that is colder than the heat source (e.g., a fire or an enclosure for electronics). The exemplary heat exchanger is configured with a thermoelectric generator such that graphite fiber sheets provide heat to the higher temperature side of the thermoelectric generator and graphite fiber sheets cool the colder temperature side of the thermoelectric generator.
Figure 9:
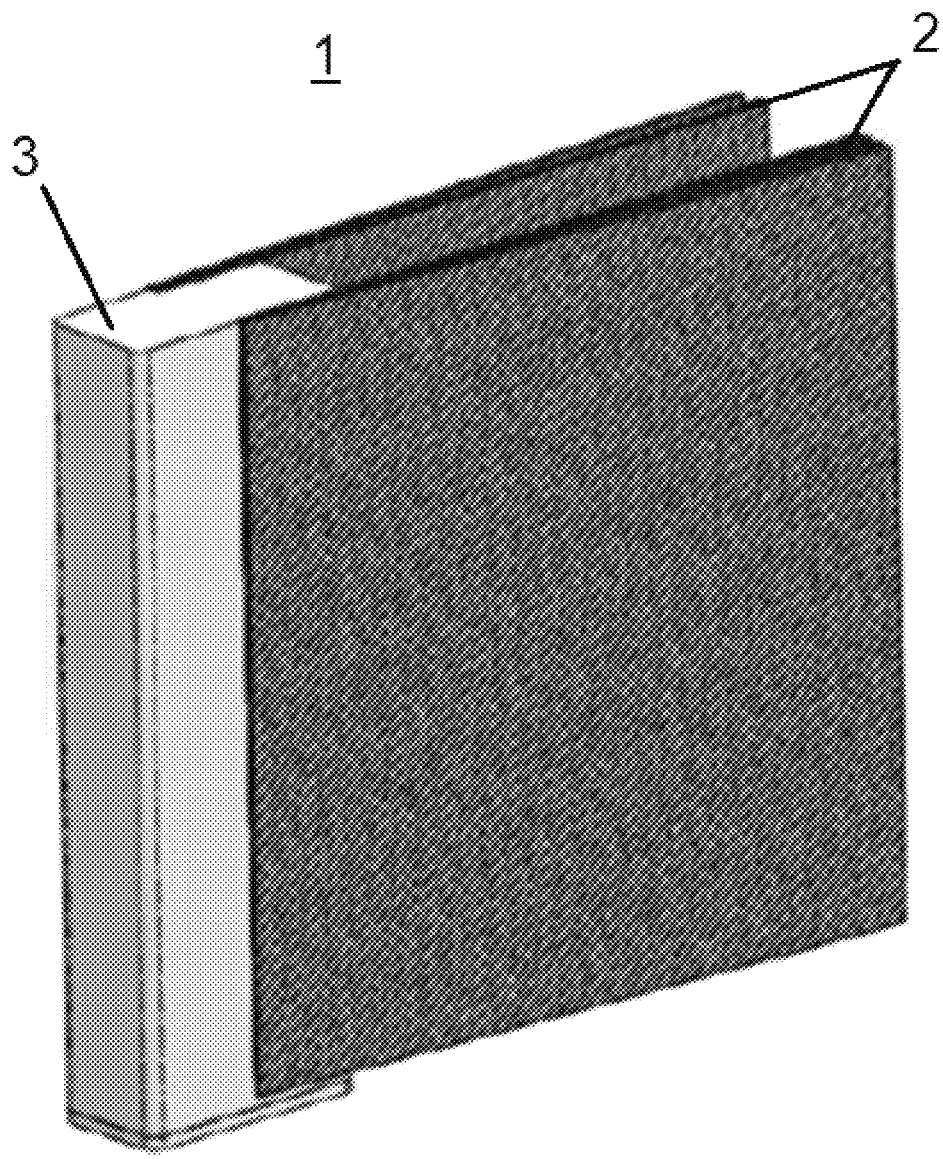
FIG. 9 is an illustration of the exemplary heat exchanger of FIG. 8 in a compact or folded configuration (e.g., for storage).

For example, FIG. 8 illustrates an exemplary heat exchanger system 1 using three (e.g., 6 in. by 6 in.) woven carbon fiber sheets 2 adjacent to a heat source (e.g., a fire or heating elements; not shown) and conductively coupled to a holding region 45 on a first side of a thermoelectric generator 3 (the side to be heated). These three carbon fiber sheets are configured as a single bundle of carbon fiber sheets and have a heated region 5 as a result of the heat source. With respect to these three carbon fiber sheets, the surface of the first side of the thermoelectric generator 3 is a lower temperature source because heat is transferred between from the heat source to this first side of the thermoelectric generator 3 (via the three carbon fiber sheets 2). In this example, these three carbon fiber sheets are in thermal communication with the heat source via convection through the air (as well as radiation) that is between the heat source and the carbon fiber sheets. Heat may transfer convectively from the relatively hot air to the carbon fiber sheets at any portion of each of the carbon fiber sheets. Heat is transferred to the first side of the thermoelectric generator conductively by the carbon fiber sheets.

The exemplary heat exchanger of FIG. 8 also includes four (e.g., 6 in. by 6 in.) carbon fiber sheets 2 also attached to a holding region 45 of the thermoelectric generator 3. These carbon sheets 2 are adjacent to a lower temperature source 4 and are conductively coupled to a second side of the thermoelectric generator 3 (the side to be cooled). With respect to these four carbon fiber sheets 2, the surface of the second side of the thermoelectric generator 3 is a high temperature source because heat is transferred from the second side of the thermoelectric generator 3 to the lower temperature source 4 (e.g., cooler air). Heat is transferred from the second side of the thermoelectric generator 3 to the four carbon fiber sheets via conduction. Heat is transferred from the four carbon fiber sheets to the cooler air via convection.

These, or similar heat exchangers, can be used to transfer heat and therefore cool electronic devices and components, particularly in applications which require low weight, high durability, and flexibility to fit within a confined space. The invention can be further understood by the following additional non-limiting examples.

Example 1—Woven Graphite Fiber Sheets

The present invention provides new and innovative high-conductance carbon fiber heat exchanger systems, and associated methods, that further advance existing heat exchanger and graphite-based technologies. The present technology offers many benefits over conventional copper/aluminum heat exchangers and over conventional heat pipes. These benefits include: a five times better thermal conductance for the same mass for copper heat exchangers (e.g., see FIG. 1), improved resistance to shock and vibration, and a more durable and lighter package than heat pipes for this application (e.g., see Tables 1 and 3 below). In specific embodiments, the heat exchangers comprise very-high thermal conductivity woven graphite fibers.

The graphite fibers and the woven graphite fiber sheets are more conductive than copper or aluminum. FIG. 1 shows a comparison of the thermal conductance of straps formed of graphite fibers (hereinafter referred to as "graphite fiber thermal straps", or "GFTS"), such shown in FIG. 2 (panels B and C), and copper thermal straps relative to the strap's standardized mass per unit length; the data are shown for room temperature performance. The data points in the graph are based upon actual straps for various space and non-space programs. Some of the data scatter relative to the trend lines is due to the customization of end fittings to meet specific interface requirements.

The woven fiber sheets may be shaped for the required interface surface area to heat (e.g., from a fire) and cool (e.g., to air and/or water) a thermoelectric generator (TEG).

Figure 3:
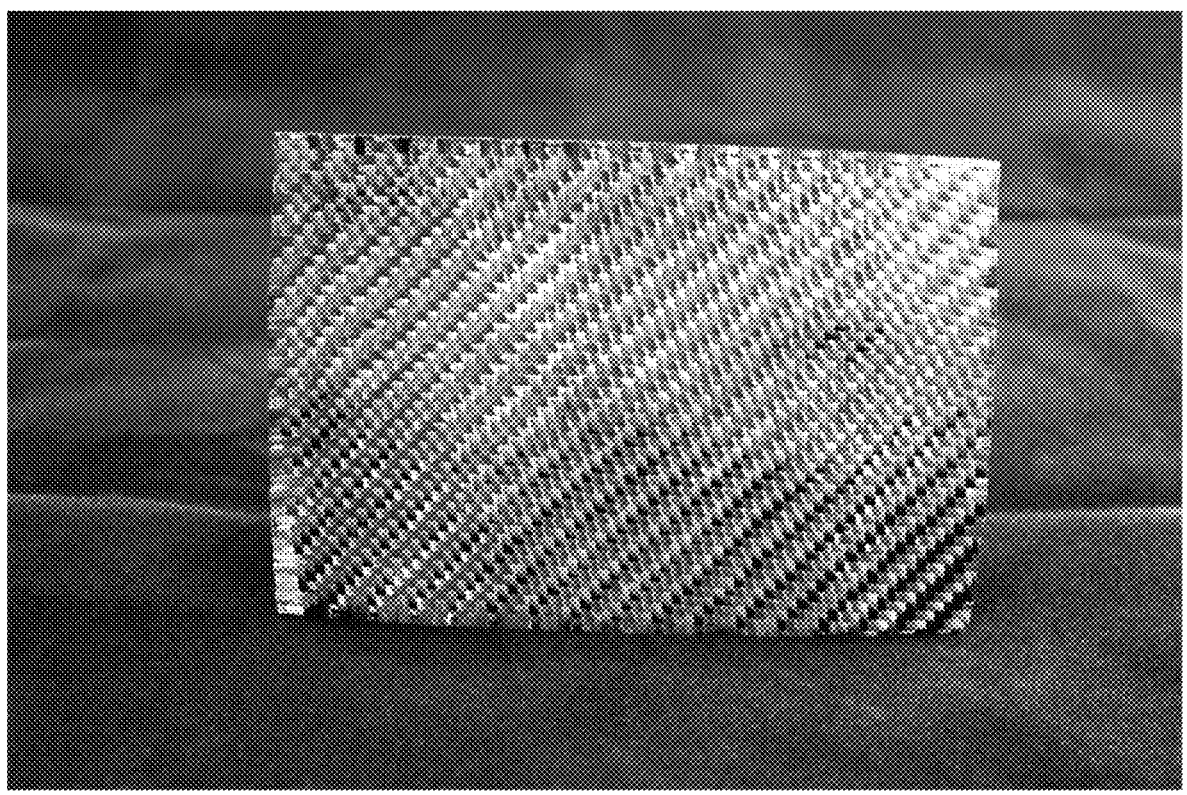
FIG. 3 is a photograph of an exemplary woven graphite fiber sheet of the present invention where the graphite fibers are oriented horizontally an vertically.
Figure 4:
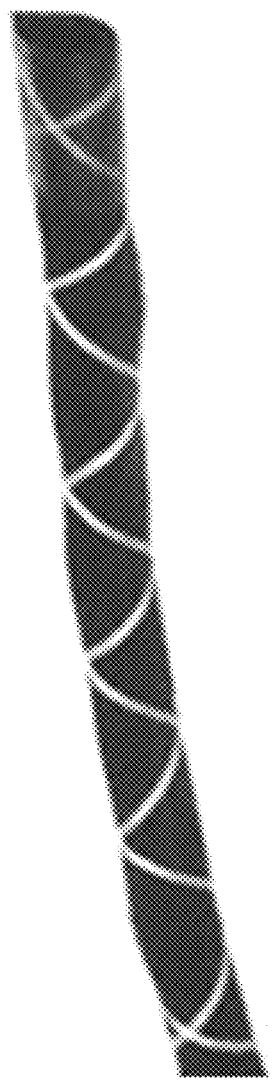
FIG. 4 is a photograph of a tow of graphite fiber made of about 20,000 graphite fibers in an embodiment of the present invention.
Figure 15:
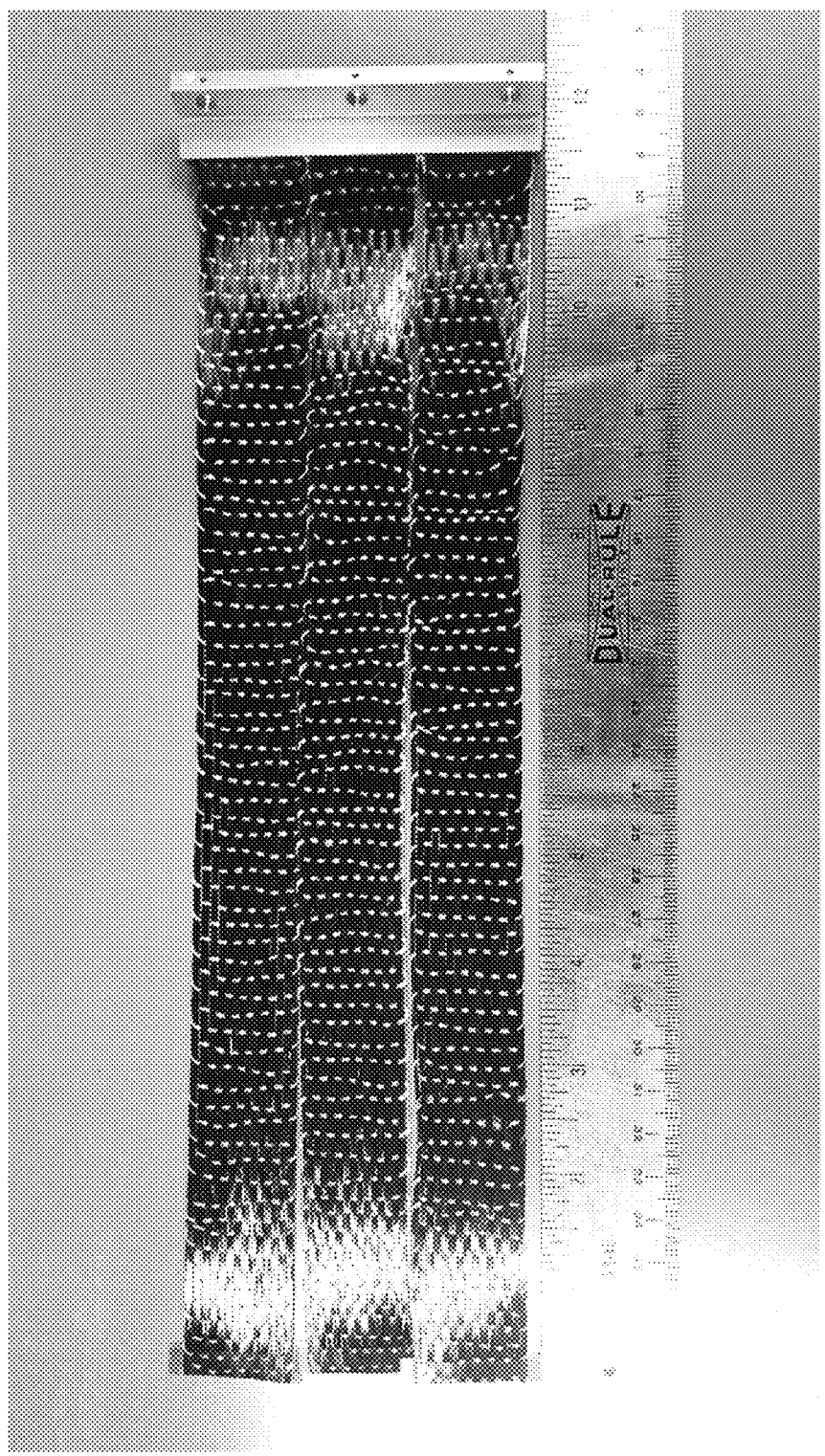
FIG. 15 is a photograph of exemplary woven graphite fiber sheets, each approximately 1 in. wide, 12 in. long, and 0.0124 in. thick.

The graphite fibers, and the woven or braided graphite fiber sheets, disclosed herein are mechanically flexible and have a very-high thermal conductivity. The graphite fibers may be coal tar pitch-based carbon fiber material, optionally bundled together and wrapped with a high-strength thread, such as a fiberglass thread. FIG. 3 is a photograph of an exemplary woven graphite fiber sheet. While the carbon fibers can be woven so as to be oriented in both the X and Y directions, preferably the carbon fibers are orientated in a single direction extending from the first end of the carbon fiber sheet to the second end of the carbon fiber sheet. The carbon fibers can be woven together to form a sheet, bundle, thermal strap, or a tow, such as depicted in FIG. 4 or 15.

Manufactured graphite straps may consist of multiple graphite fiber tows bonded together. These then interface with a heat source at one end and heat sink at the other end. Typically the end of the strap is mated to the equipment. In contrast, the woven or braided graphite fiber exchangers disclosed herein may use a fluid, such as air or water, as the hot and/or colder temperature source(s).

The graphite heat exchangers disclosed herein and the fibers therein may withstand temperature to at least, 400° C., preferably at least 500° C., at least 600° C., at least 800° C., at least 1000° C., or at least 2000° C. Thus, it can be used to obtain heat from a fire which can range from 400° C. to 1000° C., for example, and conduct the heat to the hot side of the TEG, for example.

The graphite fibers, and the woven or braided graphite fiber sheets, disclosed herein are durable. The graphite in rope form has been tested to limits which demonstrates it is capable of handling the rigors of outdoor environments and movement in those environments. The woven fibers are even more durable than the fiber "ropes" based on handling of the woven form. Table 1 shows the shock and vibration levels able to be withstood by the present graphite sheets.

TABLE 1

Shock and Vibration Levels that the graphite sheets can endure.

| | Nominal | | | |
|---|---|---|---|---|
| | | Nominal | | Abort |
| | Frequency (Hz) | Flight MPE (g2/Hz) | Frequency (Hz) | Nominal Flight MPE (g2/Hz) |
| Vibration | 20 | 0.01 | 20 | 0.06 |
| | 50 | 0.6 | 125 | 2 |
| | 125 | 0.6 | 250 | 2 |
| | 800 | 0.006 | 800 | 0.2 |
| | 2000 | 0.0001 | 2000 | 0.004 |
| | Grms | 9.9 | Grms | 26.9 |

| Shock Response Spectrum, Q = 10 | | |
|---|---|---|
| Axis | Frequency (Hz) | Acceleration (G Peak) MPE (Expected) |
| Shock All Axes | 100 | 100 |
| | 500 | 550 |
| | 1000 | 1000 |
| | 3500 | 5000 |
| | 10000 | 5000 |
| Max Velocity (in/sec) | | 87.7 |

Mathematical Calculations Show Feasibility: calculations, such as those below, show that an exemplary heat exchanger having woven graphite fiber sheets and an area of 150 sq. in. (weighing 155 g) may cool a 35 watt TEG with the air temperature at 30° C. Calculations also show that an exemplary heat exchanger having woven graphite fiber sheets and an area of and that a graphite heat exchanger of 60 sq. in. (weighing 62 g) may provide the heat from a fire of 750° C. to heat the hot side of a TEG to 320° C.

Woven graphite fiber sheets for air heat exchangers are analyzed below by using available data on the graphite fibers.

Figure 5:
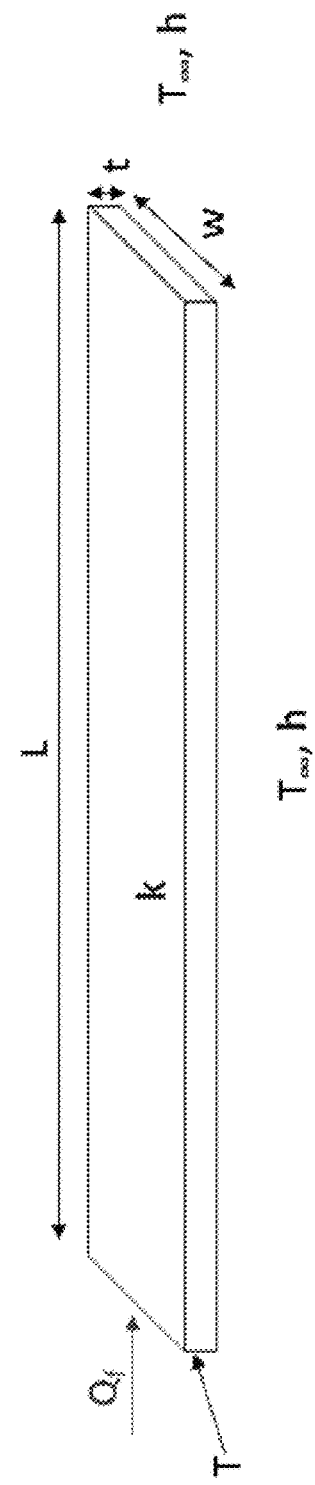
FIG. 5 is an illustration of an exemplary woven graphite fiber sheet showing different variables used in heat exchanger analysis.

By using the graphite fiber material as a woven sheet system, Equations (1) through (3) below can be applied (for air in this exemplary analysis). These exemplary equations make the assumptions that this system is moving heat away from the TEG with convective heat transfer due to the surrounding air, and conductive heat transfer through the graphite. The unidirectional heat transfer through the system is at steady state. FIG. 5 is a visual description of this system.

$$Q_f = M \frac{\sinh(mL) + \left(\frac{h}{mk}\right)\cosh(mL)}{\cosh(mL) + \left(\frac{h}{mk}\right)\sinh(mL)} \quad \text{Equation (1)}$$

$$M = (T - T_\infty)\sqrt{hk(2w + 2t)} \; (wt) \quad \text{Equation (2)}$$

$$m = \sqrt{\frac{h(2w + 2t)}{k \; (wt)}} \quad \text{Equation (3)}$$

Assuming the TEG has about 5% efficiency, the 35 W of electrical power converts to 700 W. Therefore, Qf is set at 700 W. Table 2 below shows the values used for the other variables.

TABLE 2

Set values for the variables used in above equation.

| Variable | Units | Fire to TEG | TEG to air |
|---|---|---|---|
| $Q_f$ | [W] | 700 | 700 |
| k* | [W/m-K] | 500 | 766 |
| h** | [W/m²-K] | 10.45 | 10.45 |
| t | [in] | 0.085 | 0.085 |
| T | [C.] | 350 | 100 |
| T∞ | [C.] | 900 | 30 |

*These values for the thermal conductivity of the graphite fibers (k) are based on Technology Application's data and are dependent on average temperature of the system. The constants used in the equations are from NIST data and confirmed by hundreds of tests performed on graphite straps built for NASA, DOD, ESA and JAXA.

Figure 6:
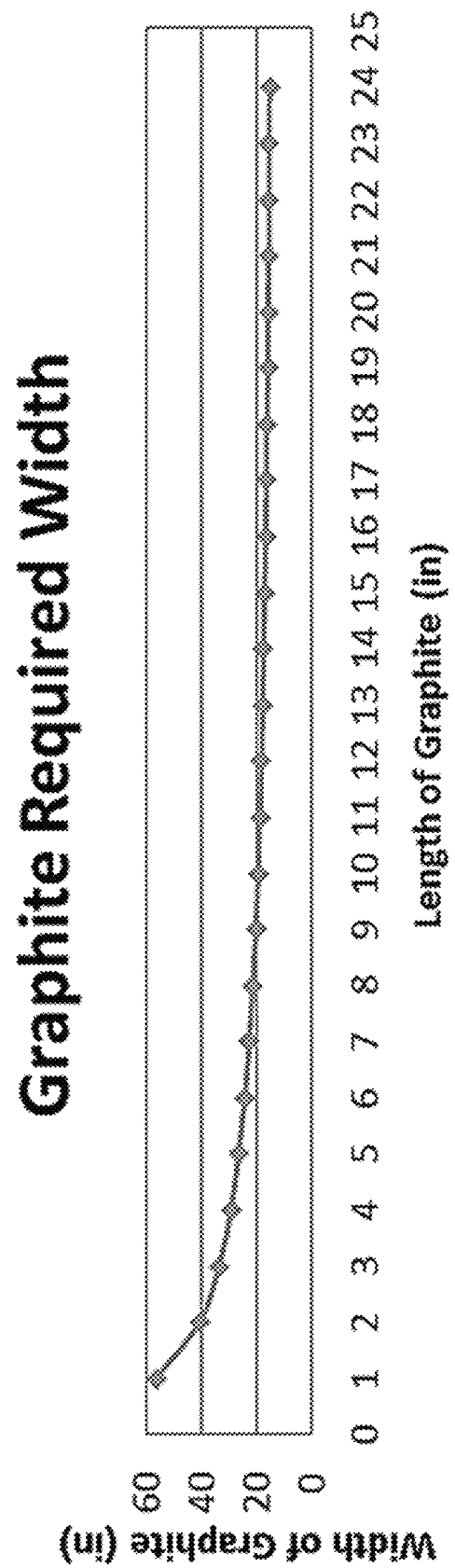
FIG. 6 is a chart showing required width of the graphite fiber sheets versus graphite fiber sheet length for a constant mass of graphite fiber sheet, corresponding to exemplary calculations in Example 1.
Figure 7:
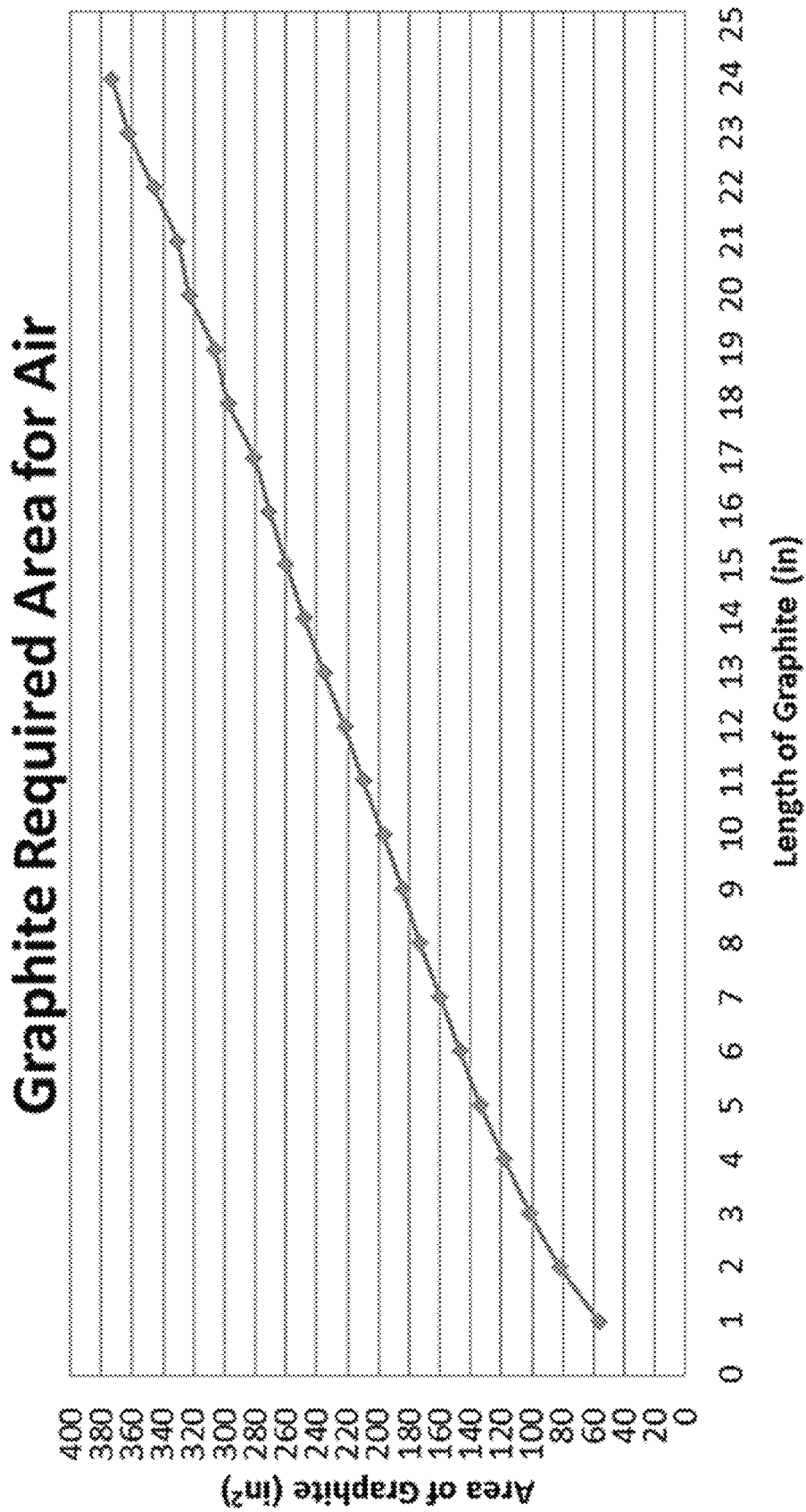
FIG. 7 is a chart showing graphite fiber sheet area versus graphite fiber sheet length for a constant graphite fiber sheet, corresponding to exemplary calculations in Example 1.

By choosing a range of lengths (L) Equation (1) can be solved for the width (w). FIGS. 6 and 7 show the relationship between the length of the graphite sheet to the width and area of the graphite sheet required respectively. Due to the increase in length of the fibers, the heat transfer due to conduction greatly decreases while the heat loss due to convection increases. This is a steady increase in surface area of the graphite sheet as the length is increased.

The thermal constants and the equations used for the woven graphite fiber sheets are the same as the fibers currently used for satellites. Weaving of the graphite fibers results in sheets having thermal conductivity of 900 W/m-K, for example. This high conductivity allows the size of the woven graphite fiber sheets to be 150 int in area. For example, a system composed of 4 sheets of woven fibers at 6.2"×6.2" each gives a total surface area of about 150 sq. in. See FIG. 8 for an illustration of an exemplary heat exchanger system with woven graphite fiber sheets.

Figure 10:
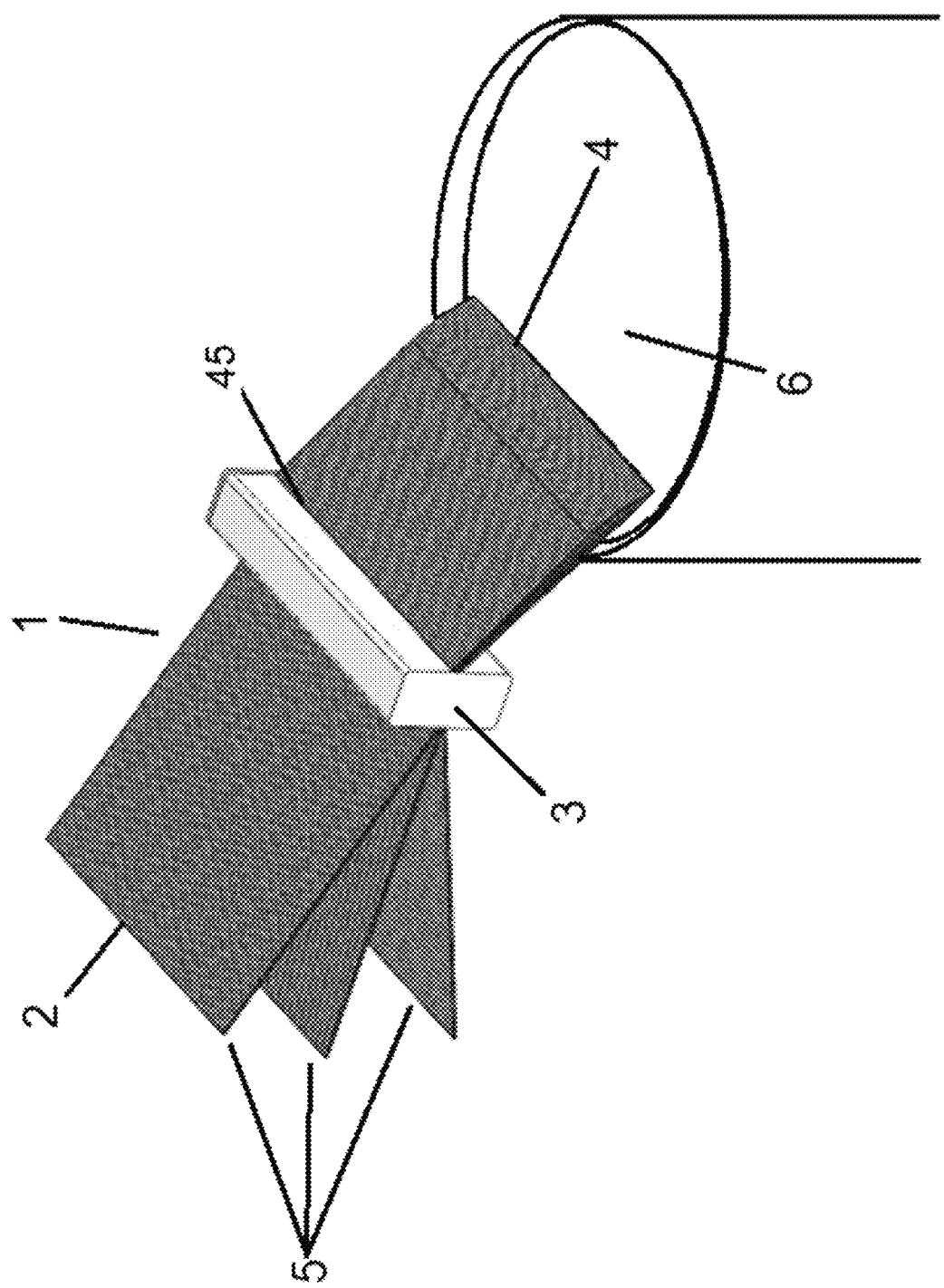
FIG. 10 is an illustration of the exemplary heat exchanger of FIG. 8 with the graphite fiber sheets that are on the colder temperature side of the thermoelectric generator partially immersed in water or other liquid coolant.

An exemplary configuration of a heat exchanger 1 having woven or braided graphite fiber sheets 2 is one that can be thermally anchored in a fluid 6 such as water as the heat sink (e.g., FIG. 10) or thermally interfaced with air. This flat sheet design may also transfer heat from the fire to the hot side of a TEG (e.g., FIG. 10). The cold side sheets may be left in the air or may be lowered into water, for example. For example, multiple graphite fiber sheets 2 attached to the holding region 45 of a thermoelectric generator 3 have regions 5 heated by a heated source. Additional graphite fiber sheets 2 extend from the other side of the 3 thermoelectric generator 3 and are connected with a cooling fluid 6, such as water. The graphite is inert in contact with water so minimal to no damage occurs. Since water is a better convective heat sink then air, the heat exchanger sizes described above for convective heat transfer in air would work for convective heat transfer in water as well.

Figure 11:
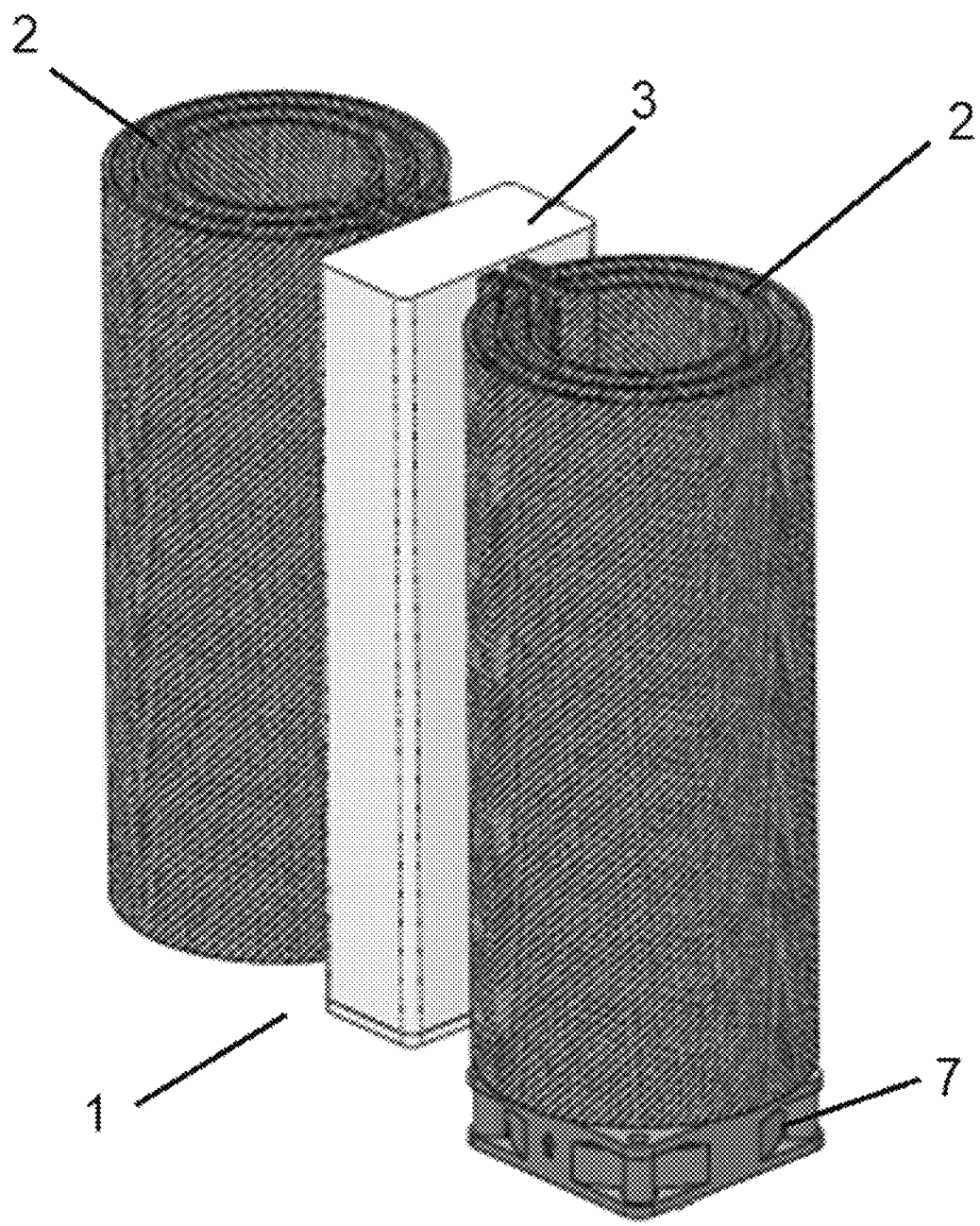
FIG. 11 is an illustration of an exemplary heat exchanger system having woven graphite fiber sheets configured in a circular geometry and configured with a thermoelectric generator. The heat exchanger may be used with a fan to provide forced convection across or over the woven graphite fiber sheets. In an example, the heat source may be provided below the graphite oven sheets on the higher temperature side of the thermoelectric generator.
Figure 12:
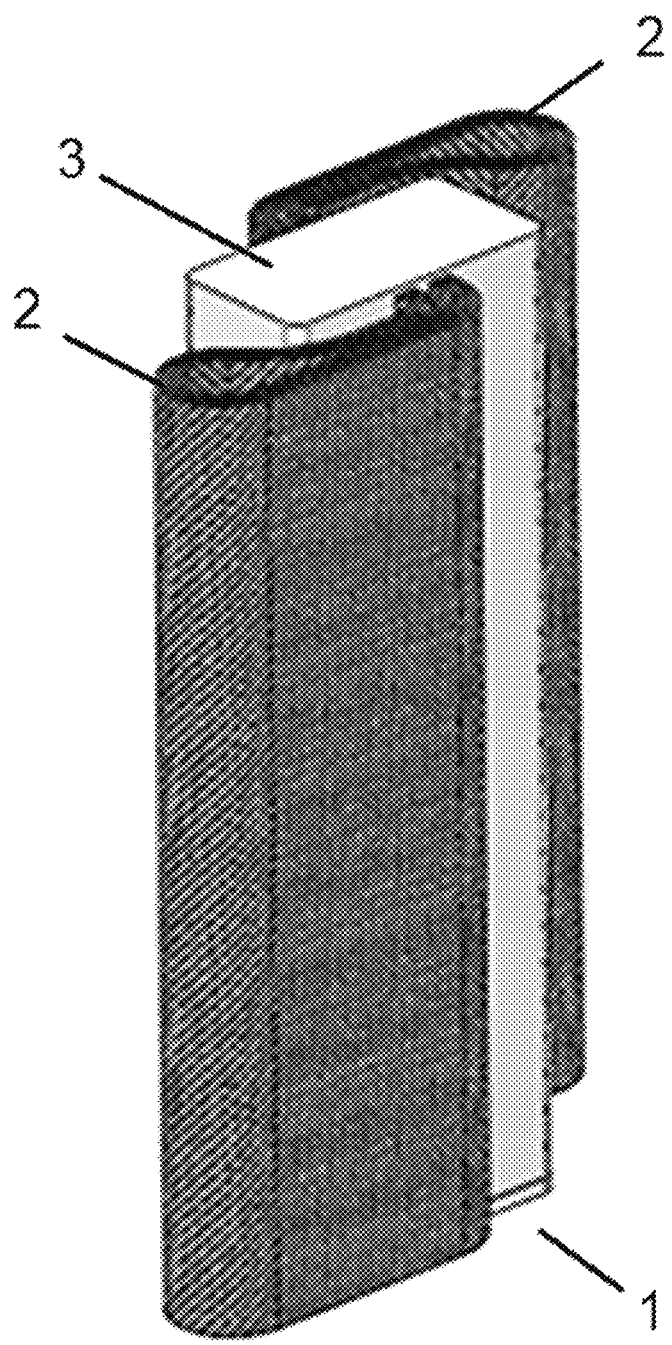
FIG. 12 is an illustration of the exemplary heat exchanger of FIG. 11 with the woven graphite fiber sheets configured in a compact or folded geometry (e.g., for storage).

An exemplary configuration of a heat exchanger having woven or braided graphite fiber sheets is one with a circular wrap configuration, such as shown in FIG. 11. This embodiment is similar to that of FIG. 8, but further includes a fan 7 to drive air through the cylinder formed by the carbon fiber sheets 2.

The above analysis demonstrates that the heat exchangers disclosed herein may operate without force convection (e.g., without a fan). The heat exchangers disclosed herein may be used with forced convection, such as via a fan, as well. With forced convection, the size and/or amount of graphite fiber or graphite fiber sheets may decrease.

FIGS. 8-12 are sketches of exemplary heat exchangers having woven and/or braided graphite fiber sheets configured for use with a thermoelectric generator (the heat source is not shown). The graphite fibers sheets may be folded during storage and unfolded during use to conserve space (see FIG. 9 and FIG. 12).

Comparison Shows Graphite is Better than Heat Pipes:

The following table presents TAIs initial assessment comparing two competing technologies.

TABLE 3

Comparison of Graphite and Heat Pipes showing the relative advantages of Graphite

| Graphite vs. Heat Pipes | |
|---|---|
| Weight | Less than Heat Pipes. The graphite fiber sheets for 35 electrical watts would be about 217 grams + 80 grams for 2 aluminum end fittings + two 20 watt TEGs weighing 48 grams each. Assuming 35 watts output, the power density is 89 watts/kg |
| Durability | Greater than Heat Pipes. The graphite does not lose fluid. Can be bent multiple times in all axes. |
| Size and Transportability | Smaller than heat pipes in storage. With a proper design, the sheets can be transported flat like sheets of paper. |
| Field Risks (exposure to outdoors) | Less subject to damage from rough treatment. Graphite fins can be bent, dropped and stepped on without breaking. |

The disclosed heat exchangers, having woven and/or braided graphite fiber sheets provide a dependable system for generating 35 watts of electrical power given the appropriate environment (e.g., outdoor camping), for example. The disclosed graphite fiber heat exchangers may provide a dependable system for generating 100 watts of electrical power given the appropriate environment.

The disclosed graphite fiber heat exchangers may thermally transport at least 700 W through conduction and convection. The disclosed graphite heat exchangers may have a power-to-mass ratio of 50 W per kg to 100 W per kg. The disclosed graphite fiber heat exchangers may have a power-to-mass ratio of 60 W per kg. The disclosed graphite fiber heat exchangers coupled with one or more thermoelectric generators may generate up to 100 W of electrical power. The disclosed graphite fiber heat exchangers coupled with one or more thermoelectric generators may generate 100 W to 200 W of electrical power. The disclosed graphite fiber heat exchangers coupled with one or more thermoelectric generators may generate greater than 200 W of electrical power.

Figure 13:
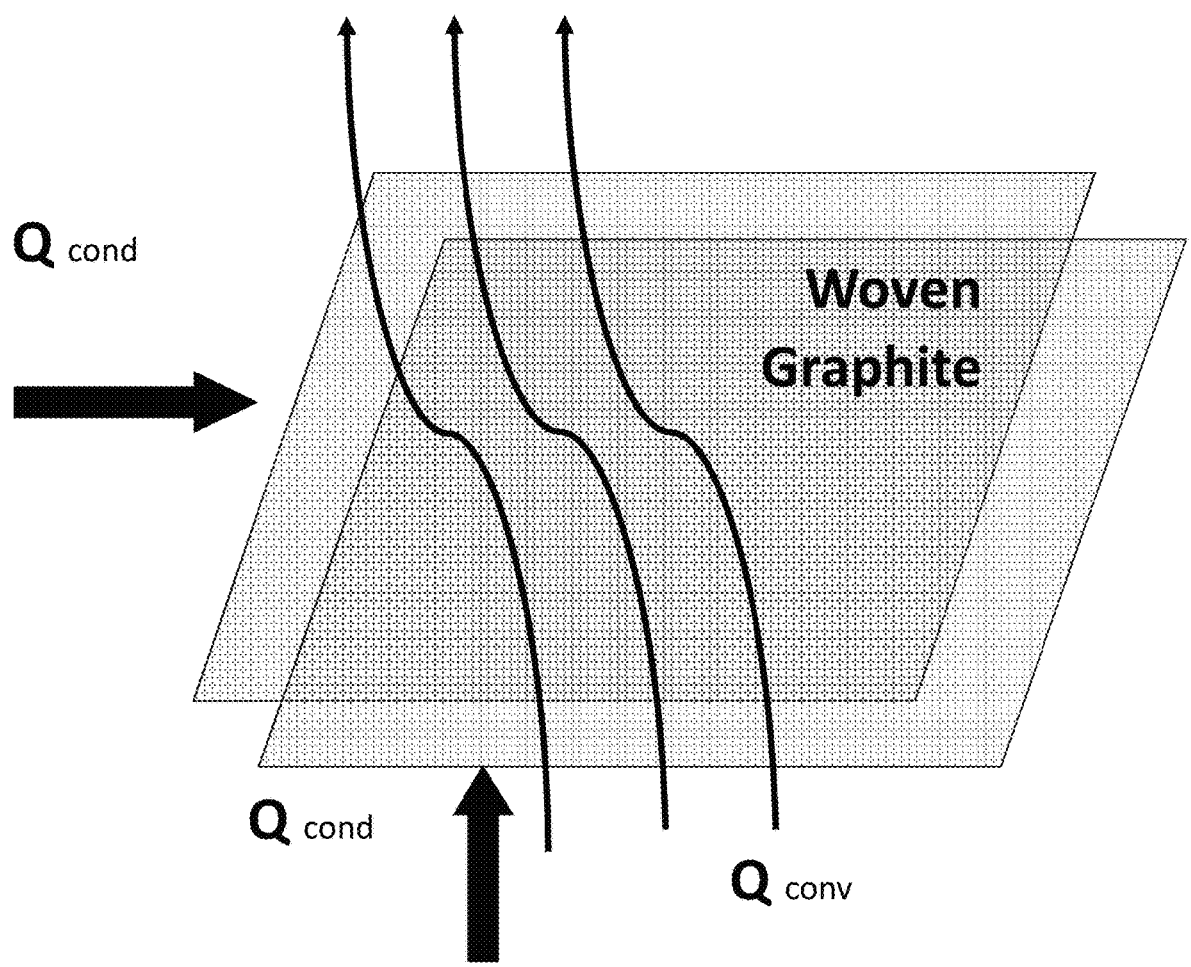
FIG. 13 is a schematic showing exemplary conductive and convective heat transfer pathways at woven graphite fiber sheets.

End Fitting Configuration:

The end fitting is useful to capture and retain the high-conductance graphite material. Since the woven and/or braided graphite fiber sheet is substantially flat, there may be more heat transfer transverse to the heat transfer path than through the end points of the fibers. A capture technique for the length of the fiber sheet is needed to retain the material. This will be beneficial in applications where additional heat rejection is needed. With the woven graphite, the anisotropic feature of graphite is used to create a large enough heat exchanger surface area to use air as the sink, allowing for not only conduction along the fibers (in both the vertical and horizontal directions) but also convection across the fibers. FIG. 13 illustrates this effect.

Adhesive Selection:

the heat exchanger construction may utilize a silver-filled thermally conductive epoxy that provides attachment of fiber bundles into metal end fittings. Low-outgassing adhesives may be used capture one or more ends of one or more graphite fiber sheets.

Example 2—Comparison with Conventional Heat Exchange Technologies

There are a number of thermal management technologies that are potentially applicable to electronic systems where space, weight, flexibility and durability are important considerations. The list below summarizes both new and existing technologies. These technologies are applicable to many other electronic systems of the military and of the commercial market place, including but not limited to Multifunctional Information Distribution System (MIDS). Any system improvement to the thermal transfer capabilities of MIDS would also be applicable to many other systems. The heat exchangers disclosed herein may increase the heat transfer capability by 30% or more compared to conventional heat exchangers. Table 4 below shows a preliminary analysis of different new and existing technologies. Some technologies may also be combined. A detailed explanation of exemplary embodiments of the heat exchangers disclosed herein after Table 4.

The innovation is a new high-conductance graphite heat exchanger configuration. The graphite fiber sheets disclosed herein are capable of quickly being retrofit to a variety of electronics packages of different sizes and shapes. The heat exchangers disclosed herein offer many benefits over conventional copper/aluminum heat exchangers and over conventional heat pipes. These benefits include a five times better thermal conductance for the same mass for copper heat exchangers (e.g., see FIG. 1) and a more durable and lighter package than heat pipes for an identical application. The heat exchanger may be constructed from very-high thermally conductive woven graphite fibers (e.g., Woven Graphite Heat Exchanger, trademarked GHex™) and/or highly thermal conductive Pyrolytic Graphite Links (trademarked PGL™). The woven fiber may be shaped appropriately for any applications, such as to cool the MIDS box or a component within the MIDS, such as a Shop Replaceable Unit (SRU) by air flow.

Figure 22:
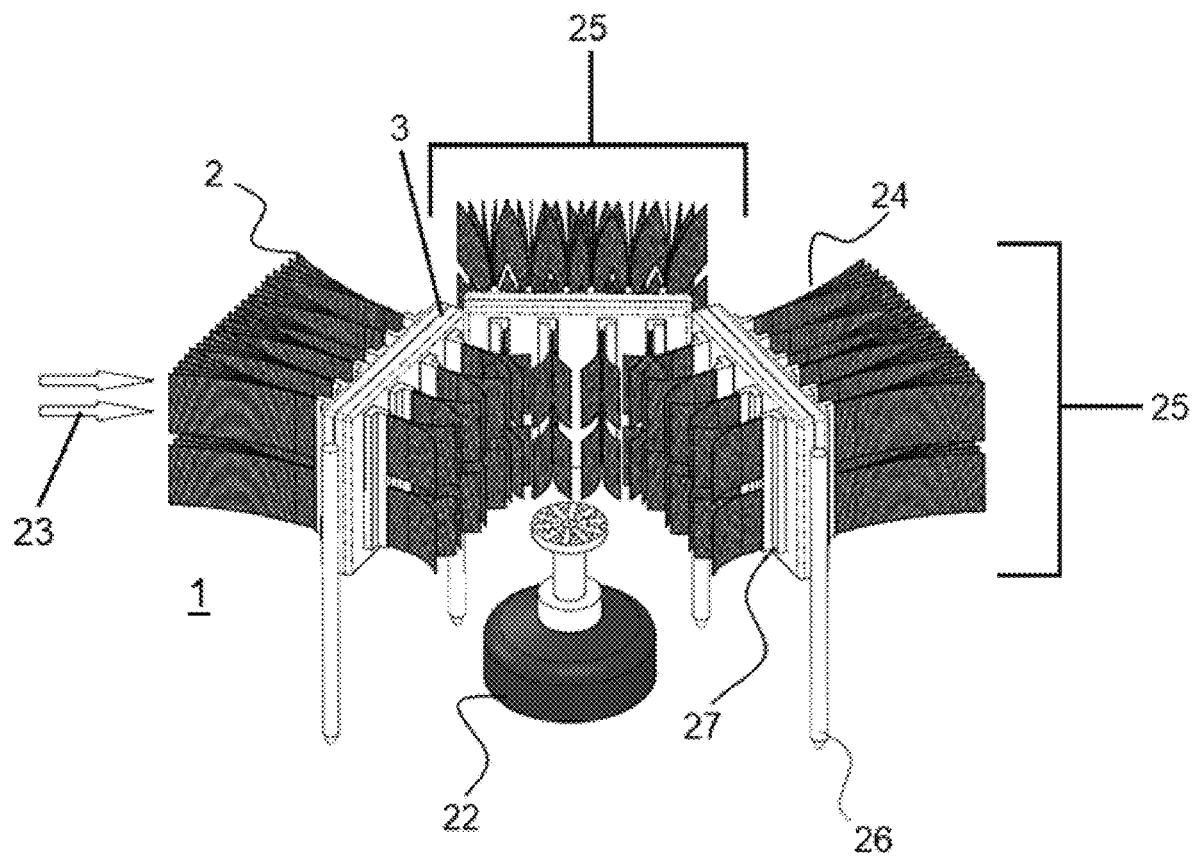
FIG. 22 is an illustration of an exemplary heat exchanger system having woven graphite fiber sheets and configured with support structures, thermoelectric generators, and a heat source (e.g., camp stove). The heat exchanger system includes three modules arranged around the heat source. Each module of the heat exchanger system includes a support structure, a thermoelectric generator, graphite fiber sheets facing the heat source, and graphite fiber sheets exposed to colder air.

An exemplary heat exchanger system 1 used with a thermoelectric generator 3 is also illustrated in FIG. 22. The exemplary heat exchanger system 1 of FIG. 22 is a 105 W system, having three 35 W modules 25 heated by a single field camp stove (heat source) 22. Each module 25 contains multiple bundles 24 of carbon fiber sheets 2 attached to a thermoelectric generator 3 through a holding region 27. Each module 25 is supported by a pylon support structure 26. The carbon fiber sheets 2 on the cooling side are cooled

TABLE 4

Summary of preliminary technologies (lower number is best, generally):

| Best Value Rank | Technology Combination Summary | Sum of Estimates | Component Tech Ready Level | Power | Innovation Level | weight | Fits Current Space | Vol. Prod Cost | Thermal Efficiency Increase |
|---|---|---|---|---|---|---|---|---|---|
| | (HEX is the external air based heat exchanger) | | | | | | | | (30% Goal) |
| 1 | Woven Graphite HEX and Pyrolytic Graphite Links | 9 | 3 | 1 | 1 | 0 | 1 | 1 | 2 |
| 1 | Woven Graphite HEX and Internal Woven Graphite | 9 | 3 | 1 | 1 | 0 | 1 | 1 | 2 |
| 2 | Woven Graphite and Pyrolytic Graphite Heat Spreader | 10 | 2 | 1 | 1 | 1 | 1 | 2 | 2 |
| 2 | Woven Graphite HEX and Flexible Graphite and Pyrolytic Graphite Heat Spreader | 10 | 3 | 1 | 1 | 1 | 1 | 1 | 2 |
| 3 | Woven Graphite HEX and internal Heat Pipe | 11 | 2 | 1 | 2 | 2 | 1 | 2 | 1 |
| 3 | Woven Graphite HEX and ThermoElectric Cooler | 11 | 2 | 3 | 1 | 1 | 1 | 2 | 1 |
| 4 | Woven Graphite HEX and Vapor Chamber interface | 12 | 2 | 1 | 2 | 2 | 1 | 2 | 2 |
| 5 | Current brazed HEX and internal heat pipes | 13 | 1 | 1 | 3 | 3 | 1 | 2 | 2 |
| 6 | External micro-channel liquid Cooler | 15 | 2 | 3 | 2 | 2 | 1 | 3 | 2 |
| 6 | Internal Phase Change System | 15 | 2 | 1 | 2 | 2 | 3 | 3 | 2 |
| 7 | Improved Fan Technologies | 16 | 3 | 2 | 3 | 2 | 1 | 2 | 3 |
| 8 | External Cooling Metal Tray | 17 | 2 | 3 | 2 | 3 | 3 | 3 | 1 |

1-completely developed and tested
3-needs development and testing
1-no power
3-needs substantial power
1-most
3-none 1-Least
3-Most
1-Fits Current Volume
3-exceeds current volume
1-No Weight Increase
3-Heaviest
(0 is lighter that current system)

1-Most
3-Meets goal by surrounding air flow 23. In one design (see, for example, FIG. 28), a single module 25 delivers more than 35 watts and weighs approximately 2.6 lbs; however, optimization can increase power density to 60 W/kg and decrease the module mass to 1.95 lbs. The exemplary heat exchanger system in FIG. 22 includes 60 graphite fiber sheets (or, "fins") per cool side row and 12 fins per hot side row. Each module is 5.3 inches square. The exemplary design for a single module of the 105 watt design (shown in FIG. 28) is a "square" array (2 TEGs×2 TEGs). If more than 105 watts is desired, the number of modules can be increased to produce as much as the size of the heat source can accommodate. The rods dropping down below the TEG package would function as interlocking pins to hold one module to the next module. The rods would also function as legs to raise the TEG/heat exchanger system module to the correct level above the stove flame.

The individual graphite fibers that make up the graphite woven cloth (GWC) are made of coal tar pitch based carbon with a diameter of 11 micrometers. Each spool procured from the supplier contains approximately 2,000 fibers per spool that can be 600 meter long or more. The 1.06 inch (2.69 cm) GWC used in testing (see FIG. 15) used 14 spools of fiber to fabricate. The thread used to hold the graphite fiber is ECG 150 1/0 Glass fiberglass. One of the main reasons ECG 150 1/0 Glass was chosen is because it has a high melting temperature of 846° C. Intended operating conditions include temperatures at least up to 800° C., so this yarn fits in with the desired application. The weight of a 10 cm long×2.69 cm wide section of the graphite woven cloth is 0.525 grams. Thus, the weight per square centimeter is 0.0195 g/cm².

Figure 14:
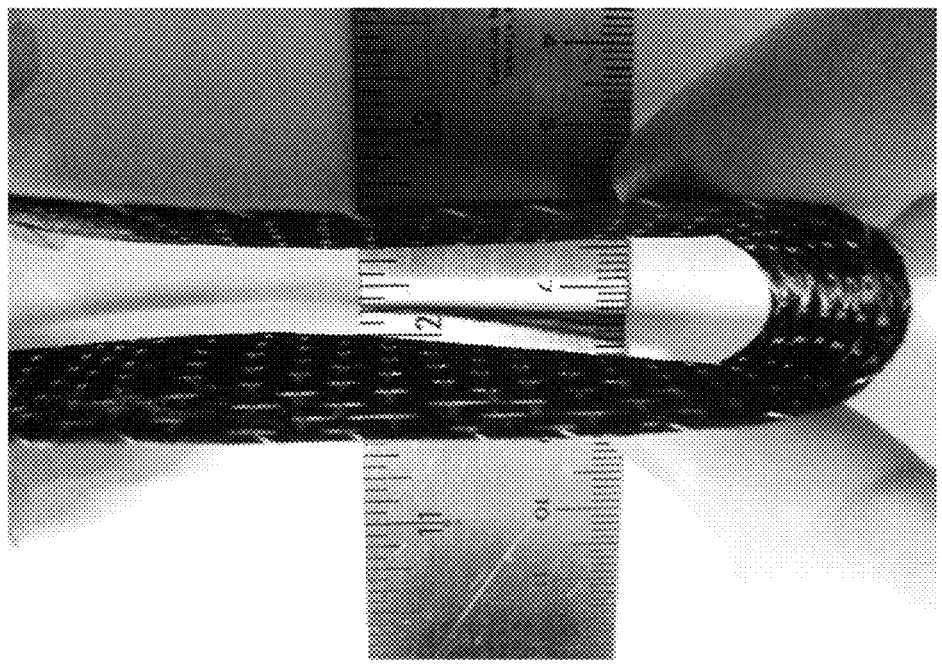
FIG. 14 is a picture (top) of the approximate allowable bend radius of an exemplary woven graphite cloth, and a picture (bottom) demonstrating the stiffness of the woven graphite cloth (black) as compared to an equally sized strip of 2 pieces of paper (white) taped together.
Figure 14:
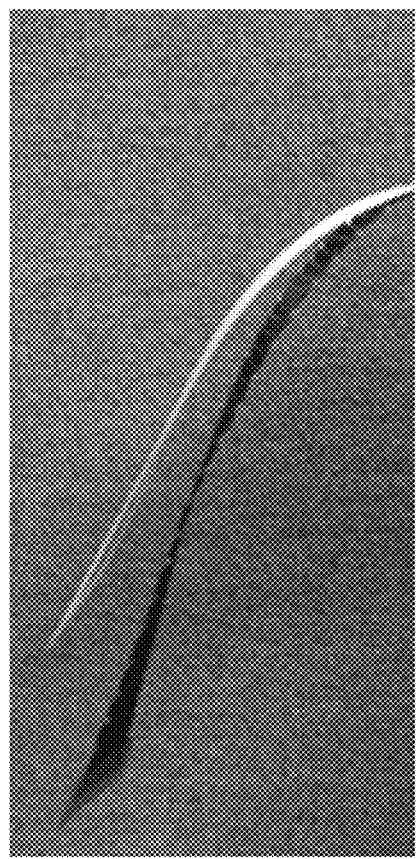

The bending diameter is approximately 1.27 cm (½ inch) before breakage begins to occur (see FIG. 14 (top)). The graphite is bent using two fingers and held over a ruler for the approximate bending diameter. The measurement gives a sense of the amount of bend before the material.

In FIG. 14 (bottom), the stiffness of the woven graphite cloth is compared to two pieces of regular paper cut into a 1 inch by 20 cm test sample. The test paper is held out horizontally, alongside a 2.69 cm (1.06 inch) by 20 cm strip of the graphite woven cloth. The paper weighed 0.95 grams and the graphite cloth weighed 1.2 grams. In short, it is approximately as flexible as two pieces of paper. This test is not very precise; however, it gives a sense of the amount of force it takes to bend the graphite.

In a test of another exemplary heat exchanger system, a heater block provided 9.3 watts. The results of this experiment are summarized in Table 5. These results show quite clearly the performance of this small-scale sample of woven graphite sheet. The temperature of the heater block drops significantly when the woven graphite sheet is applied, and drops even further when other modes of heat transfer, due to convection, are introduced. This provides the amount of heat transfer using this graphite woven material as a heat exchanger.

TABLE 5

Summarization of thermal test experiments on woven graphite fiber heat exchanger (e.g., GHex ™)

| Test Run | Test Description | Fans Used | Heater Block Temperature (° C.) | Ambient Air Temperature (° C.) |
|---|---|---|---|---|
| 1 | Baseline (no heat exchanger) | No | 90.6 | 21.0 |
| 2 | Woven graphite fiber heat exchanger without fan | No | 66.7 | 21.6 |
| 3 | Woven graphite fiber heat exchanger with fan | Yes | 46.9 | 22.9 |

Figure 2:
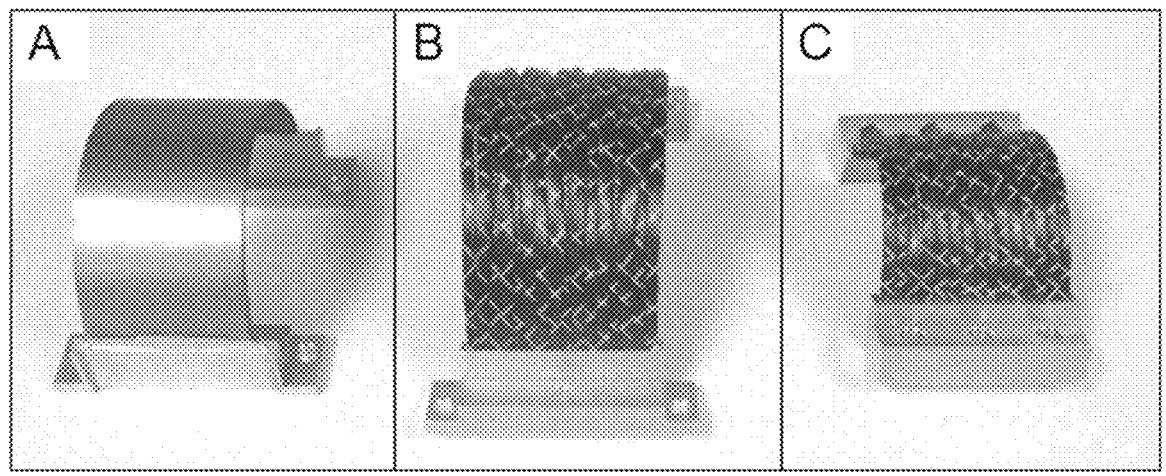
FIG. 2, panel A, is a photograph of a thermal strap constructed from solid pyrolytic graphite. Panels B and C, are photographs of exemplary thermal straps using woven graphite fiber sheets in an embodiment of the present invention.

Pyrolytic Graphite is much more conductive than Copper or Aluminum. FIG. 1 shows a comparison of the thermal conductance of Technology Applications Inc.'s Pyrolytic Graphite Link (PGL™) and copper thermal straps (CuTS®) relative to the strap's standardized mass per unit length; the data are shown for room temperature performance. The data points in the graph are based upon actual straps for various space and non-space programs. Some of the data scatter relative to the trend lines is due to the customization of end fittings to meet specific interface requirements. See FIGS. 2 and 15 for visual comparisons of exemplary PGL™, GraFlex™, and GHex™ straps (FIG. 2, panel A, corresponds to PGL; FIG. 2, panels B and C, correspond to GraFlex™, or graphite fiber straps for point-to-point conductive heat transfer; FIG. 15 corresponds to GHex™, or woven graphite fiber sheets for heat exchanger involving convective heat transfer).

The heat exchangers and the graphite fiber sheets disclosed herein are very durable—the materials have been tested to extreme limits which demonstrate its capability of handling the rigors of satellite launches by Boeing, Ball Aerospace and Lockheed Martin.

Thermal conductivity at room temperature is 800 W/m-K for exemplary graphite fiber sheets and 1950 W/m-K for PGL™, for example. Actual data on these materials have been tested at room temperature. Present data is calculated with constants collected from NIST data, and then adjusted to a better fit by hundreds of tests performed on graphite straps built for NASA, DOD, ESA and JAXA.

Comparison shows that thermal conductivities of PGL™ and woven graphite fibers sheets disclosed herein are better than Aluminum. Table 6 presents initial assessment comparing two competing technologies.

TABLE 6

Comparison of PGL ™, exemplary woven graphite fiber sheets, and aluminum showing the relative advantages.

| | Graphite vs. Aluminum |
|---|---|
| Weight | Graphite is ¼ the weight for the same conductivity. |
| Durability | Woven graphite fiber sheets may be coated for space application, for fodder protection, and protection of fibers from damage. This creates a very tough material. |
| Flexibility | Woven graphite fiber sheets are very flexible. Aluminum is not very flexible. |
| Vibration/ Shock Isolation | Woven graphite fiber sheets have passed extreme shock and vibration tests similar to aluminum. |
| Size | Woven graphite fiber sheets may have varying sizes and configurations |
| Application Risks | Handling and installation processes will have to developed to prevent damage in some configurations |

New Technologies:

Woven graphite fiber sheets (e.g., GHex™): Mechanical—Exemplary woven graphite fiber sheets are produced using coal based graphite fibers woven together in flat sheets with fiberglass yarn as the cross thread. Currently the sheets are one inch wide in rolls up to 100 yards. The thickness is 0.01 inches, and the flat sheets are be stacked on top of each other to increase the thermal conduction capacity. The mass density is 2.2 gr/cc. Operating temperature may be −200° C. to 800° C., for example, or −200° C. to 1000° C., or −200° C. to greater than 1000° C.

Thermal—the heat exchangers disclosed herein are an excellent convective thermal conductors in fluid (e.g., air) based systems. The graphite fiber sheets disclosed herein are flexible. The graphite fiber sheets disclosed herein may be configured to be stiff. For example, the graphite fiber sheets may be configured to be stiff using epoxies or other coatings to stiffen the flexible form. The thermal conductivity is 500 to 1000 W/mK, such as 800 W/mK. Thermal conductivity in the graphite fibers is anisotropic.

Figure 16A:
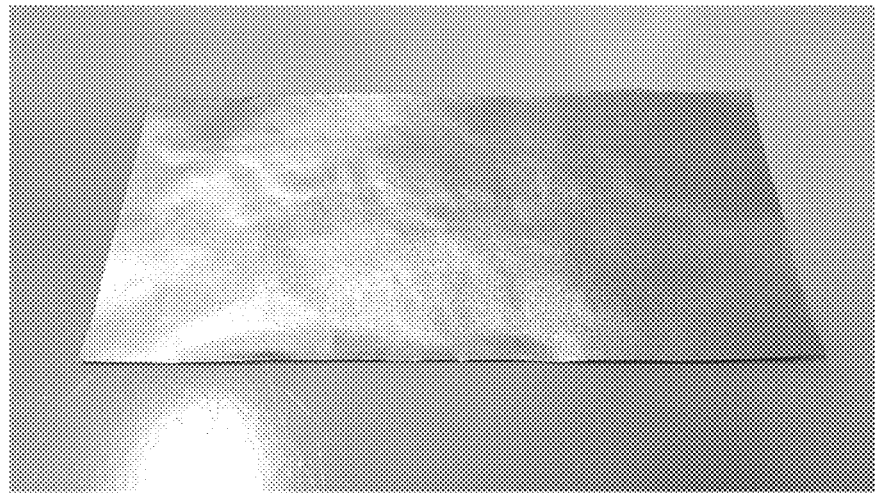
FIG. 16A is a photograph of a pyrolytic graphite sheet.

Pyrolytic Graphite Link (PGL™): Mechanical:

The raw pyrolytic graphite is processed into the forms and the environmental protections needed for a particular application. This form of graphite is produced by heating a hydrocarbon close to decomposition and allowing the graphite to crystalize. It is stable to 2200° C. and has a mass density of 2.13 g/cc. The thickness may be 0.004 inch with thicker sheets available. PGL™ sheets may be with and without adhesive backing and with and without an electrical insulation layer. FIG. 16A is a photograph of a sheet of PGL™ Thermal—The thermal conductivity may be 1950 W/mK. Thermal conductivity may be anisotropic.

Figure 16B:
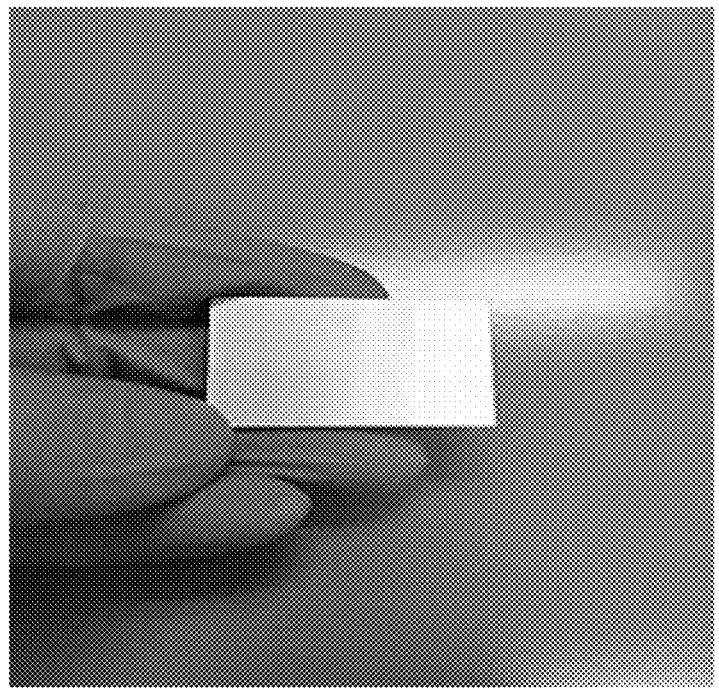
FIG. 16B is a photograph of a copper-covered pyrolytic graphite heat spreader.

Copper Covered Pyrolytic Graphite Heat Spreader (e.g., FIG. 16B):

Mechanical—Copper covered heat spreaders (pyrolytic graphic core encapsulated within a structural shell) are of various sizes and thickness. They may be manufactured from 0.01 inch to 0.6 inches thick with a coating thickness of 0.004 inches, for example. Standard manufactured range 1 inch to 12 inches in length or width. The mass may be 2.25 gm/cc. Operating temperature may be −55 to +125. They can also be encapsulated in other metals. Thermal—Thermal pyrolytic graphite technology offer high thermal conductivity of 1250 W/mK, for example. They are highly thermally anisotropic. Thus, typically configurations are thin in comparison to the length.

Figure 17:
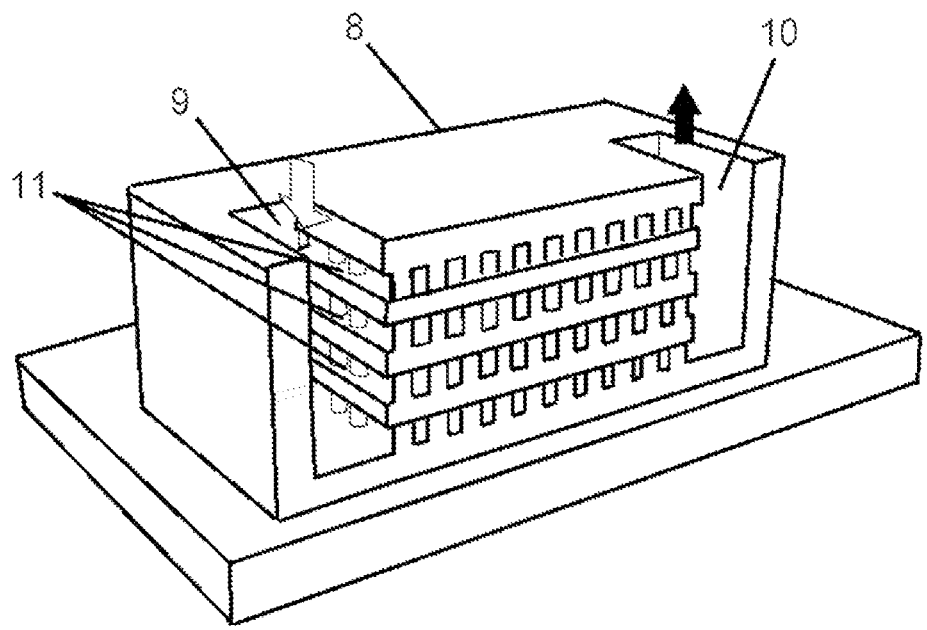
FIG. 17 is a schematic of a stacked micro-channel liquid cooler.

Micro-Channel Liquid Cold Plates:

Mechanical—As illustrated in FIG. 17, micro-channel cold plates 8 utilize forced convection as its mode of heat removal. Liquid is forced to flow into an input channel 9 and then through many small channels 11 within the micro-channel heat exchanger 8, and then out through an output channel 10. Such devices will cause the overall heat transfer coefficient to increase. Within the confined geometry of the heat exchanger 8, laminar flow of fluid can be achieved resulting in a heat transfer coefficient to be inversely proportional to hydraulic diameter. This means that the smaller the channels, the higher the heat transfer coefficient. Additional micro-channel heat exchangers can be found on www <dot>researchgate<dot>net/figure/225750415_fig1_Fig-1-3D-chip-with-microchannels-for-liquid-cooling-by-IBM). Thermal—Current micro-channel cooler products can dissipate up to 1000 W/cm$^2$ with a pressure drop of 3 psi.

Phase Change Materials:

Mechanical—A Phase Change Material (PCM) is known as a latent heat storage unit due to the heat that is absorbed or released when the material changes from one phase to another. The most practical PCMs are solid to liquid (or vice versa) phase changes because they do not typically require large volumes or high pressure to transform, like a liquid to vapor phase change. Thermal—A PCM has a high heat of fusion which is capable of storing and releasing large amounts of energy, depending on the type of material and type of phase change used. When heat is applied to the substance the heat is absorbed until the phase change is complete. Then, the ambient air will cool the material and release the latent heat until it is back to its original state. Thermal composites can also be made with PCM. In order to increase the overall thermal conductivity and high thermally conductive material can be combined with a lower conductive PCM to achieve the desired optimized conductance.

FlouriNert/Novec Cooling Fluid:

Mechanical—"Fluorinert" or "Novec" electronic liquids. It is an electrically insulating, stable fluorocarbon-based fluid, which is mainly used for cooling electronics. Fluorinert is used in situations where air cannot carry away enough heat, or where airflow is so restricted that some sort of forced pumping is required. Operating temperatures vary greatly with higher and lower boiling and freezing points. Cooling fluids require active components such as pumps, valves, and external radiators, which require additional electricity and more volume for system integration. are available from 3M. Novec has largely replaced Fluorinert at the liquid of choice. 3M™ Novec™ Engineered Fluid is non-flammable and has a low global warming potential for use in heat transfer applications. Novec fluid shares many of the properties of perfluorocarbons (PFCs) and perfluoropolyethers (PFPEs), making it a viable option for replacing them in many applications, such as semiconductor, test equipment, electronic cooling, and industrial/pharmaceutical. * Thermal—Novec is available in a wide range of boiling points from 34° C. to 167° C. These liquids may be used either as a single-phase coolant which is pumped through a cold plate or they can be used as a two-phase coolant either within a cold plate or by direct immersion of the electronics. As a two-phase coolant, they have the ability to handle very high heat fluxes. They have a heat of vaporization ranging from 83 kJ/kg to 142 kJ/kg.

Established Technologies: Heat Pipes/Vapor Chambers:

Mechanical—Heat pipes and vapor chambers are available in numerous configurations. In general, a heat pipe is made from a hollowed rod, where the inside is coated with a wicking material and is filled with a temperature sensitive substance. As heat is applied, the liquid inside to turns to vapor. When this heat is dissipated the vapor condenses back into a liquid. The wicking substance acts as a path for the liquid to flow back down to the hot end of the pipe. Vapor chambers are a type of planar heat pipe, which is basically a flattened version of a typical heat pipe, and works as a heat spreader. They are not as orientation dependent as a heat pipe and can operate independent of gravity. These pipes and chambers can come in many different shapes and sizes where overall performance is based on size and orientation. Thermal—The most common type of heat pipe is a copper-water configuration. This configuration has thermal conductivity can approach up to 100000 W/(m K), depending on the size of the pipe. Also, depending on the materials used for the chamber, the wick, and liquid, vapor chambers have the ability to remove up to 1000 W over 1 cm$^2$. With water as the working fluid, the wick structure can't replace the fluid past about 100 W/cm$^2$. Heat fluxes of up to 1000 W/cm$^2$ are available with sodium as the working fluid. But the working temperature must be over 900° K to use sodium as the working fluid.

Metal Designs: Mechanical:

If the MIDS structure and cover materials are made from 6061 T6 Aluminum (Al), the weight and thermal performance of the MIDS would be improved upon. 6061 Al is light-weight, structurally sound, and thermally conductive. Issues of environmental corrosion would need to be determined for aluminum designs. Another option would be to use C10100 Copper (Cu). This copper is structurally sound, though it is susceptible to flexing; however, it is much more thermally conductive than Al. Thermal—Thermal conductivity of 6061 T6 Al is 156 W/mK at 300° K, and for 6063 T5 it is 220 W/mK at 300° K. Thermal conductivity for C10100 Cu is 396 W/mK at 300° K. However, the density of copper is 8.96 g/cm$^3$ vs. 2.70 g/cm$^3$ for aluminum.

Description of Certain Embodiments:

Heat exchanger using woven graphite fiber sheets (or, "fins") (e.g., GHex™) combined with forced air. The very short fins can be adhered to the inside and outside of the SRU box cover, linked from opposing chassis rails, and can replace the current metal heat exchanger. For example, the top and bottom metal heat exchangers with brazed fin stock may be replaced by woven graphite heat exchangers. Woven graphite may have a thermal conductivity four times better than aluminum and two times better than copper. This increased conductivity will lower the temperature inside the box. The process would be to switch the current heat exchanger made presumably of stainless steel, aluminum, or copper with a flexible or stiffened version of woven graphite fiber sheets. Assuming the current heat exchanger is copper, a mass of graphite heat exchanger at 65% of the current copper mass may increase heat exchanger conductivity by 30% (e.g., 800 W/mK times 65%=520). Copper is 400 W/mK (400 W/mK times 130%=520 for a 30% increase per the solicitation) and woven graphite is 800 W/mK, for example (800 W/mK times 65%=520). If the current heat exchanger is aluminum the decrease in weight would be greater. Thus, there is a decrease in weight and an increase in conductivity. In addition, since the woven graphite is much thinner than the current brazed heat exchanger fins, the air flow resistance is decreased allowing a larger volume of air to flow through the heat exchanger. This increases the amount of heat carried away via the air flow without changing the fan. Attachment of the woven graphite fiber sheets to the chassis cover may be accomplished by using adhesives and terminal end fittings. Woven graphite fiber sheets may also be added to the inside of the box in the middle of the chassis rails. These sheets conduct the heat radiating from the SRUs and by the convective heat on the inside of the box between the SRUs. The length and precise location of the inside fins may be determined by analysis of the physical and thermal characteristics of the box. Woven graphite fiber sheets have very strong thermal conduction along the length of the graphite fiber with substantially lower conductivity perpendicular to the length of the graphite fiber. In thin woven graphite fiber sheets, the large surface area that provides an effect creates a thermal transfer to the very strong conduction along the length. Because the fins are very thin, the perpendicular thermal resistance is very small and will allow this transfer to occur efficiently. Consequently, a large amount of heat can be conducted from a large area into a very small interface on the cover of the box.

Pyrolytic graphite heat spreaders inserted into the existing channels and connected to the inside of the box cover for heat transport to the outside heat exchanger: An alternative to the inside woven graphite fins may be to insert pyrolytic graphite plates that will touch the cover of the SRUs on both sides of the SRU, if possible. At a minimum, one side of the SRUs may be in physical contact with the copper cover of the pyrolytic graphite. This pyrolytic graphite has six times the thermal conductivity of aluminum and three times that of copper. The pyrolytic graphite fiber sheets are thicker than woven graphite fiber sheets, however.

Flexible graphite links (GraFlex™) attached to copper covered pyrolytic graphite heat spreader to the woven graphite fiber sheet heat exchanger on the outer surface of the box cover: This flexibility enables design changes inside without redesign of the cooling system. This combination of woven graphite thermally connected to the vertical ends of the pyrolytic graphite heat spreaders enables the SRUs to change size and shape without needing to redesign the thermal transfer system. The pyrolytic graphite heat spreaders are not very flexible. Thus, flexible woven graphite fiber sheets provide the flexibility while the heat exchanger on the outside would be either the current brazed fin stock or an improved heat exchanger. The outside heat exchanger may be the current air based brazed heat exchanger, a vapor chambers in the outer chassis housing, woven graphite fiber sheets (e.g., GHex™) or a thermoelectric cooler (TEC).

Figure 18:
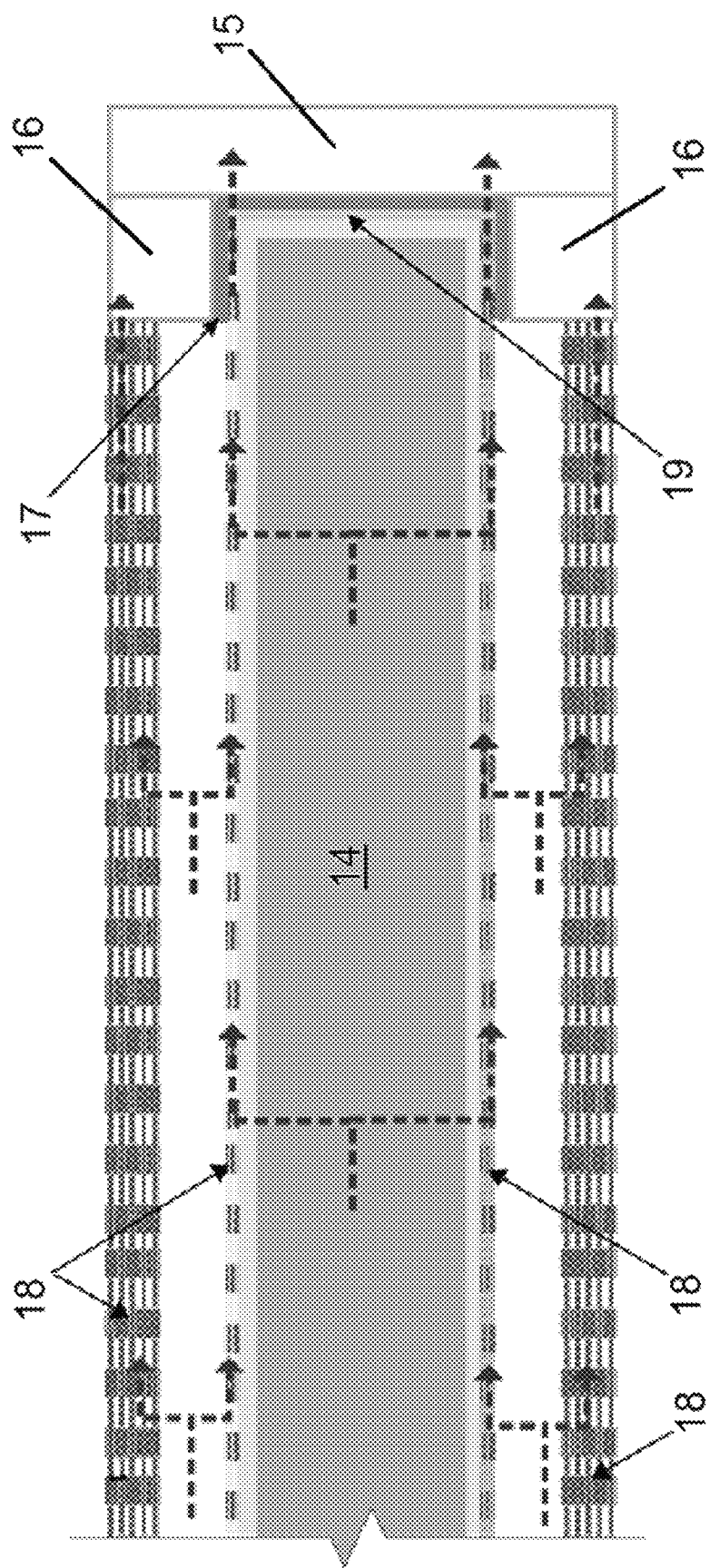
FIG. 18 is a schematic of an exemplary heat exchanger system, including woven graphite fiber sheets, configured to cool an SRU component.

Woven Graphite Fiber Sheets (e.g., GHex™) Between SRUs:

Graphite fiber sheets can be used to conduct heat to chassis rails in an SRU in order to address hot spots from different components. As illustrated in FIG. 18, woven graphite fiber sheets 18 in a more rigid configuration may be inserted within the chassis 15 of an SRU 14 from frame rail 16 to frame rail 16. Thermal interface materials 19 and protective covers 17 may be used to improve heat transfer and protect certain components. In this example, the graphite fiber sheets 18 collect convection and radiation heat from the surrounding SRU 14, and then the heat is rejected along each frame rail 16, which may be coupled to vapor chambers in the chassis housing. Another possible application of graphite may be to adhere the weave to the outer surfaces of the SRU housings and couple the ends to the chassis rails with small end fittings. Both these methods may be used in conjunction with each other as well. Another example includes woven graphite fiber sheets shaped to the inside of the SRU so that the graphite fiber sheets' air heat exchanger capability can be used to conduct heat away from the hotter components on the PCB. Optionally, an electrical insulating covering is provided to the woven graphite fiber sheets for the parts of the PCB that exposes electrical contact points. Getting the woven graphite fiber sheets close to the hot components provides a for higher thermal efficiency through the high conductivity graphite. This example provides a low cost method of removing increased heat from hot components.

Figure 19:
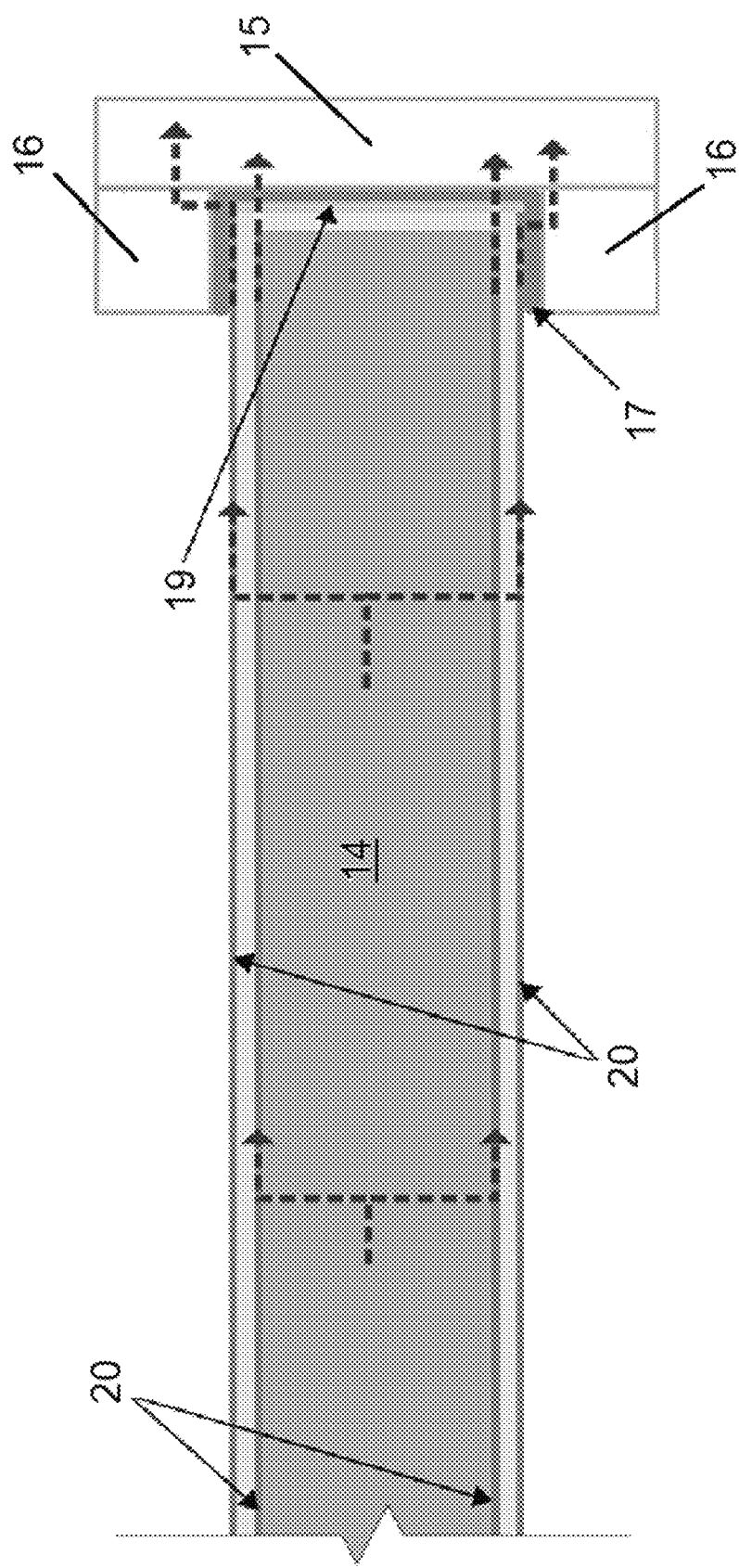
FIG. 19 is a schematic of an exemplary heat exchanger system, including pyrolytic graphite, configured to cool an SRU component.

Pyrolytic Graphite Links (PGL™) with Adhesive Backing:

This example (see FIG. 19) uses an adhesive backed pyrolytic graphite 20 (such as PGL™) either attached to the inside or the outside of the SRU cover. The PGL™ would run the length of the SRU 14. For increasing the conduction to the inner surface of the box, layers of pyrolytic graphite links 20 may be used. This example assumes the covers 17 are aluminum. PGL™ may be equal to 3% of the weight of the aluminum cover to the inside of the cover. This increases the conduction by 30% (9.75/7=1.39) times since aluminum is 200 W/m-K (200 times 30% increase=60) compared to 1950 for pyrolytic graphite (1950 times 3% PGL™ weight of aluminum=60).

Heat Pipes Inserted into the Channels and Connected to the Current Heat Exchanger on the Outside of the Box:

Heat pipes are well known as an effective way to cool electronics, with several different configurations including flat heat pipes, loop heat pipes, sorption heat pipes, etc. Depending on the allowable volume within the channels of the box, a structure built from heat pipes could be used. The type of liquid to use inside the pipe/chamber may be optimized for the most heat transfer. This is dependent on the operating temperature within the box. Typical working fluids are water, acetone, and ammonia. Heat pipe performance can be dependent on orientation and movement. With the proper wick structure, the heat pipe may operate in any orientation although it achieves its highest apparent thermal conductivity with the evaporator lower than the condenser due to gravity assist. Or, in the case of a closed loop pulsating heat pipe, the performance is sensitive to acceleration and vibrations. A configuration with low sensitivity to these issues is the closed loop heat pipe, which consists of an evaporator (heat sink), compensator (saturated liquid reservoir), and a condenser (expels the heat through phase change from vapor to liquid). This configuration works well if the distance of heat transfer is large and for low temperature differentials. The characteristics of the box and SRUs fall within the distance and temperature differentials. Type of contact such as the heat pipes/vapor chamber having direct contact with the confines of the box may be optimized. This could include attachment to the SRU outer cover since the boards (PCBs) are covered.

Thermoelectric Coolers Added to the Outside of Box Cover Cooling the Inside and Transfer Heat to the Outside:

Thermoelectric Coolers (TECs) provide excellent cooling capabilities. The larger modules have the ability to move 100 W or more of heat with efficiency between 2% and 5%. Thus, the electrical power input may be about 20 times greater than the thermal power. In addition, the temperature differential may be low but in range for the box application. TEC modules require electrical power generation and electrical power does not appear to be a significant issue since the MIDS system is used in a board array of large vehicles with sufficient power.

Vapor Chamber on the Outside of the Box Cover with an Exterior Woven Graphite Heat Exchanger:

A vapor chamber on the outside of the box creates a thermally conductive sink on the surface of the box. One issue is providing a heat sink like the woven graphite fiber sheet heat exchanger(s) or TECs located elsewhere, such as the chassis. As the woven graphite fiber sheet heat exchanger or the TEC cools the inside of the chamber, the other side becomes hot and moves heat to the outside of the chamber. A vapor chamber may be applied to expel the rest of the heat. Attaching woven graphite fiber sheet heat exchanger directly to a vapor chamber on the outer box cover would give the most efficient means of heat transfer. To achieve the desired heat removal, several large chambers may be use. Vapor chambers can be as thin as a credit card. The size of chambers may be dependent on the allowable volume of the outside box cover. The inside of a vapor chamber is hollowed to allow the fluid inside to cycle through its phase change. This space could collapse if enough pressure is applied to the chamber. The chamber can be manufactured with inner supports to solve this issue. Epoxy or soldering may be used, or special bolt holes could be manufactured into the chamber for interfacing components.

Cooling Metal Tray with Cooling Fluid:

Cooling fluids may to be a used for achieving an additional 30% cooling in the MIDS. Fluorinert's line of cooling fluids have differing operating temperatures, which may not be wholly applicable to the temperatures that the MIDS is subjected to. With lower boiling points and freeze points it would be difficult to select the appropriate type. In addition to the potential operating temperature mismatch, Fluorinert may be harmful if inhaled and care should be taken to avoid contact with eyes and skin. Furthermore its use should be constrained to closed systems and reduced volumes. This health hazard presents applicability issues when the MIDS is used in a closed and confined area in close proximity to people. It is also noted that a cooling fluid requires an active style system to include pumps and fluid transport lines in order to remove and reject the heat away from the electrical components.

Micro-Channel Liquid Coolers:

Micro-channel coolers are a possible external heat exchanger thermal solution for pulling heat off of hot components (See FIG. 17). The cooler acts as a small forced convection heat exchanger. The fluid moving through the device will pick up heat from the source and transfer it out as the fluid leaves the channels and leave through natural convection through the pipes. This system may be improved by attaching woven graphite fiber sheets, as well as, optionally, heat pipes, for example, to the cooler. The smaller the channels the higher the heat transfer coefficient and the more heat can be transferred to the liquid; however, a greater force may be necessary to force the liquid through. This may require a pump, size dependent on pressure required, which in turn would require power input.

Figure 20:
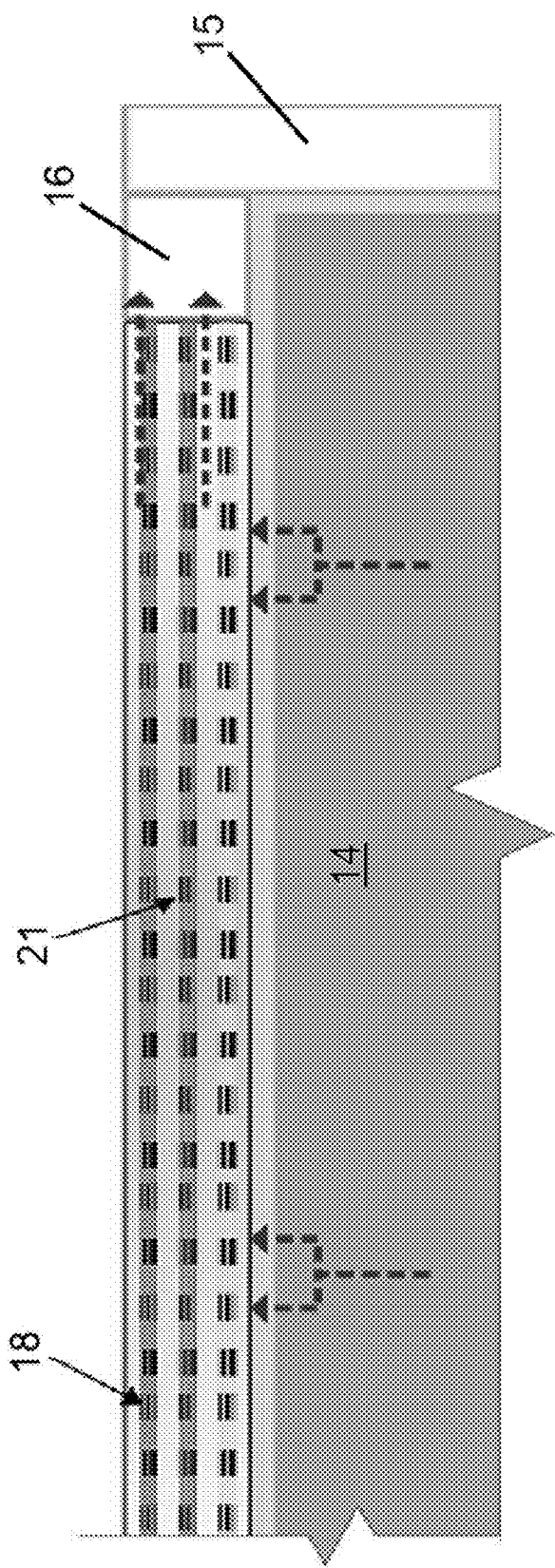
FIG. 20 is a schematic of another exemplary heat exchanger system, including woven graphite fiber sheets, and optionally a phase change material, configured to cool an SRU component.

Phase Change Materials (PCM):

Vapor to liquid phase change materials have the highest heat of transformation of all other types of phase change materials, but they usually require high pressures or large volumes to effectively store heat. For this application, a solid to liquid material may be the most practical. PCMs can range in melting point from −5 to 190° C., but the heat must remain relatively consistent to allow the phase change cycle to continue. PCM are good for temperature leveling during power peaks but are of no use if the steady state power level keeps the PCM above the melting temperature. Therefore, they are only useful to handle the transient peak heat loads. Though the PCM has a high heat of fusion, typically the solid state form has low thermal conductance compared to its liquid state. This problem can be solved by combining the material with high thermally conductive material, such as copper or graphite fiber sheets, into a thermal composite. For example, for use with SRUs, woven graphite fiber sheets 18 may be immersed in paraffin-wax 21 to combine the highly conductive material with the high latent heat storage and release of the wax (see FIG. 20).

Improved MIDS Fan Technologies:

a variety of fan technologies may be utilized in conjunction with the above mentioned cooling improvement options. High volume/high pressure fans may be used at the cost of a large increase in acoustic noise output.

Example 3—Heat Exchangers with Portable Thermoelectric Generators

The heat exchangers (HEX) of the present invention can be used for a variety of applications. One application is as a heat exchanger for portable thermoelectric generators (TEGs) in use with a heat source such as a camp stove, fire, or furnace. One or more TEG modules, each module containing an array of carbon fiber sheets (or fins), are positioned around a high temperature source. For a TEG to produce electricity, a thermal gradient must be formed between the hot side and cold side of the TEG. Thus, the system must be able to deliver heat from the high temperature source to the hot side of the TEG and then quickly remove heat from the cold side of the TEG.

Figure 21:
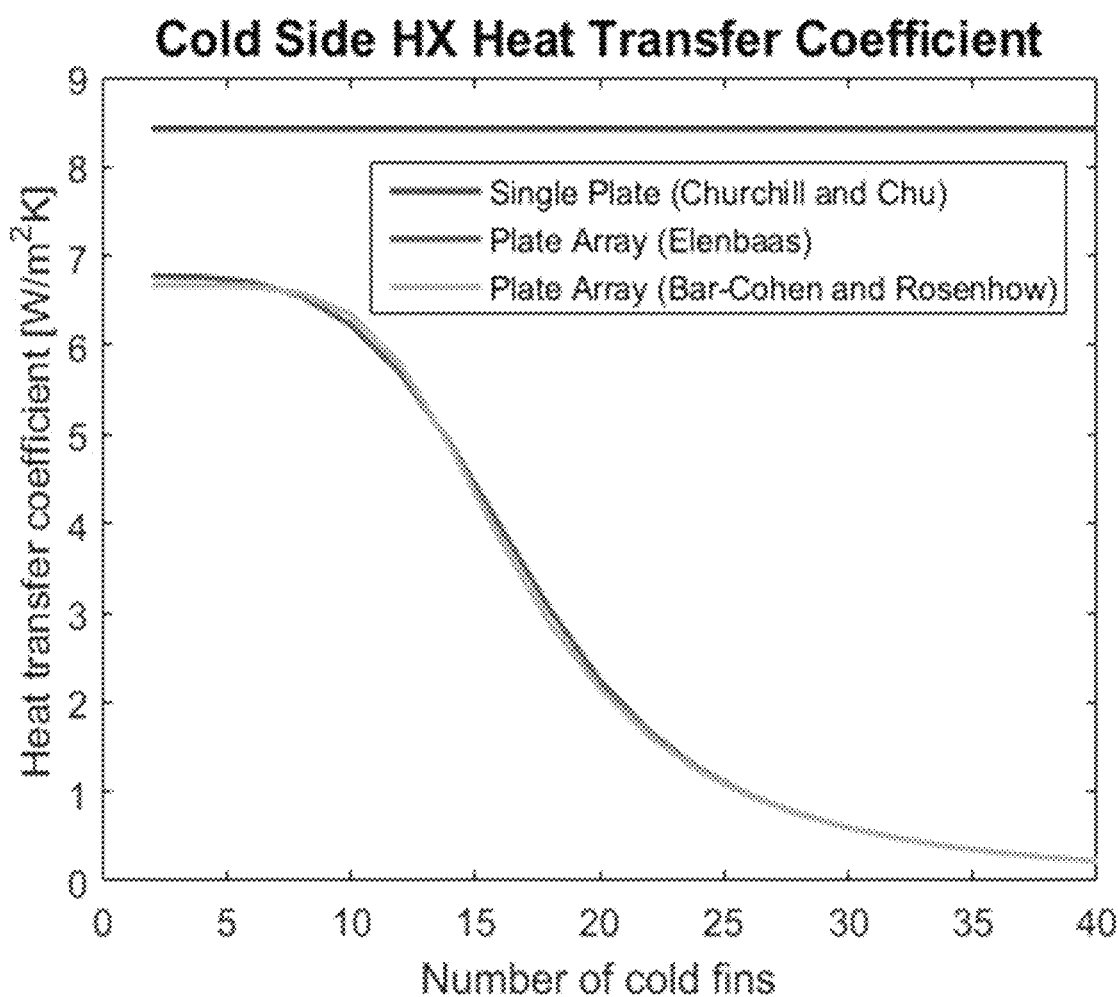
FIG. 21 is a graph showing the effect of spacing between fins on convective heat transfer coefficient in a model.

A key consideration is the number, length and positioning of the carbon fiber sheets (also referred to as fins) used to transfer the heat to and from the TEG. Additionally, the spacing between the fins will affect the convective heat transfer. In natural convection, a boundary layer forms such that outside the boundary layer, the fluid is quiescent, and inside the boundary layer, the fluid has an upward velocity. When vertical plates (or fins) are placed near each other, the boundary layers from adjacent surfaces merge, which reduces convective heat transfer between the plates and the environment. FIG. 21 shows the comparison of heat transfer between a single plate model and a plate array model.

Accordingly, the heat exchangers of the present invention were modified to adjust for the convective heat transfer coefficient losses due to carbon fiber sheet (i.e., fin) spacing. Such modifications include, but were not limited to, increasing the overall heat exchanger surface area, decreasing the number of fins, increasing the surface area for the fins, and using higher performance TEGs. Such modifications allow for more flexibility in the design configuration while maintaining, or exceeding, the power density requirements.

The heat exchangers described in this example are based on high conductivity woven graphite heat exchanger material (GHex™) (900 W/mK with a mass density of 2.2 gr/cm$^3$). The selected HEX had a projected power density of at least 89 watts per kilogram. The very durable and lightweight (217 grams) HEX assembly can be collapsed and transported in an 8×11 envelope or back pack.

An exemplary heat exchanger system used with a TEG is illustrated in FIG. 22. While the flame of the fire (i.e., the high temperature source) was sufficiently hot at around 750° C., the temperature surrounding the flame at 2 inches was maintained at only around 50° C., which will not be enough to produce sufficient power out of the TEGs. Accordingly, design considerations were made to position the fins and/or the TEGs closer, or more direct contact, with the flame of heat source. Since the TEGs can have a much higher maximum temperature rating of 600° C., it was desirable to get the TEG hot side temperature as close to 600° C. as possible.

Figure 23:
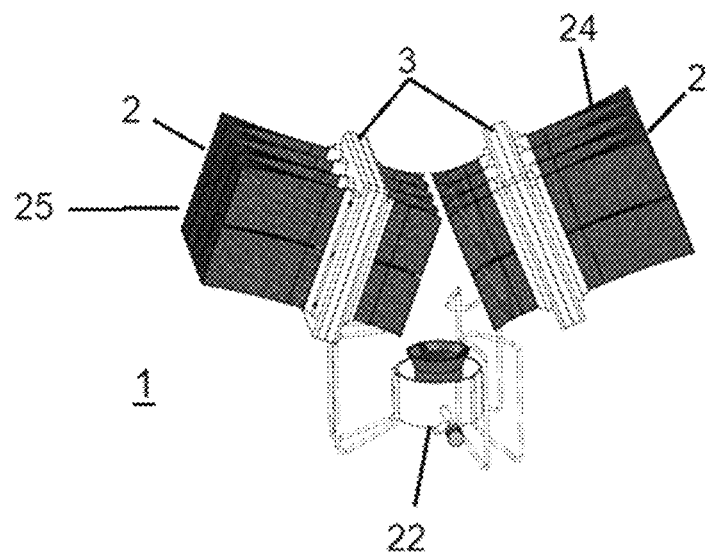
FIG. 23 is an illustration of an exemplary heat exchanger system design having a "lean-to" design configuration. Two heat exchanger modules lean over the fire, with the graphite fiber sheet fins (GHex™) having direct contact to the flame near the bottom.
Figure 24:
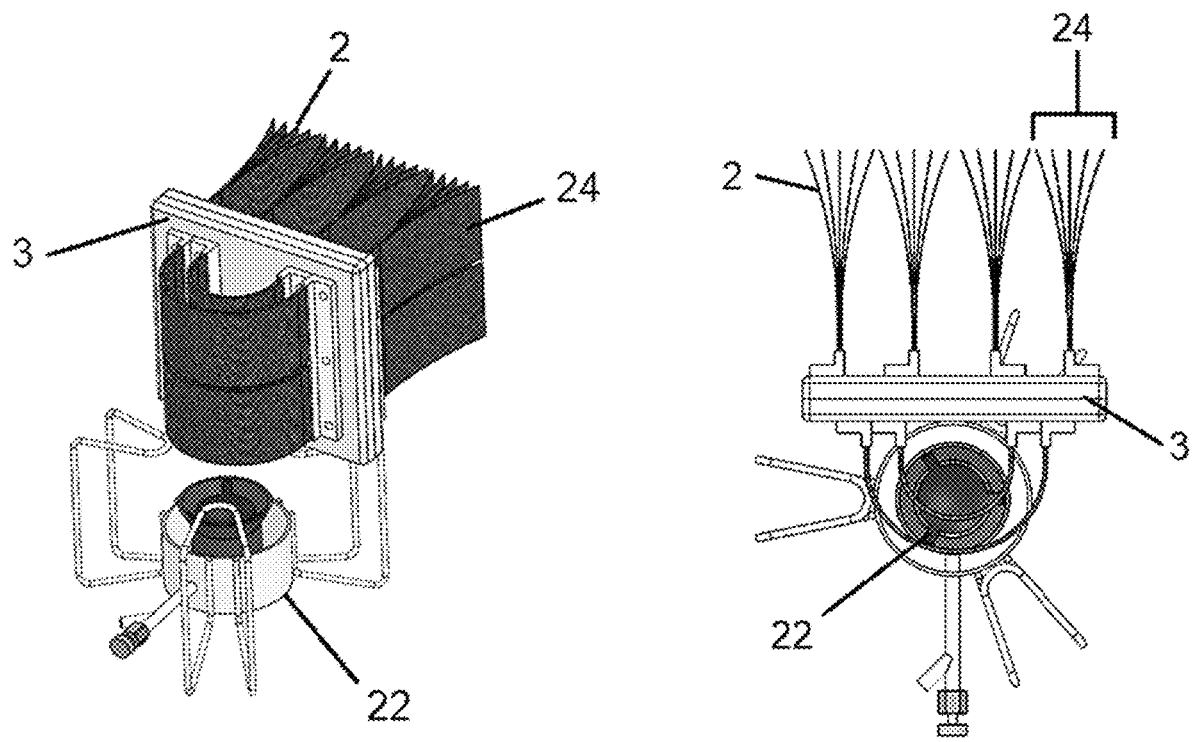
FIG. 24 is a side and top view illustration of an exemplary heat exchanger system design having a "chimney" design configuration. The GHex™ fins on the hot side form a chimney to direct the heat of the flame directly to the TEG clamp plate.

Similar to FIG. 22, FIGS. 23-25 show additional designs used to optimize performance. FIG. 23 shows a "lean-to" design configuration where the TEG module 25, with woven graphite fins 2 on both the hot and cold sides, leans over the heat source 22 at an angle. FIG. 24 shows a "chimney" design configuration where the fins 2 on the hot side of the TEG module 25 form a chimney to direct the heat of the flame directly to the TEG clamp plate.

Figure 25:
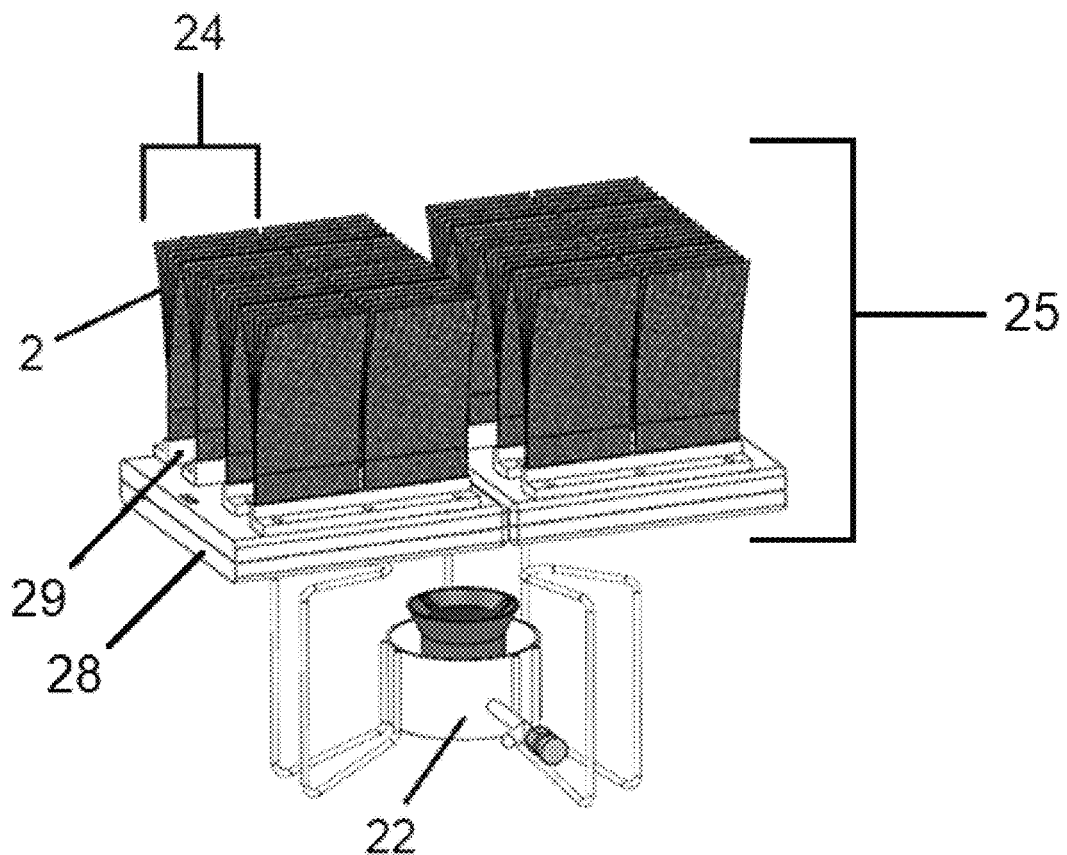
FIG. 25 is an illustration of an exemplary heat exchanger system design having a "TEG direct" or "horizontal" design configuration. There are no GHex™ fins on the hot side, and the clamp plate containing the TEGs sits directly over the flame. This plate is made of stainless steel and thickness can vary to maintain a certain temperature on the TEGs.

FIG. 25 shows a "TEG direct" design configuration where the TEG module 25, with woven graphite fins 2 on the cold side only, lies over the heat source 22 horizontally with the plate containing TEGs in direct contact with the flame. A similar design, not shown, is a "horizontal" design configuration where the TEG module, with woven graphite fins on both the hot and cold side, lies over the heat source horizontally.

Figure 27:
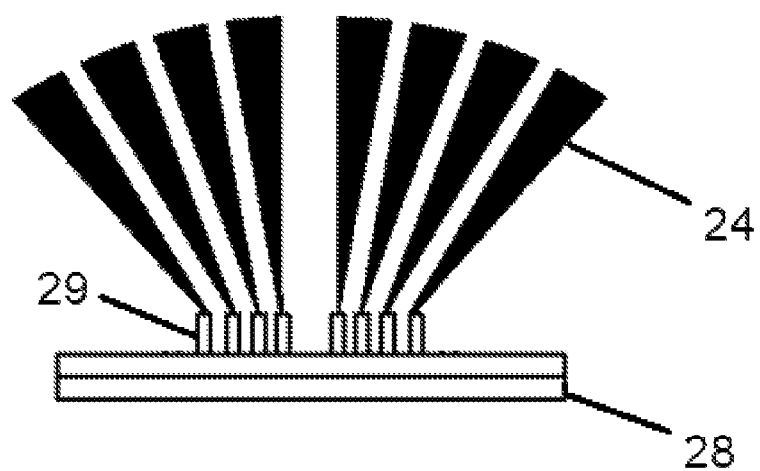
FIG. 27 is an illustration of an exemplary heat exchanger system design having a variation of the "TEG direct" design configuration similar to FIG. 25, but where the cold-side fins are arranged in a spread out fan shape.

FIG. 27 shows a design similar to the "TEG direct" configuration, but where the cold-side fins are arranged in a spread out fan shape. In one such example, the cold side has 48 total 4" wide fins at 6" long, and the hot side has 16 total 4" wide fins at 5" long. In order to achieve improved convective heat transfer, the fins were spaced at least 1 cm apart from each other. For the cold side, a set of plastic "fanning" fixtures were designed and 3D printed to achieve the best possible spacing. Different methods of a fanning solution for the hot side were used, including: using 931 graphite epoxy to mold the fins into shape, and using fire-proof thread to attach to the ends of each fin.

Each design has its merits and drawbacks. Table 7 compares the pros and cons of each design, and additional considerations that must be made. Once a design is chosen, it can then be improved by considering other components of the design such as electrical connection, structuring of the fins, and possibly heat shields.

TABLE 7

Heat exchange designs for TEGs.

| Design Configuration | Pros | Cons | Additional considerations |
|---|---|---|---|
| Original (FIG. 22) | Maximum power output can be achieved by surrounding the stove with more than one module | The distance between the GHex ™ fins and the flame might be too far for proper heat transfer to occur. Max operating temperature might be too low, which requires more hot-side fins to achieve adequate temperature difference. This in turn adds weight. A substantial amount of the energy of the flame is escaping into the open air because of the vertical fin configuration, instead of being transferred to the fins. | |

TABLE 7-continued

Heat exchange designs for TEGs.

| Design Configuration | Pros | Cons | Additional considerations |
|---|---|---|---|
| Lean-to (FIG. 23) | Operating temperature of TEGs is up 650° C., allowing for more design options. Number of necessary fins will decrease, and therefore decrease weight. | The lower fins receive the most direct contact with the flame, and therefore will transfer the most heat to the lower part of the TEGs. Uneven heating of the TEGs will decrease efficiency. Energy of the flame will still escape out on the front and backside of the "lean-to" set-up. | The lengths of the fins on the hot side can be varied to offset uneven heating of the TEGs. For example, the fins near the bottom will be longer than the ones near the tops, to slow down heat transfer due to conduction. Horizontal fin configuration will also be considered. This might slow the gas velocity down and allow greater heat to extracted from the flame. |
| Chimney (FIG. 24) | Operating temperature of TEGs is 600° C., allowing for more design options. Number of necessary fins will decrease, and therefore decrease weight. The GHex ™ might direct the heat of the flame through the fins and against the TEG clamp plate,. | The configuration of the GHex ™ will limit the allowed total number of fins. In order for this design to function, very few fins can be used before the efficiency of heat transfer starts rapidly decreasing. The sections of fin near the bottom will receive more direct contact with the heat source, and will cause uneven heating. Current design as seen in the FIG. 4 will allow for energy losses. This design can be approved to offset those losses. | The chimney will need further design considerations to make sure that all flame energy is directed through the fins and TEG clamp plate. The increased velocity of the gas in a chimney might decrease the efficiency. Gas velocity issues will need to analyzed. |
| TEG Direct (FIG. 25) | Operating temperature of TEGs is 600° C., allowing for more design options. Number of necessary fins will decrease, and therefore decrease weight. Eliminating fins completely will decrease weight. TEGs will receive the most direct contact with flame and will have a higher temperature. Eliminating the need for hot side fins will also eliminate the need for high temperature rated metals, epoxies, and resin coatings. This will greatly simplify the hot-side design. | The flame will heat a small point of the plate, as compared to a larger surface area of TEGs, making heating uneven and decreasing efficiency. Excess heat from the flame would escape from underneath the clamp plate, and start affecting the heat transfer of the cold side fins. Without proper structure, the cold side fins would not stand up straight and would start falling into each other, and down into the flame. | A heat spreader could be incorporated in the hot side clamp plate to help with even heating on the TEGs. A small heatshield-like structure could be incorporated into the design to minimize parasitic heat transfer from the escaped flame heat. A combination of the plate directly over the flame and hot side fins held vertically above the flame will be considered. The combination of gas velocity and heat extraction could present a trade off scenario. |

Figure 30:
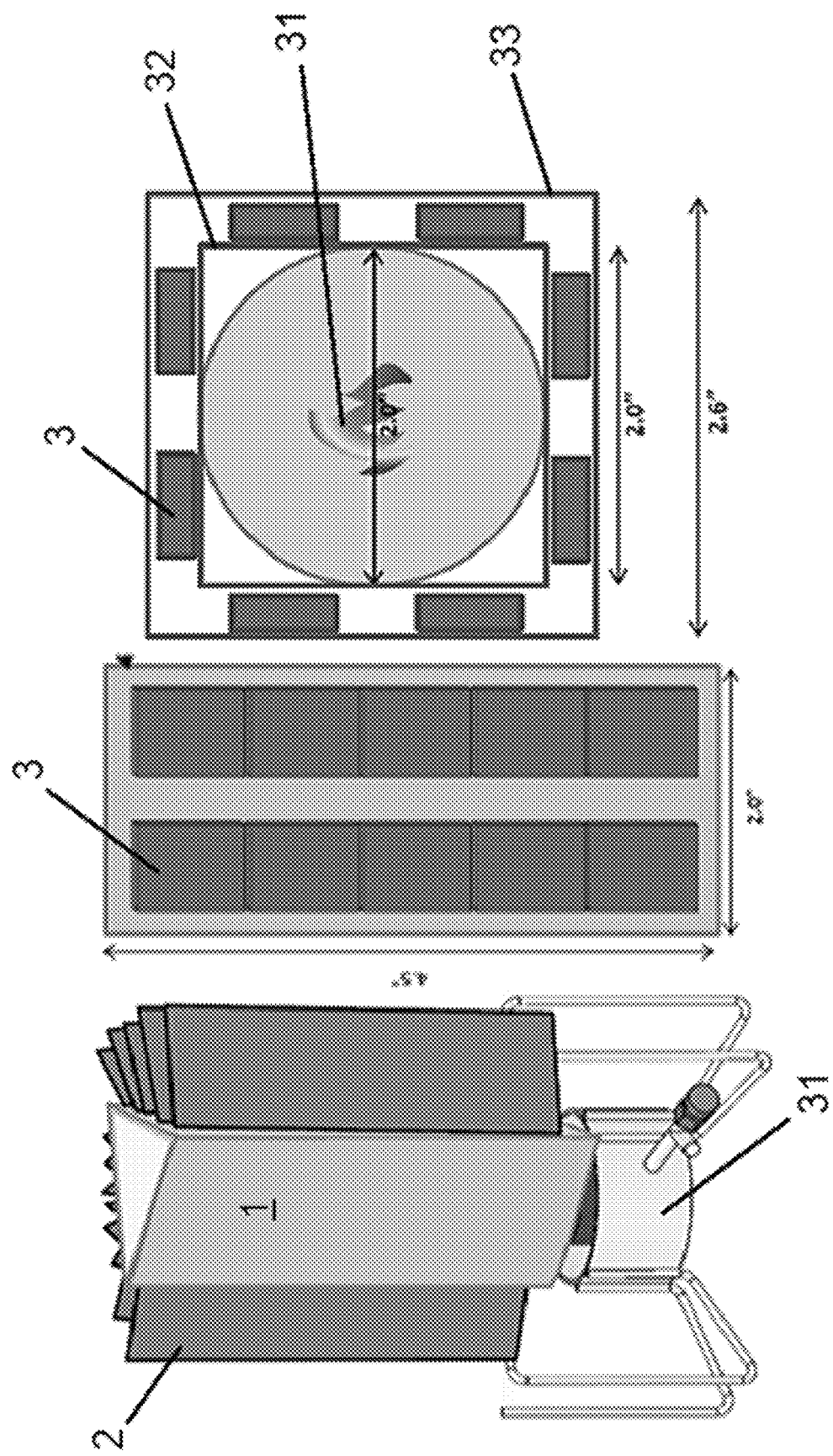
FIG. 30 is an illustration of an exemplary heat exchanger system design having a "triangular chimney" design. The left shows a triangular version, standing on the burner as seen from the side. The two right pictures depict a square version of the chimney design with dimensions. The middle picture shows the number of TEGs that will fit onto on side of the square design. The right picture is the view from the top, showing the system encircling the flame. The square version includes 40 TEGs as opposed to the current design at 24 TEGs

FIG. 30 is an illustration of a further exemplary heat exchanger system 1 design having a "triangular chimney" design. The left shows a triangular version, standing on the burner 31 as seen from the side. The two right picture depicts a square version of the chimney design with dimensions. The middle picture shows the number of TEGs 3 that will fit onto on side of the square design. The right picture is the view from the top, showing the inner plate 32 and outer plate 33 of the system encircling the flame. The square version of this embodiment accommodates 40 TEGs 3.

Figure 31:
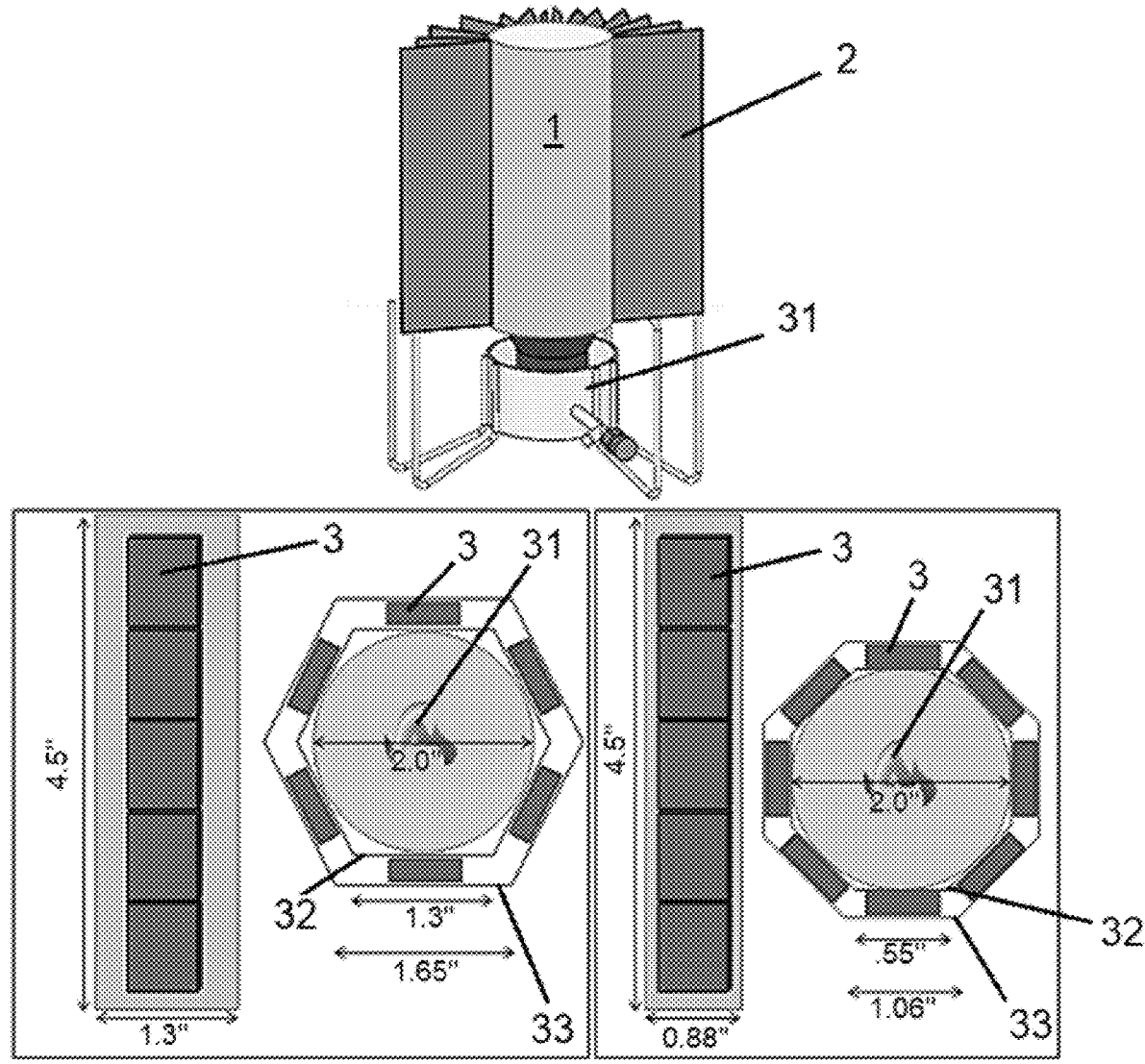
FIG. 31 is an illustration of exemplary heat exchanger system designs having an alternative "circular chimney" (top), "hexagonal chimney" (bottom left) and "octagonal chimney" (bottom right) design configurations. The top picture shows a circular configuration as it stands on the stove burner. The two bottom pictures depict hexagonal and octagonal versions of the chimney design with dimensions, showing the inner plate as the TEGs lay and the top view (excluding fins) of each design.

FIG. 31 is an illustration of a similar exemplary heat exchanger system 1 designs having an alternative "circular chimney" (top), "hexagonal chimney" (bottom left) and "octagonal chimney" (bottom right) design configurations. The top picture shows a circular configuration as it stands on the stove burner 31. The two bottom pictures depict hexagonal and octagonal versions of the chimney design with dimensions, showing the inner plate 32 as the TEGs 3 lay and the top view (excluding fins) of each design. The hexagonal configuration provides 30 TEGs 3 and approximately 90 Watts, while the octagonal configuration provides 40 TEGs 3 and 120 Watts. These chimney designs can improve overall performance by filtering the heat from the heat source through the fins more efficiently, increasing the hot side temperature and creating a larger temperature differential.

Overall, the designs describe above allow for varying configurations of the fins on the surface of the TEG or compression plate including: same number of fittings on the hot side and cold side, vertical fins on one or both sides, horizontal fins on one or both sides, and no fins on the hot side.

Example 4—System Modeling and Attachment of the Fins

Figure 26:
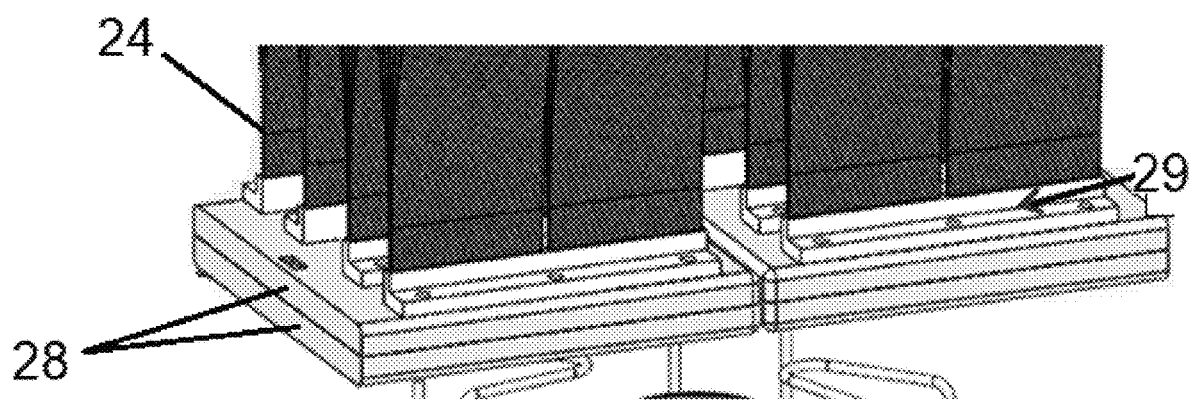
FIG. 26 is an illustration of attachment of the fins to the TEGs of the example as illustrated in FIG. 25.
Figure 32:
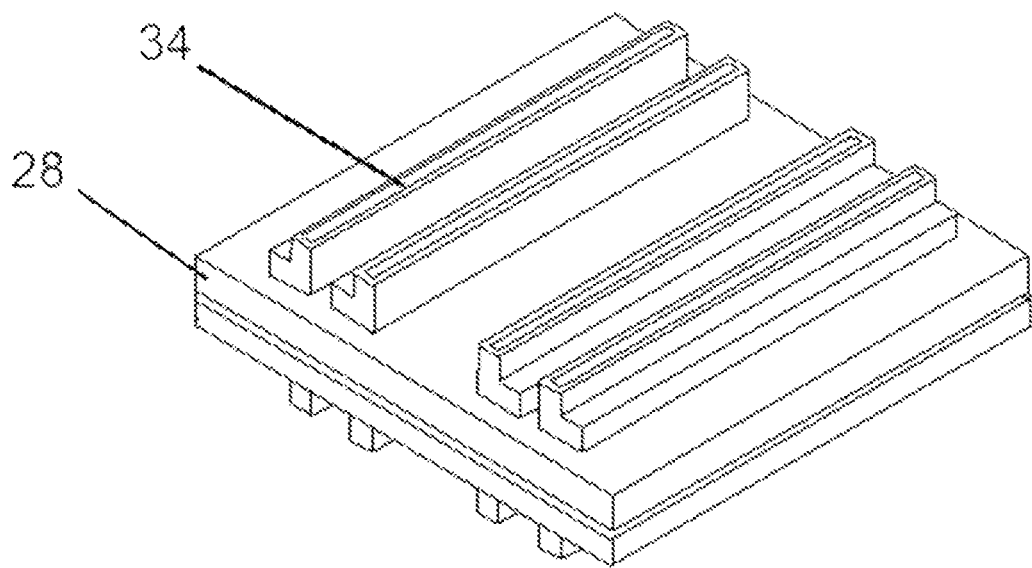
FIG. 32 is an illustration of an engineering build design, showing long brackets that will attach the graphite fins to the surface of each compression plate.
Figure 33:
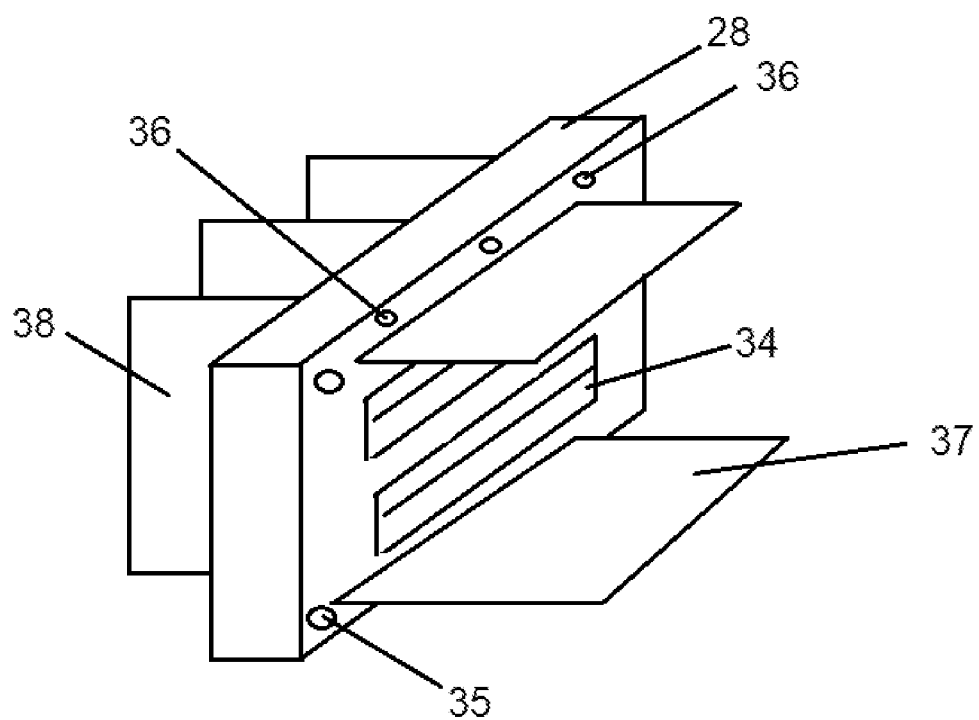
FIG. 33 is an illustration of an engineering build design that will allow varying configurations of the fins on the surface of the compression plate including: same number of fittings on hot side and cold side, vertical fins on one or both sides, horizontal fins on one or both sides, and no fins on the hot side (optional).
Figure 34:
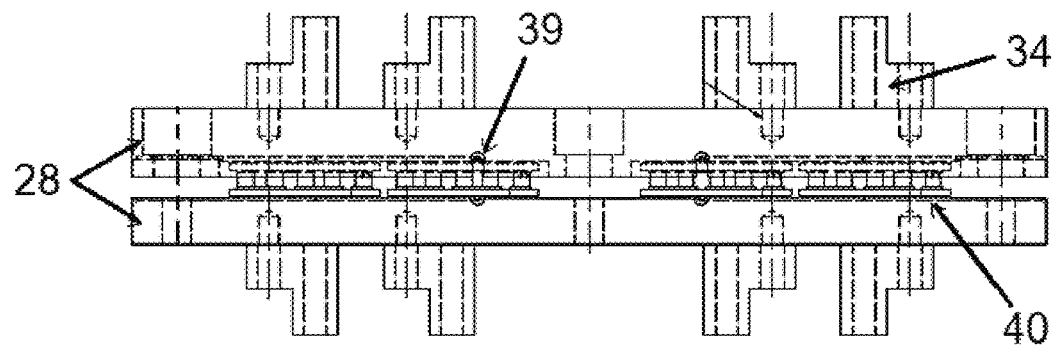
FIG. 34 is a side view illustration of an engineering build design, showing brackets that will attach the TEG array to the compression plates.

As seen in FIG. 26, one design for attaching bundles of graphite fins 24 to compression plates 28, which clamp the TEGs into place and decreases thermal resistances of TEG interfaces, involved epoxying the graphite into aluminum and stainless steel fittings 29 and bolting the fittings onto the compression plate. This will require the bolts to pass through the compression plate 28 and TEG array (not shown) in order to achieve an appropriate amount of torque that will decrease resistances of the interface between the plate and the graphite. Helicoils were inserted into the compression plates in order to bolt the fittings 29 onto the plates to maintain proper force at the thermal interface, which will minimize thermal resistance. However, alternative means of attachment are also available. The ideal configuration will minimize thermal resistance and weight, which includes maintaining direct contact of the fins to the TEGs and minimize the required thickness of each plate. FIGS. 32-34 illustrate various such designs FIG. 32 shows a design which uses long brackets 34 in the compression plates 28 to secure the bundle of graphite fins 24. FIG. 33 shows a similar design where the compression plate 28 may also contain vertical cooling fins 38 on one side and one or more horizontal fins 37 on the other side. The fin bolts 36 and the compression bolts 35 used to secure the fins and compression plates 28 together are also shown. These designs can also take into consideration the requirements of measuring temperature during testing. Thermocouples 39 are also able to be inserted in between the plates and TEG arrays 40 to accurately measure the temperature at those points as seen in FIG. 34.

Figure 35:
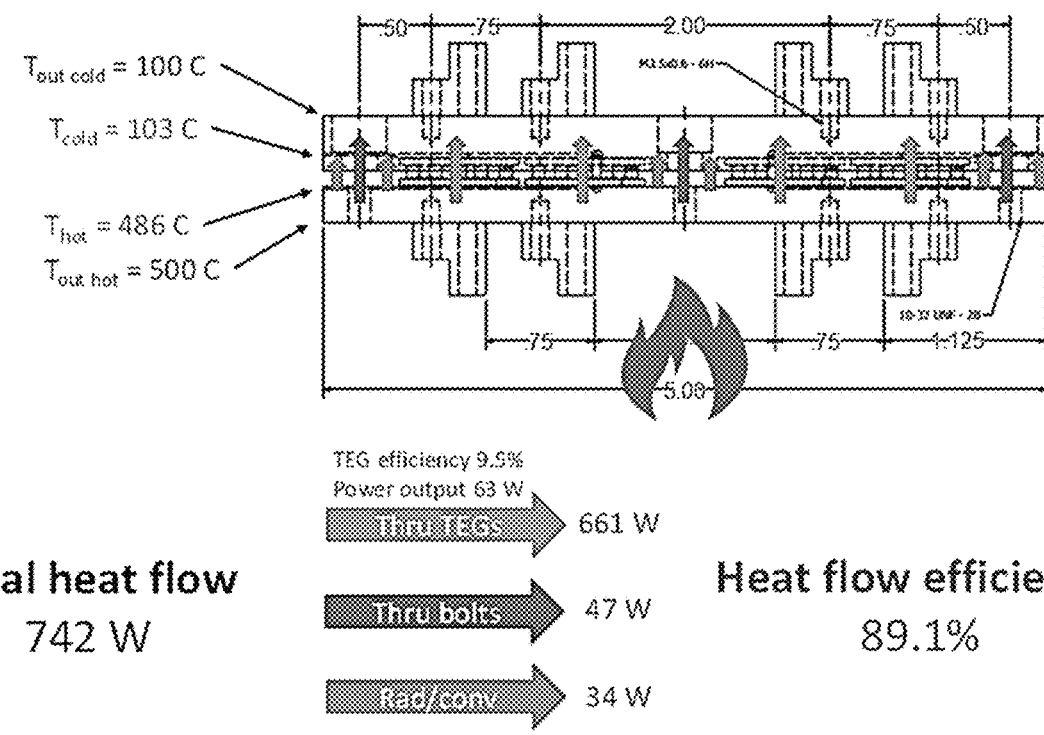
FIG. 35 is an illustration of the projected heat flow performance of the engineering model design.

FIG. 35 shows the ideal operating condition of the engineering model design of FIG. 34. This assumes that the fins will be able to heat the hot side compression plate to 500° C. and cool the other plate to 100° C. The results show good heat flow efficiency, with an expected total heat flow of 742 Watts from the fire. This current design shows an optimal power output of 63 W.

Figure 36:
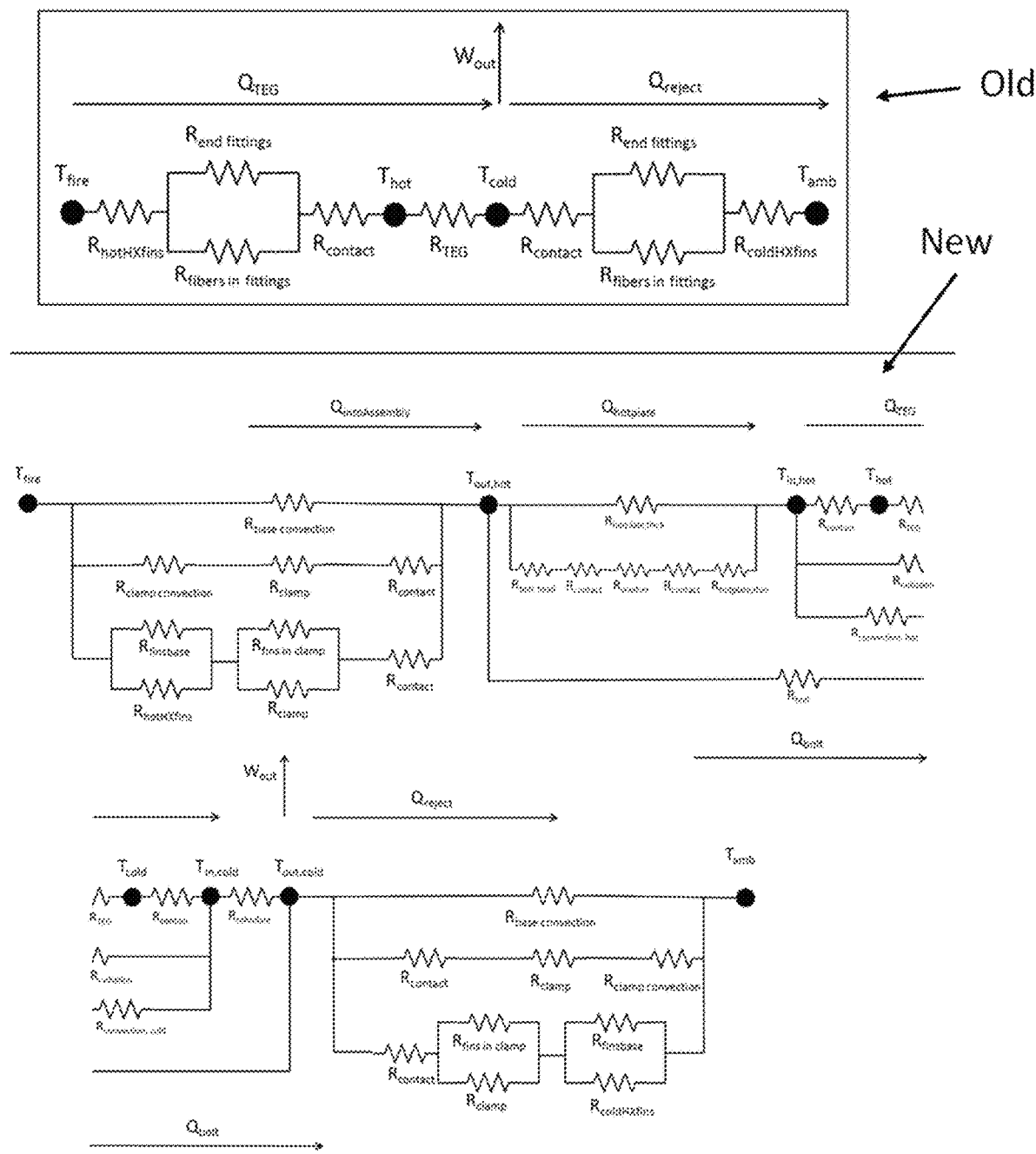
FIG. 36 is a schematic of an exemplary thermal resistance circuit of a thermal model indicating where accuracy improvements to the design are made

The thermal model was updated for accuracy by taking into account the mechanical aspects of the design, such as bolts, insulation, and air spaces, instead of assuming that all heat is transferred through the TEG. FIG. 36 shows this update as a thermal resistance circuit of the system.

Figures 37, 38:
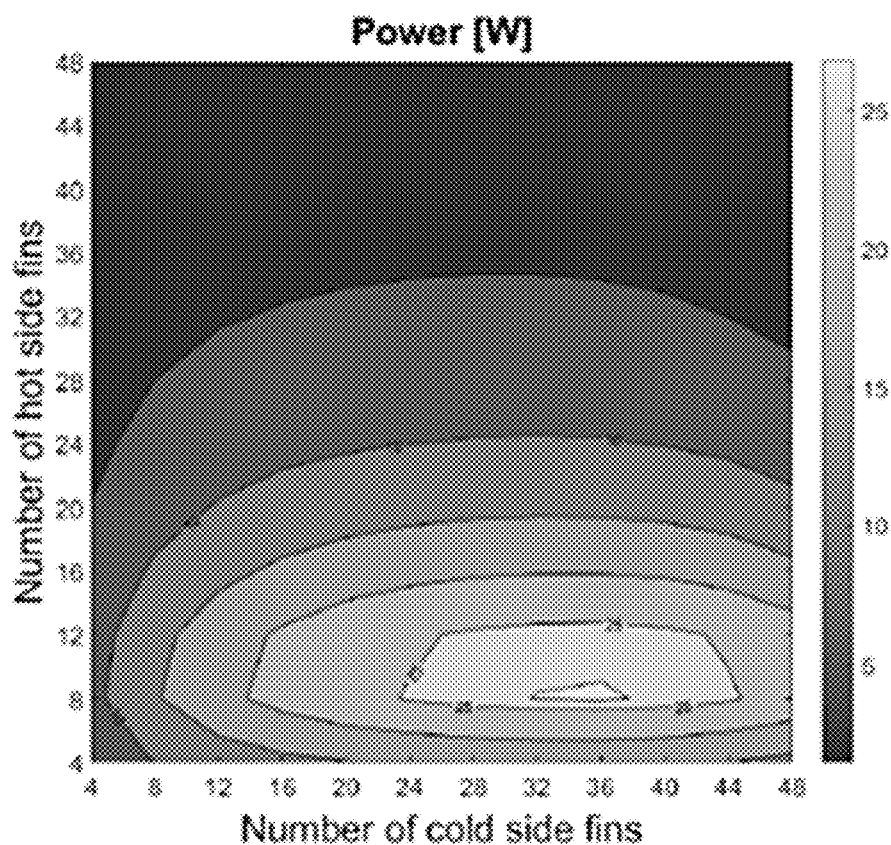
FIG. 37 is a graph showing full system model results with varying cold-side heat transfer coefficients.
FIG. 38 is a visual representation of optimized configuration of the fin. This model is based off of the engineering model design with varying number of fins, which affect the following parameters: heat transfer coefficient (more fins will cause a lower coefficient), TEG hot and cold side temperatures (best hot side temperatures with a small number of fins, best cold side temperature with a high number of fins), and TEG efficiency.

FIG. 37 shows the results for the engineering model using GHex™ hot and cold side fins, while varying the air heat transfer coefficient. The hot side has 12 fins at 4 inches in length and 4 inches wide, while the cold side has 48 fins at 4 inches long and 4 inches wide. During the GHex™ breadboard strap testing, the air heat transfer coefficient was found to be around 7.1 W/m²-K in the lab conditions at ambient temperature and air pressure, with no air movement. In these conditions, the overall system power output was extrapolated to be approximately 45 W. This performance can be greatly increased by improving the cold-side heat exchanger properties.

FIG. 38 is a visual representation of the optimized configuration of the fin for best performance of the system. This model is based off of the engineering model design with varying number of fins, which affect the following parameters: heat transfer coefficient (more fins will cause a lower coefficient), TEG hot and cold side temperatures (best hot side temperatures with a small number of fins, best cold side temperature with a high number of fins), and TEG efficiency. FIG. 38 shows an area of optimized power with 8 hot side fins and 32-36 cold side fins where there is a large temperature drop across the TEG.

Example 5—Temperature Profiles and Durability

Figure 39:
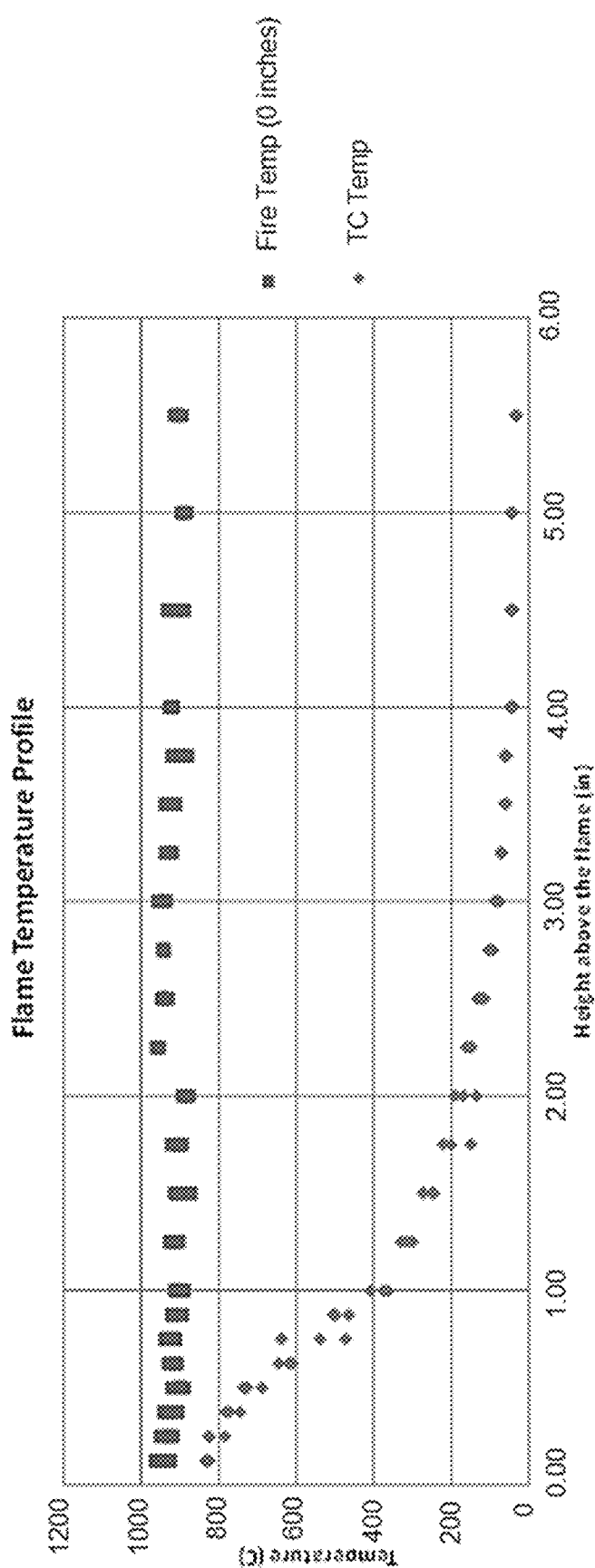
FIG. 39 is graph showing results from a fire profile test. A large decrease in temperature is seen as the distance above the flame is increased from about a quarter inch to two inches. After that, there is only a slow drop off in temperature. To get the best contact with heat, the TEGs of the present invention should be within an inch of the flame at 400° C. or more, ideally in direct contact with the flame at around 900° C.

An initial fire profile test was conducted by measuring the temperature of the flame at varying heights above the flame (see FIG. 39). This test demonstrated that a large decrease in temperature is seen as the distance above the flame is increased from about a quarter inch to two inches. After that, there is only a slow drop off in temperature. Thus, to get the best thermal contact with heat, the TEGs or heat exchangers should be within an inch of the flame at 400° C. or more, ideally in direct contact with the flame at around 900° C.

Subsequent tests were performed where five one-ended straps (no end fitting or heat source block) of GHex™ fins were placed in a fire. One side of each strat was bolted onto a test block containing an embedded thermocouple on one end, while the other end of the strap was exposed to flame. One of the straps was made with 13 woven graphite sheets, while the others straps were made with only one.

Figure 40:
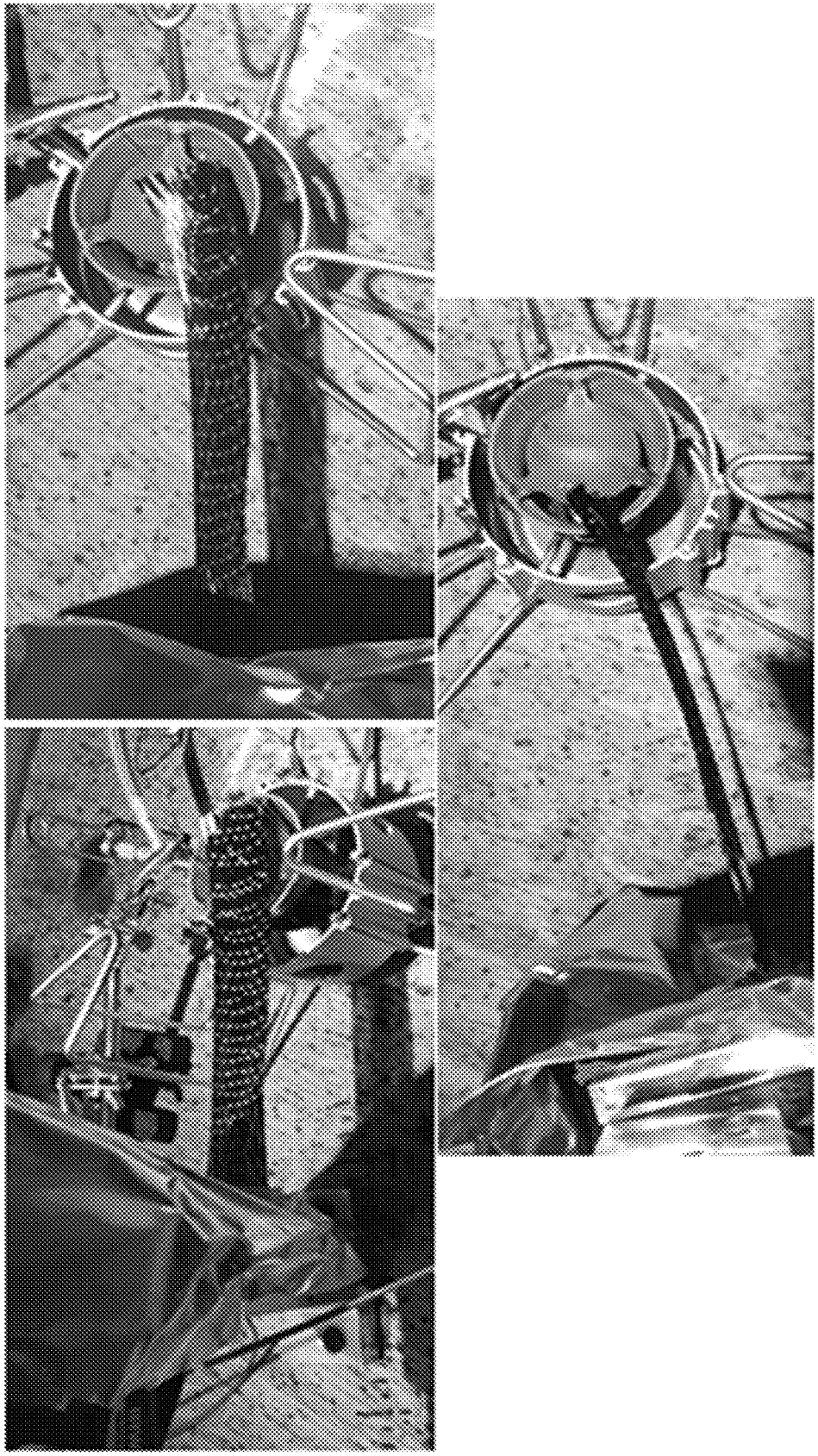
FIG. 40 is a series of photographs showing tests used to compare different configuration of fins over the flame of a stove. (Top left) The fin is placed horizontally in flame. (Top right) The fin is place diagonally in the flame. (Bottom) The fin is place vertically in the flame.

FIG. 40 shows tests used to compare different configuration of fins over the flame of a stove. In the top left, the fin is placed horizontally in flame. As shown in the top right, the fin is place diagonally in the flame. As shown in the bottom photograph, the fin is placed vertically in the flame. The average temperature of the flame was set at 860° C. Table 8 shows the results of these tests.

TABLE 8

| Length of fin exposed to flame (in.) | Configuration of Fin | Average Temp of Fin end (° C.) |
|---|---|---|
| 0.25 | Horizontal | 29.80 |
|  | Diagonal | 32.70 |
|  | Vertical | 29.63 |
| 0.50 | Horizontal | 34.83 |
|  | Diagonal | 37.60 |
|  | Vertical | 33.43 |
| 1.00 | Horizontal | 44.47 |
|  | Diagonal | 44.80 |
|  | Vertical | 39.77 |

As seen in Table 8, the horizontal and diagonal orientation of the fins have the best overall performance as compared to the vertical configuration. This is most likely due to the fact that a vertical configure has the least amount of surface area in contact with the flame, while the diagonal and horizontal configurations have more contact.

Figure 41:
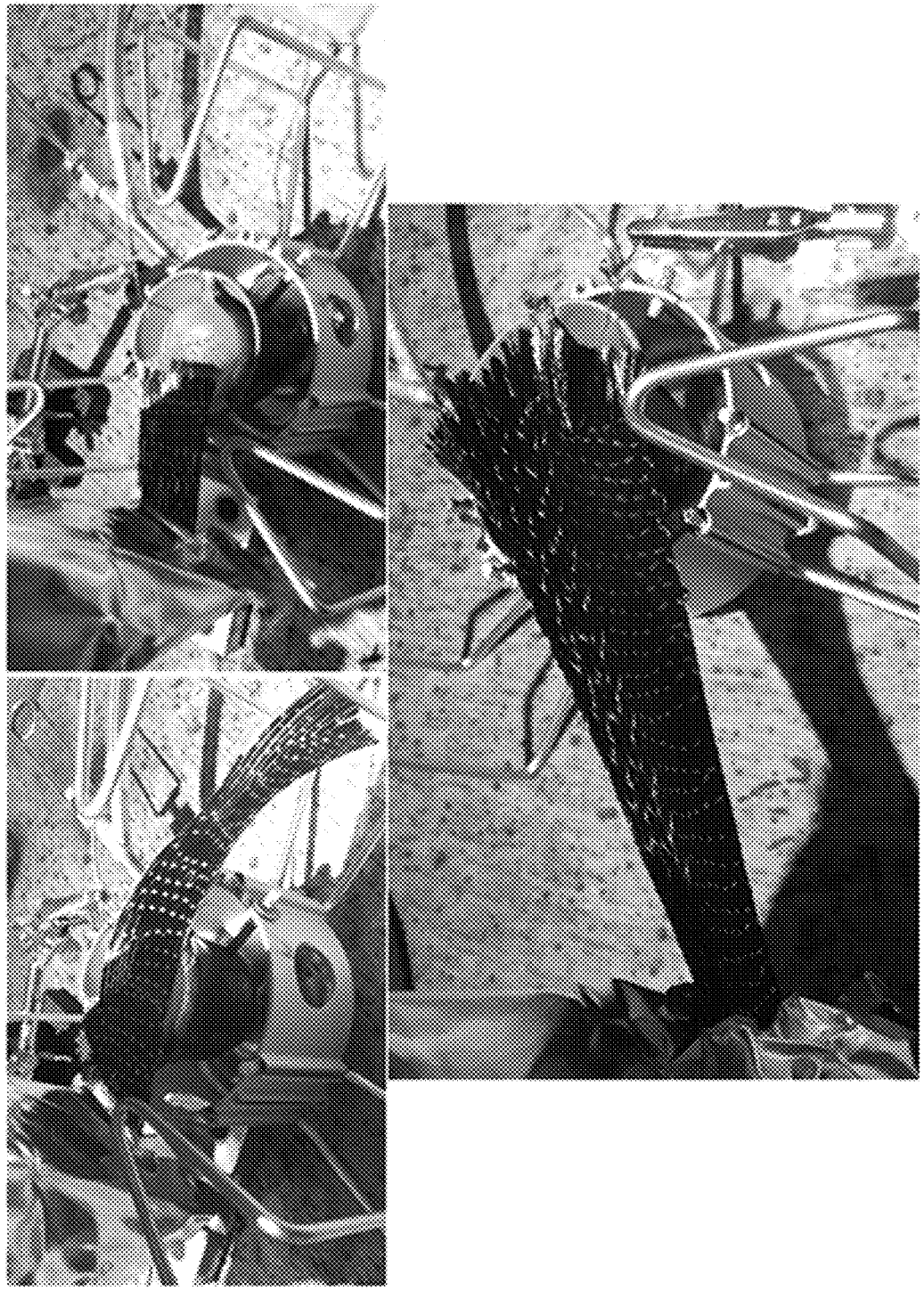
FIG. 41 is a series of photographs showing tests used to measure the temperature of the opposite end of the fin from the flame at varying distances. (Top left) A 6 inch, one layer fin is moved over flame, starting at 0.0 inches, in quarter inch increments and ends at 5.0 inches in the flame. (Top right) A 6 inch, one layer fin is placed 1" into the flame and cut in quarter inch increments. (Bottom) A 6 inch, 13 layer fin is moved over flame, starting at 0.0 inches, in quarter inch increments and ends at 2.0 inches in the flame.

FIG. 41 is a series of photographs showing tests used to measure the temperature of the opposite end of the fin from the flame at varying distances. In the top left, a 6 inch, one layer fin is moved over the flame, starting at 0.0 inches, in quarter inch increments and ends at 5.0 inches in the flame. In the top right, a 6 inch, one layer fin is placed 1" into the flame and cut in quarter inch increments. In the bottom, a 6 inch, 13 layer fin is moved over flame, starting at 0.0 inches, in quarter inch increments and ends at 2.0 inches in the flame.

Figure 42:
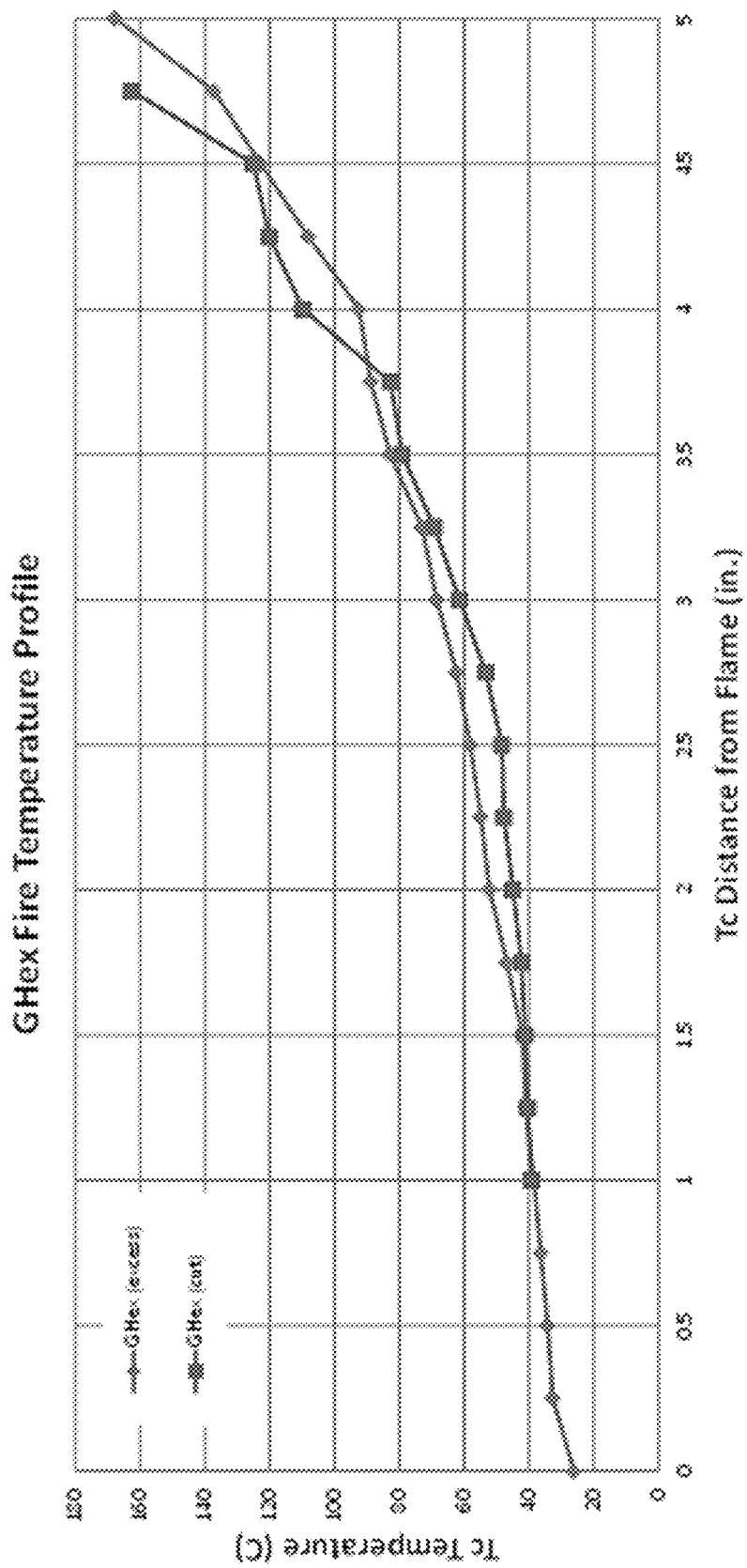
FIG. 42 is a graph showing the comparison of the temperature of the opposite end of the fin ("Tc") between a fin that is kept at 6.0 inches and moved across the flame, and a fin that is cut while keeping 1.0 inch of fin in the flame at all times.

For this test, two comparisons were made. First, the top left and right fins from FIG. 41 were compared to see the effect of moving the fin over the flame until it is approximately 1-2 inches away from the opposite end, with excess fin on the other side, as opposed to cutting the fin shorter while keeping the amount of graphite exposed to flame constant. FIG. 42 shows the results of this comparison. Basically, there is not much difference between the two configurations as far as thermal performance is concerned. So long as the distance from the point of contact with the flame to the interface of the TEG is kept consistent, it will not matter of there is an excess of fin. For the sake of minimizing weight, however, the fins should be kept short on the fire side.

Figure 43:
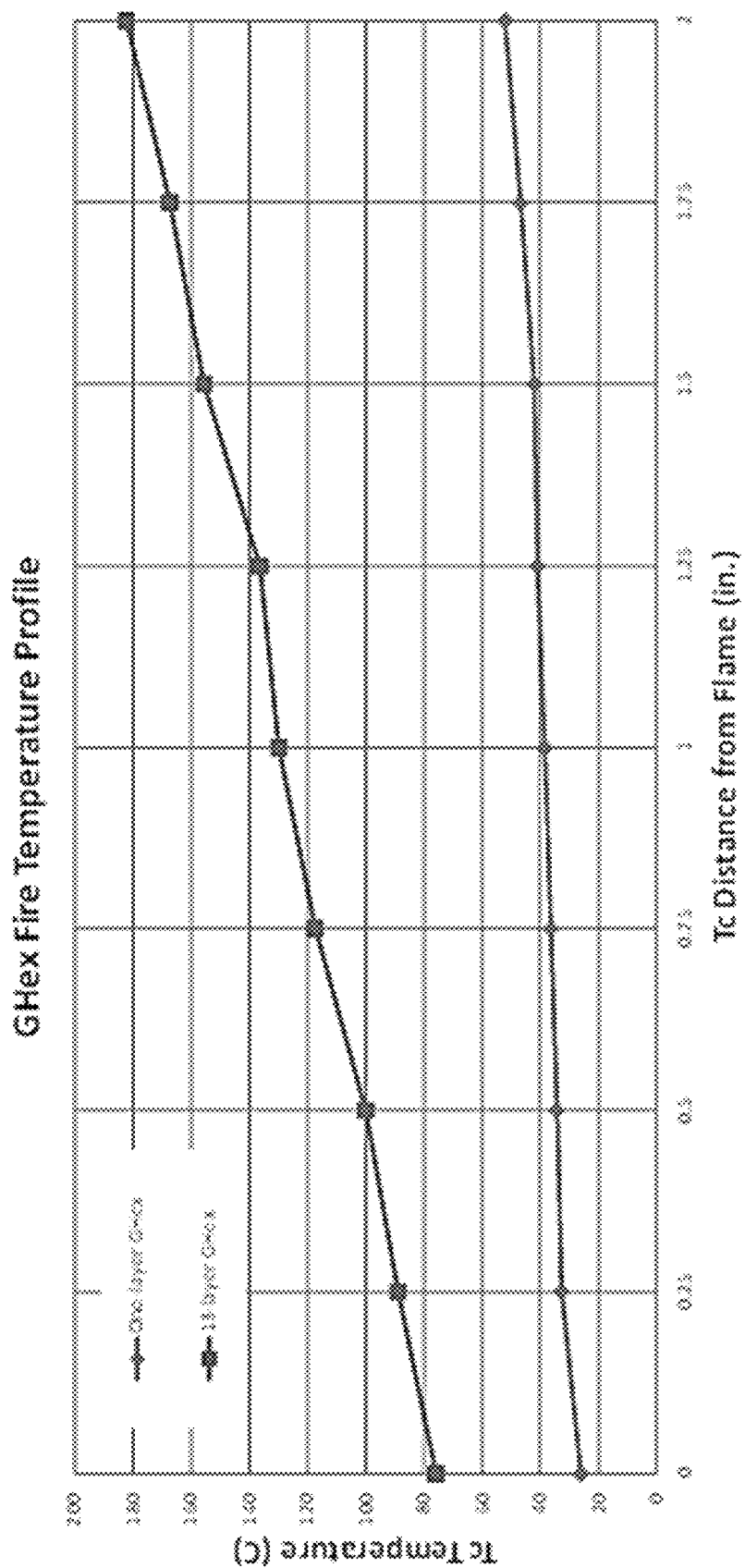
FIG. 43 is a graph showing the comparison of the temperature of the opposite end of the fin ("Tc") between a one-layer fin and a 13-layer fin.

The next comparison was between the temperatures of the opposite end of the fin from the flame between a one layer fin and a 13 layer fin. As seen in FIG. 43, a one layer fin was able to generate a cooler temperature at the end opposite of the flame (i.e., had a greater temperature gradient) than the 13 layer fin.

Figure 44:
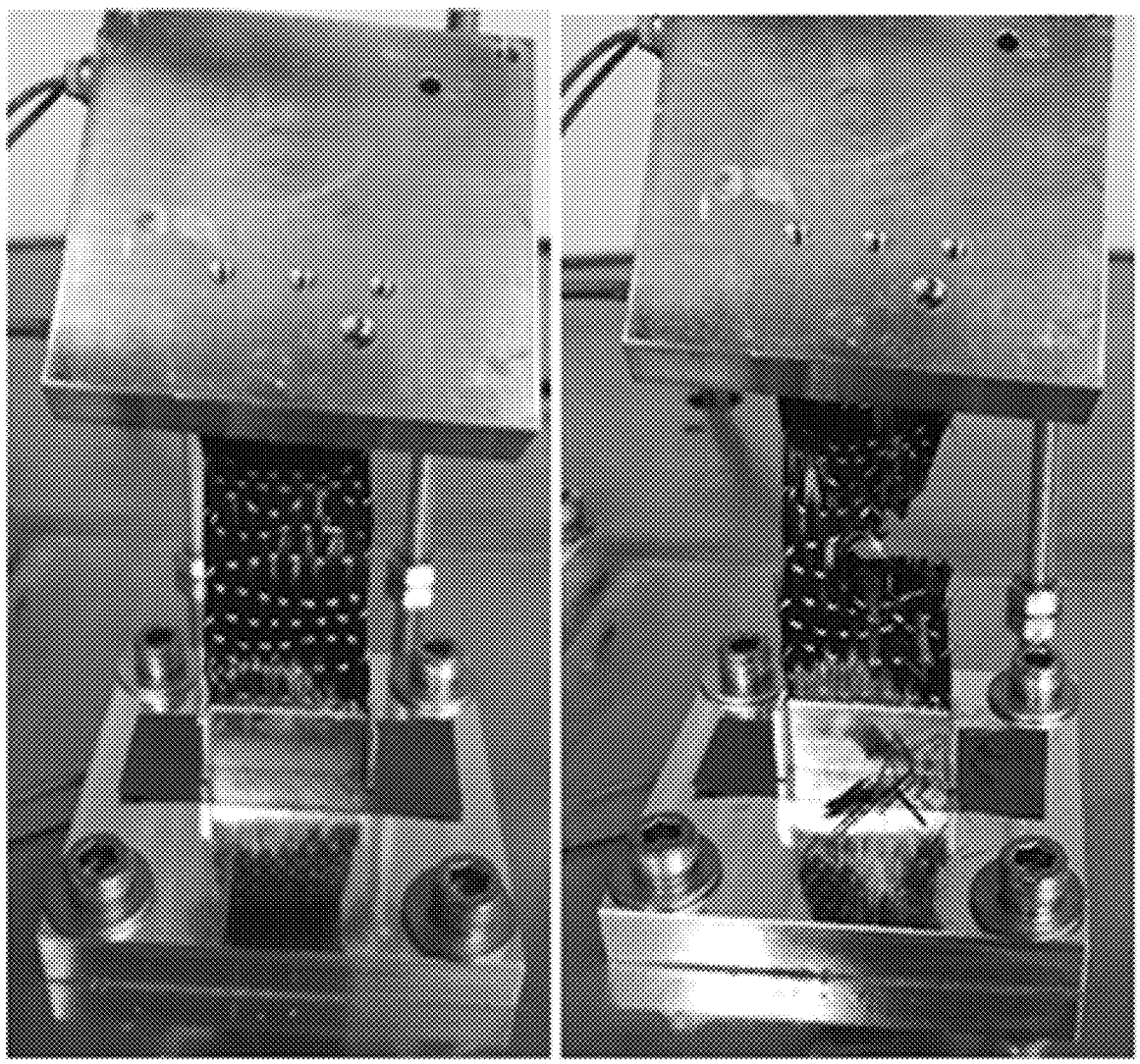
FIG. 44 is a series of photographs of woven graphite sample straps used to test the ability of the straps to conduct heat when damaged. (Left) A breadboard GHex™ sample strap bolted into a heat block and a sink block to accurately measure the conductivity of the strap at 0.66 W/K. (Right) A breadboard sample strap cut in half (7 of 15 strands cut) and tested for conductance under similar conditions.

To test the performance durability of the straps, a sample strap was bolted into a test block, containing imbedded thermocouples, and tested for conductance both inside and outside of a vacuum chamber. Then the fibers of the straps were cut (as shown in FIG. 44), one strand at a time, and tested after each cut to analyze the effect that breakage of the fibers will have on performance.

It was observed that the hot side temperature of the strap was at 330.6 K when tested inside the vacuum chamber, and decreased to 314.0 K when tested in ambient conditions. This is due to the introduction of heat loss due to convection off of the graphite fibers when tested outside of vacuum (there is no heat loss due to convection when under vacuum). The total heat loss for the strap under vacuum was calculated at 0.107 W as compared to 1.18 W when tested in ambient. The total heat loss includes losses in thermocouple and heater wires and radiation losses off of the graphite and the heater block in both cases, with the addition of losses due to convection off of the heater block and the graphite. The heat loss due to convection off of the graphite came to 0.163 W for an area of GHex™ of 6.00 square inches.

Figure 45:
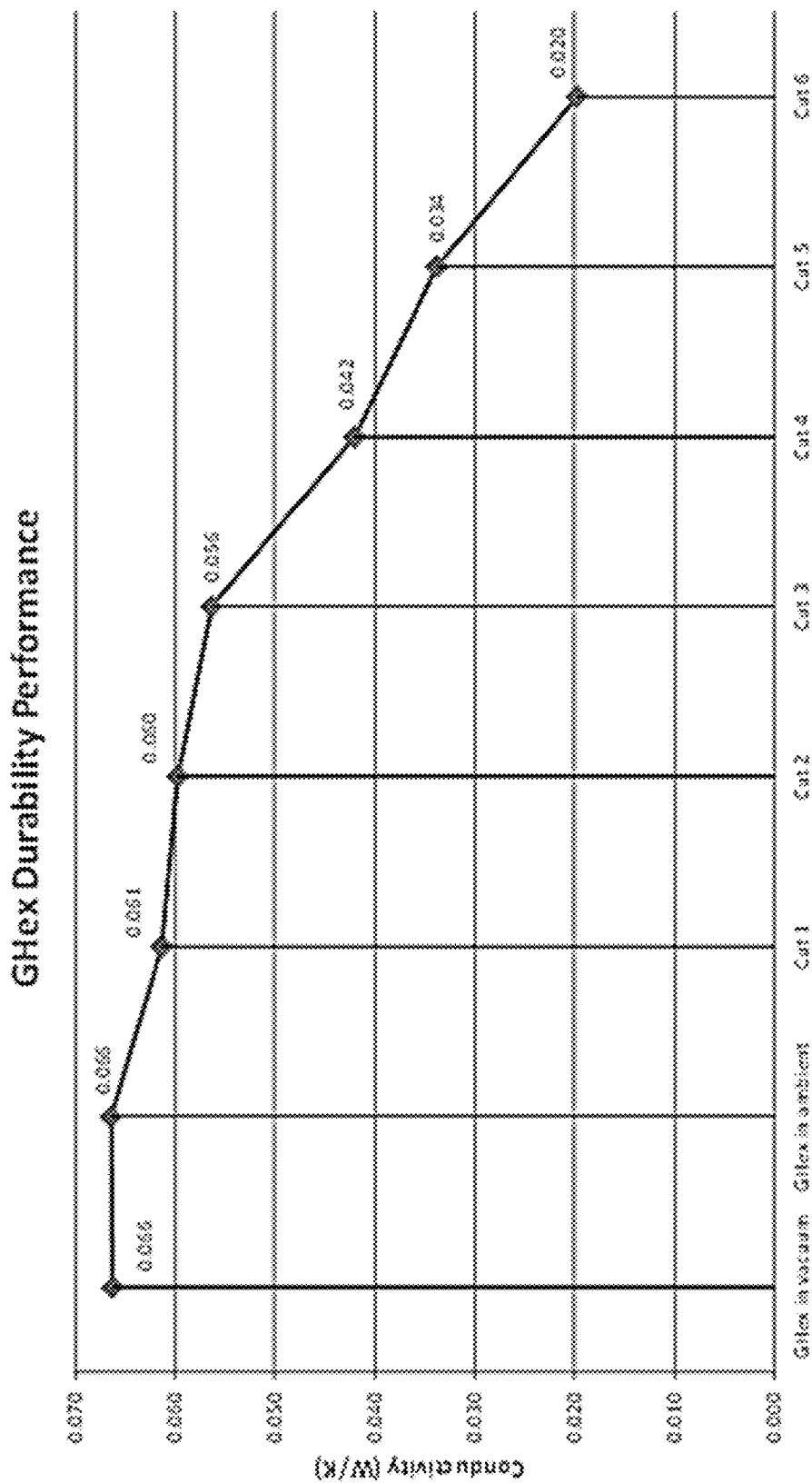
FIG. 45 is a graph showing results of durability testing on the breadboard GHex™ strap. The conductivity of the strap was measured when the following cuts were made: Cut 1=one strand, Cut 2=two strands, Cut 3=one strand, Cut 4=two strands (cut halfway through), Cut 5=three strands, Cut 6=four strands (severed completely).

As seen in FIG. 45, there was a small drop off in performance from Cut 1 to Cut 3, and then rapidly decreases after Cut 4 when the fibers have been cut halfway through. This shows that breakage of fibers will have an impact on overall performance of the fins, though a small amount of breakage will only result in a small change.

Example 6—Fin Temperature and Power Performance

Figure 46:
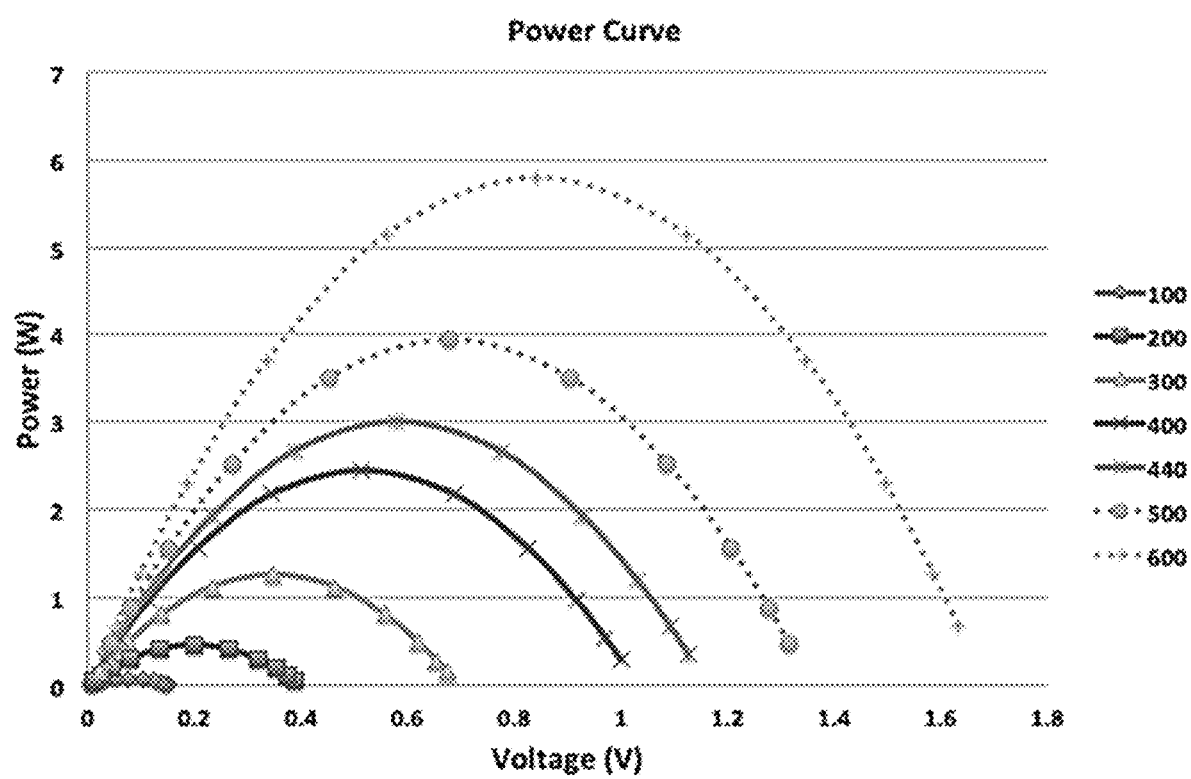
FIG. 46 is a power curve of a single TEG assuming a cold side temperature of 25° C. Performance is verified with testing at a hot side temperature of 440° C. The performance for higher or lower hot side temperature is extrapolated.

The examples used herein typically used a TEG having a temperature rating up to 600° C. and an efficiency of up to 10% in ideal conditions. Designs having a total of 24 TEG modules would give a theoretical power output of 72 Watts (assuming hot side temperature at 440° C. and cold side at 25° C.). The power curve for the TEG is shown below in FIG. 46.

Figure 47:
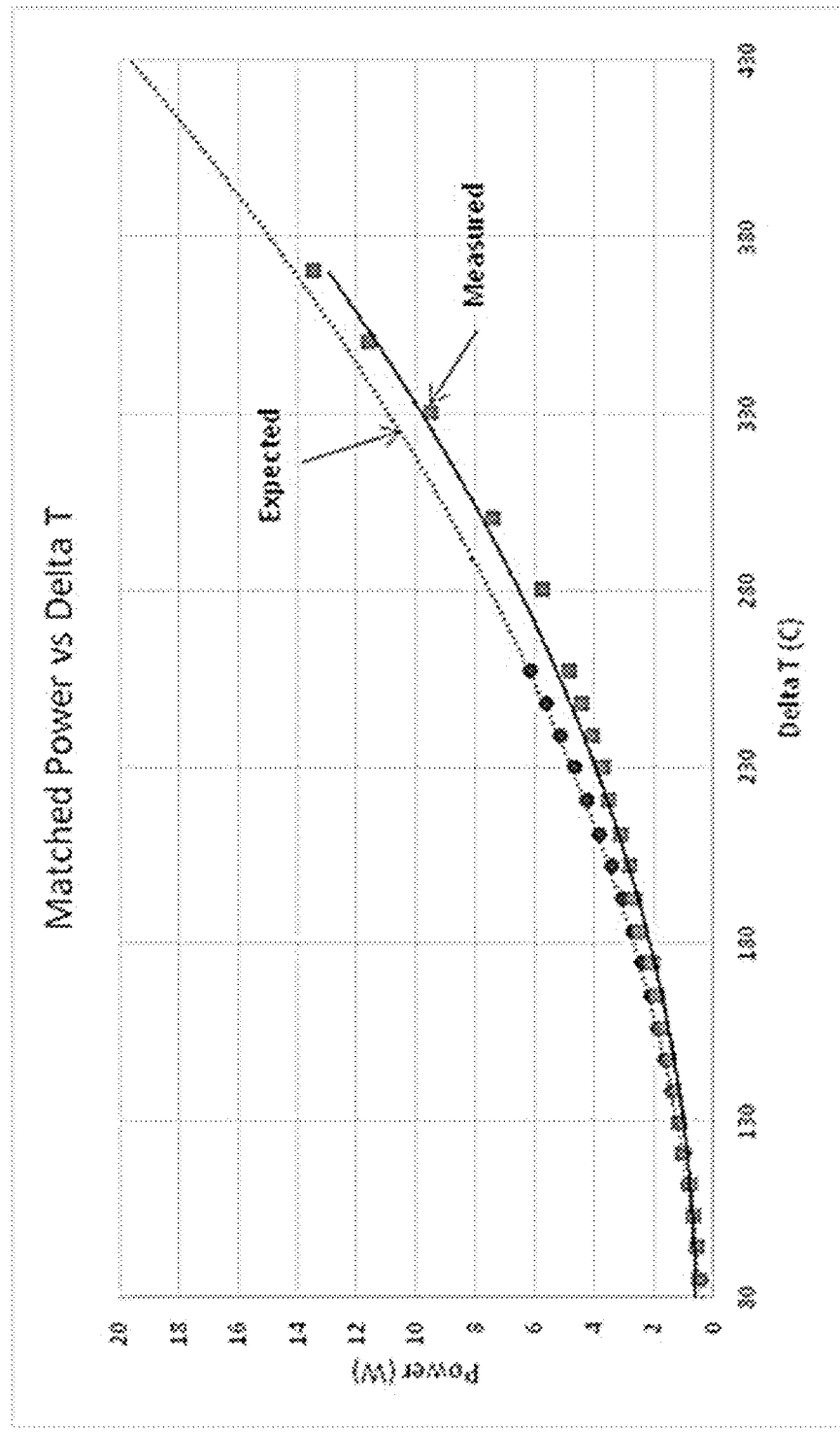
FIG. 47 is a plot of ΔT versus power output of one strip of 6 TEGs modules.

A set of TEG modules were tested to see how the actual performance compared to the theoretical performance (see FIG. 47). The test unit was populated with 4 strips of 6 modules (24 total). These 4 strips used modules that we consider below standard (<85% performance to data sheet). Three of the strips were used as "dummies" just to achieve thermal transfer balance and one of the strips as the target for measurements. The modules in the targeted strip had a collective power performance ratio of 81% to datasheet under typical test conditions (300° C. hot, 25° C. cold). With that reference point in mind, the tester was set to allow hot side temperature to go up to 400° C. No restriction was placed on the cold side temperature. The open circuit voltage (VOC) and short circuit current (ISC) were measured, and the ideal and matched power were calculated.

At 400° C. hot side temperature cold side temperature rose to ~100° C. reaching ~300° C. in ΔT. Ideal and matched power generated from this single strip were 28.4 watts and 7.9 watts, respectively. This was better than expected, likely due to elevated cold side temps. Based on the referenced 81% performance ratio, 6.5 to 7.0 watts of matched power was expected at 300° C. ΔT. Again, this represents power output from only one of four strips. It was expected that final test results from "good" modules would collectively show the unit to produce matched power output of ~40 watts at ~300° C. ΔT and ~60 watts at ~400° C. ΔT.

The unit was pushed to 420° C. hot and 50° C. cold and the power output measured within 5% of the expected value. The empirical data projects achieving 54 watts from the unit at 370° C. delta-T or 34 watts per kg, aligned with targets of 40 W/kg at 400° C. delta-T and 65 W/kg at 500° C. delta-T. This particular S6 lagged behind the expected values at lower temperatures but caught up as the temperatures increased.

Figure 48:
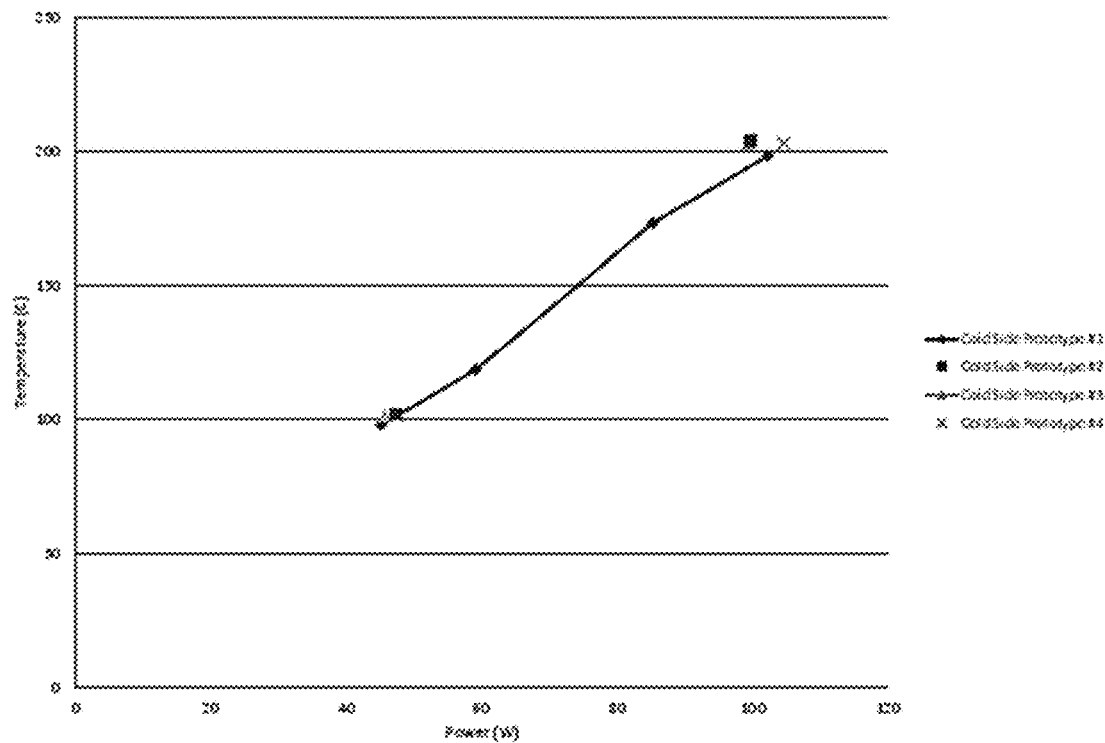
FIG. 48 is a couple of graphs showing the power dump of cold side unit fins versus set temperature (top), and the power dump of hot side unit fins versus set temperature (bottom).
Figure 48:
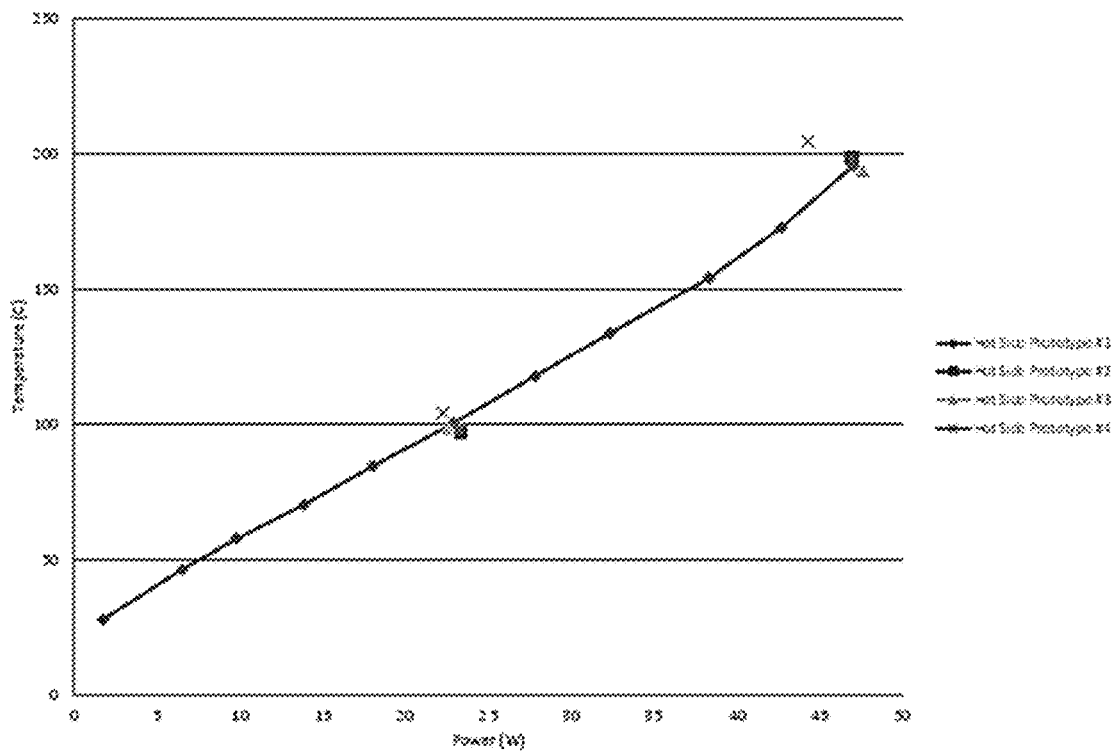

The performance of the hot side fins and cold side fins to transfer heat were also tested and the results are shown in FIG. 48. To begin with, the cold side temperature on the TEG inside the unit was put to 177° C. and the hot side temperature on the TEG inside the unit at 275° C. The cold side temperature was 151° C. on the aluminum block outside the unit, 148° C. at the base of the strips, and 63° C. at the tip of the fins.

As seen from the data in FIG. 48 (top), one group of cold side fins (12 fins per group) dumped about 47 W of heat at 100° C. and 102 W at 200° C. To compare the results with results from a previous thermal model, this data was extrapolated assuming the heat source temperature is at 150° C., giving a power output of 298 W from 4 groups of fins. This correlates to 1.6 W per strip. As seen from the data in FIG. 48 (bottom), the hot side fins (4 fins per group) transferred about 24 W of heat at 100° C. and 46 W at 200° C. Because the hot side fin group contained 4 fins per group, as opposed to 12 fins per group), the hot side fins showed a higher efficiency of thermal transfer per fin. This might be caused by a greater distance between fins increasing the transfer of heat to the air.

Example 7—Thermal Modeling of Different Configurations

Figure 49:
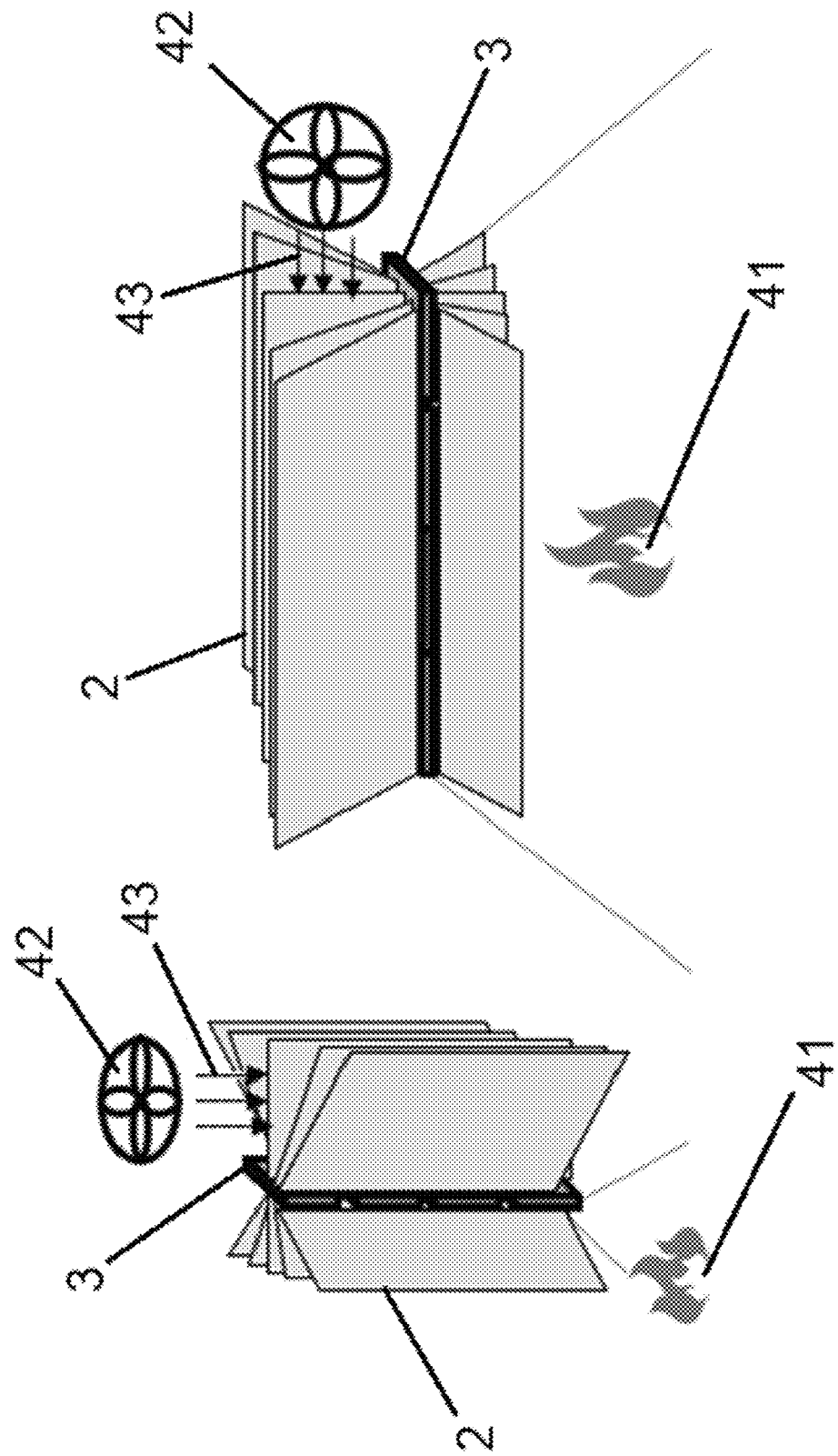
FIG. 49 is an illustration of an exemplary graphite woven cloth (GWC) heat exchanger system in a "book" configuration (left) and "tent" configuration (right).

The two configurations, a "book" and "tent" configuration (see FIG. 49), were compared together in three different TEG/Fan forms. In these configurations, a heat exchanger as generally illustrated in FIG. 8 is placed over a heat source 41 in a vertical ("book") or horizontal ("tent") orientation, and a fan 42 is optionally used to push air 43 through the carbon fiber sheets 2. Different forms varying in the number of TEGS and whether the fan was used were analyzed for each configuration. The first of the forms show power output and power density when there is Form (1): 4 TEGS, No Fan to move air over the fins. The second form uses Form (2): 2 TEGS and a Fan, while the third uses Form (3): 3 TEGS and a Fan.

Figure 50:
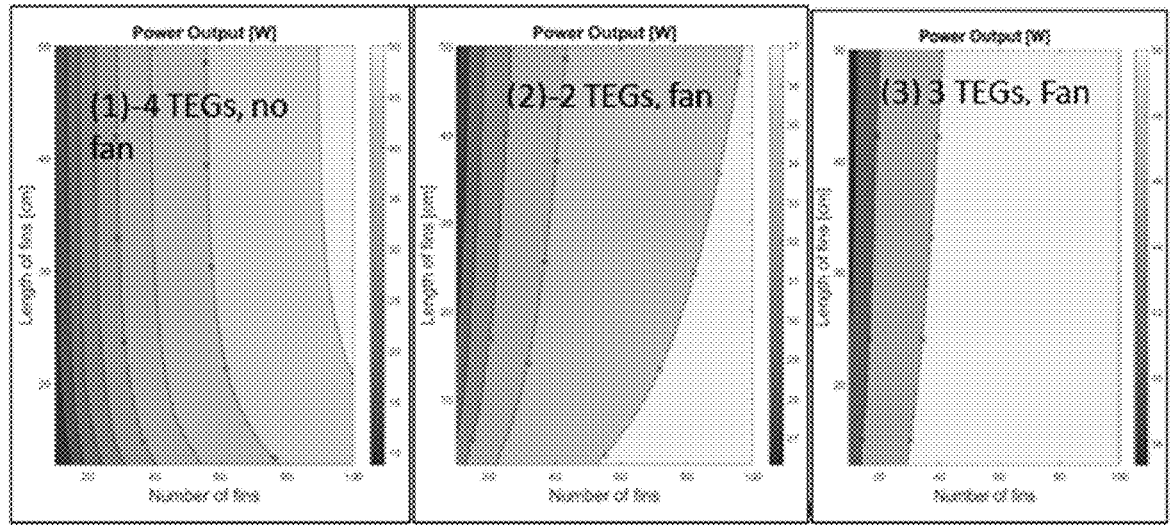
FIG. 50 is a series of graphs showing the power output (top) and power density (bottom) of exemplary heat exchanger systems in a book configuration having: 4 TEGs but no fan (left), 2 TEGs and a fan (center), and 3 TEGs and a fan (right).
Figure 50:
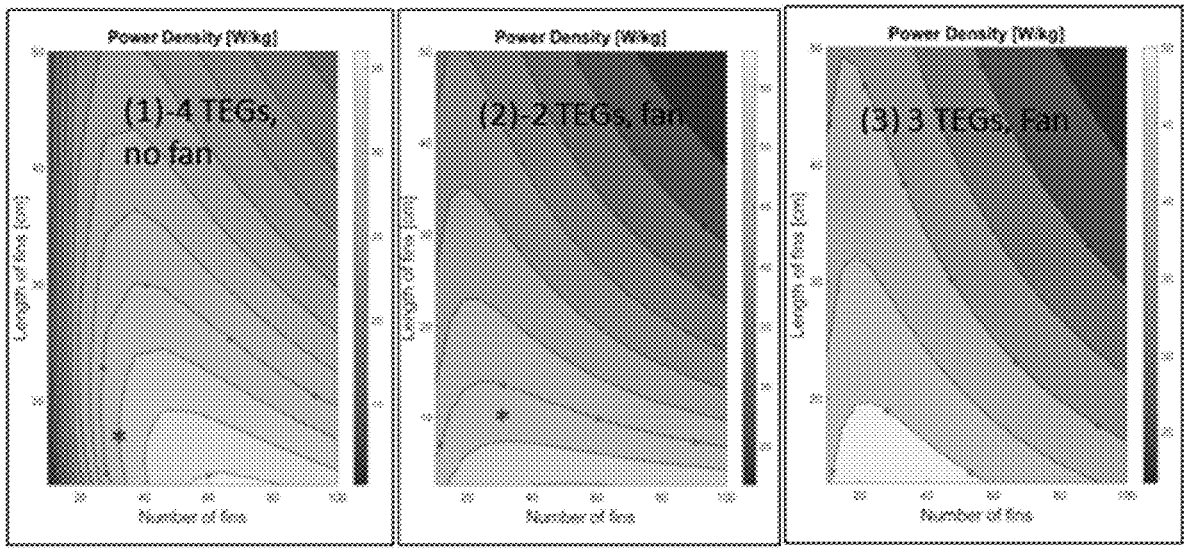
Figure 51:
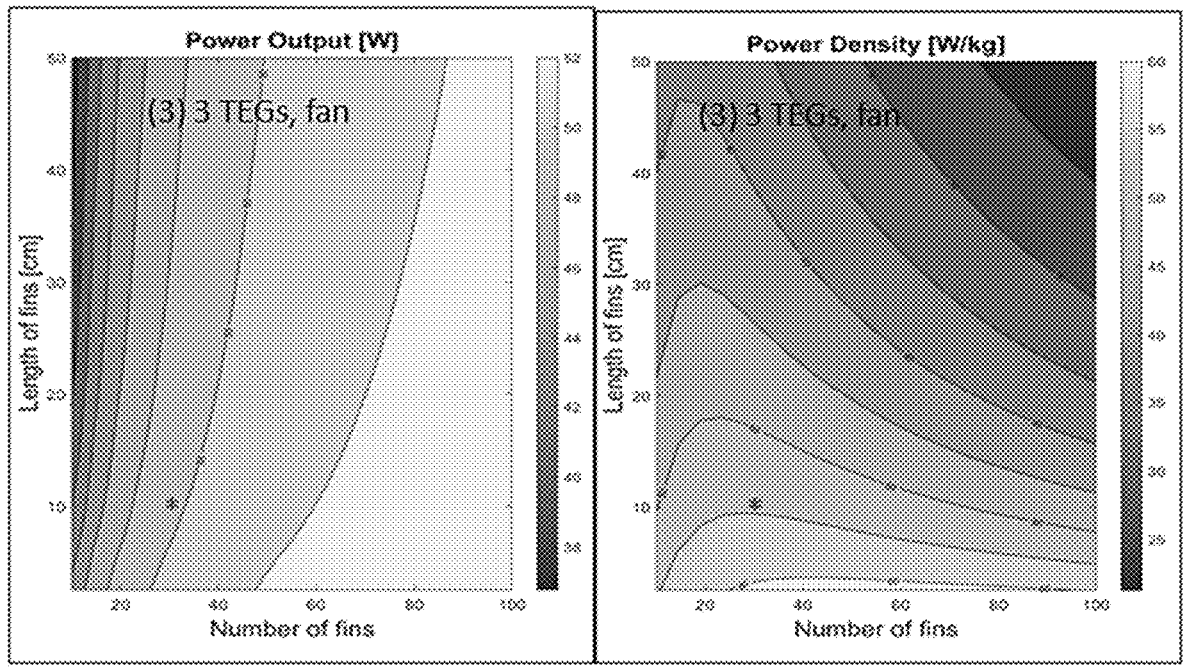
FIG. 51 is a series of graphs showing the power output and power density of exemplary heat exchanger systems in a tent configuration having 3 TEGs and a fan.
Figure 51:
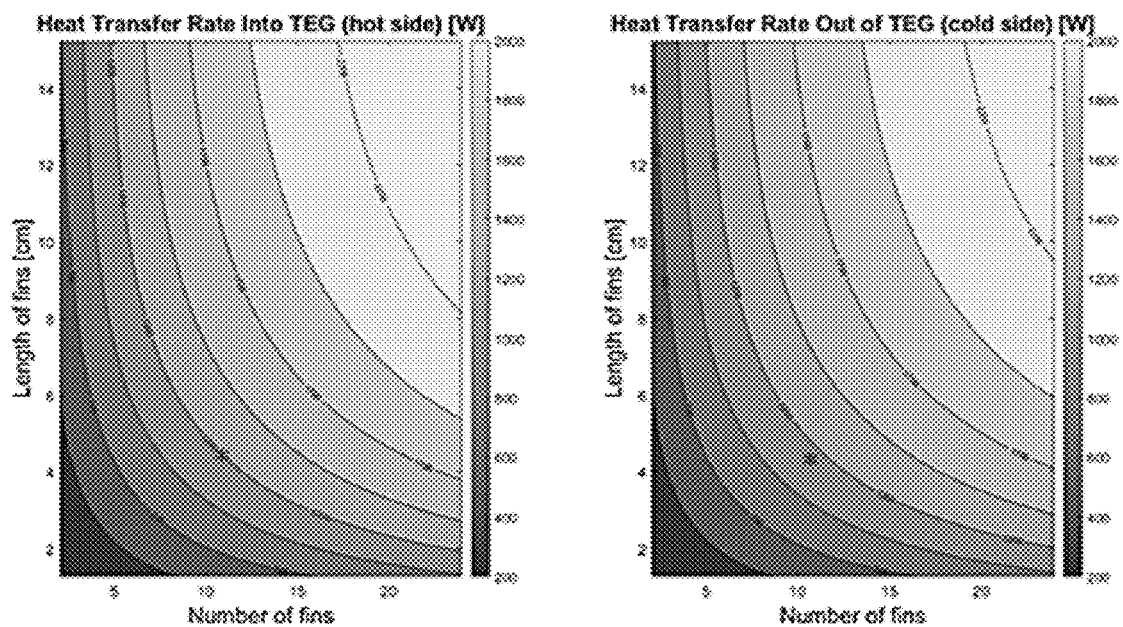

The results of the thermal model analysis can be seen in FIGS. 50 and 51. The "book" is used to illustrate a side-by-side comparison of Form (1), (2) and (3). The model developed in FIGS. 50 and 51 was for a module made of a 1×4 TEG array; however the module used in this experiment was a 2×2 TEG array so the graph results from the 1×4 TEG module were translated into a 2×2 TEG module.

Thus, a point at 30 fins by 10 cm long on the 1×4 TEG array on the graphs is equivalent to 60 fins by 10 cm long on the 2×2 TEG array. This point is marked with a star on each of the graphs. Table 9 below summarizes the results of the thermal models. When these points are compared it is clear that using a complementary form of heat transfer, in this case, forced air convection (a fan), obtains better results overall. The "book" versus "tent" configurations are similar except for the power output for 2 TEGs, 1 fan configuration.

TABLE 9

Summary of the model outputs with 60 fins by 10 cm long fins as a cold side heat exchanger.

| Model | Power Output (W) | | Power Density (W/kg) | |
|---|---|---|---|---|
| Configuration | "Book" | "Tent" | "Book" | "Tent" |
| 4 TEGs, No fan | 35 | 25 | 33 | 25 |
| 2 TEGs, 1 fan | 35 | 33 | 50 | 50 |
| 3 TEGs, 1 fan | 50 | 50 | 50 | 55 |

The graph (tent configuration with a fan) in FIG. 51 (top, right) shows a design that would achieve 60 W/kg. The lighter area near the bottom of the power density graph is the region that shows the combination of length and number of fins that would result in the 60 W/kg. The length at this point can be estimated at 5 centimeters (or about 2 inches), and the number of fins at about 40. Each fin is 0.0125 thick, which means that 40 of the fins span a distance approximately 0.5 inches wide. The TEG used in conjunction with this configuration would be approximately 2.2 inches square. Thus, there is plenty of room to attach 2 to 3 end fittings containing the GWC to the TEG housing.

The feasibility that the GWC model will transport 700 watts of heat through the GWC heat exchanger system is demonstrated in FIG. 51 (bottom two graphs). The GWC heat exchanger must transport 700 W thru the TEG to get 35 watts of electrical power assuming the TEG has a conversion efficiency of 5%.

The thermal analysis model shows that much more heat than 700W can be transported using the GWC heat exchanger. FIG. 51 shows the different number of fins and the length of the fins that can meet the transport requirements of a set of TEG efficiency and an amount of output GWC heat exchanger. For each hot side heat exchanger, the cold side heat exchanger has 30 fins that are 12 inches, each shown with a star (*). An input heat of 1126 W and an output heat of 1192 W is required. In this case the TEG efficiency is 2.87%, which is based off of the Seebeck TEG specifications for a specific hot (305 C) and cold (104 C) side temperature. This means that the input heat needs to be 1226 watts (1226 watts times 2.87%=35.2 electrical watts). Thus, the output (cold) side needs to dump 1191 watts to the atmosphere. Form (1), 4 TEGs, No Fan "book" configuration was used to demonstrate this. Looking at FIG. 51 and locating 1226W on the Heat In graph (bottom, left) near the 1200W gradient line, a 5 cm length (2 inches) was chosen which indicates that 11 fins on the hot side of the heat exchanger are required to move the heat. The same process on the Heat Out graph (bottom, right) and locating 1192 watt point at 5 cm also yields 11 fins for the hot side. This system is capable of moving more than 700W.

An initial mechanical design for the modules was based on the following post-GWC thermal test model iteration criterion:

4 TEGs with 35 W generation without a fan were selected (see Table 9).

A transitional aluminum interface is used between TEG and woven graphite fins. This is for a better thermal contact between the surface of the TEG and the graphite.

Hot side and cold side end fittings hold the woven graphite in very close contact with the transitional aluminum part and binds the many fins together for connection to the aluminum.

A protective shock case houses the TEGs and wiring. This is a fiberglass outer covering to prevent shock damage to the TEGs in case they are dropped.

Figure 28:
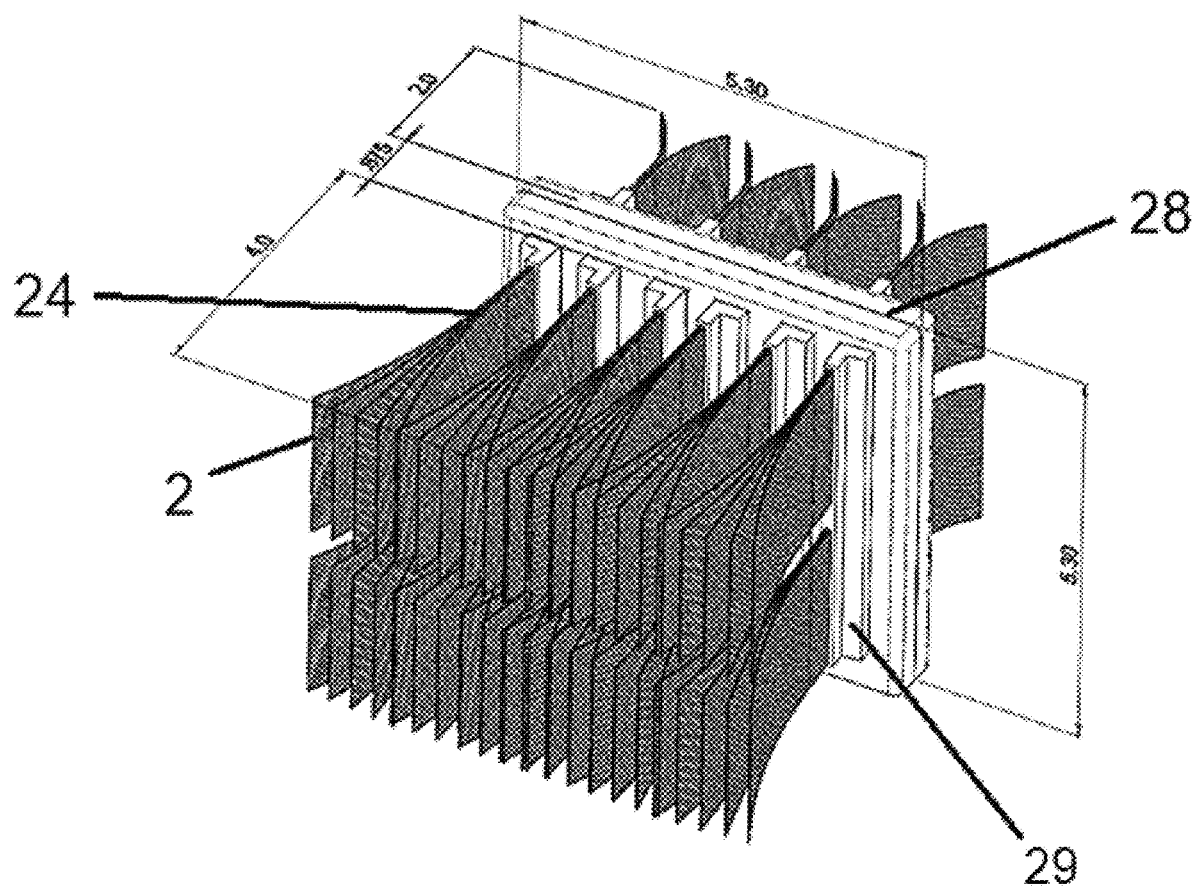
FIG. 28 is an illustration of an exemplary heat exchanger system design having a square arrangement of 2×2 TEGs. This designs will generate 35 watts without a fan. Fins per row are twice that shown (i.e. cold side 30 fins represents 60 fins).

The weight estimate was 1189 grams (2.6 lbs) for the assembly as shown in FIG. 28. This weight was calculated using the equations in the design CAD program for aluminum and fiberglass and based on the sizes of these components:

Cold strap end fittings and fins—300 g

Hot side end fittings and fins—108 g

The protective shock fiberglass case (contains the TEGs)—150 g

Transitional aluminum thermal interface on the hot side—206 g

Transitional aluminum thermal interface on the cold side of the TEGs—233 g

Each TEG shown is 48 g (×4 TEGs)—192 g.

The 2.6 lb. module is not optimized for maximum power density. Decreasing the weight of the design will increase the power density. Following FIG. 51 (top), reducing the number of TEGs to three (down from four) reduces the length of the fins from 4 inches to 2 inches, and changes the number of fins to 40. This increases the power density to 60 W/kg up from 33 w/kg. There is also an increase in watts per module from 35 W to 50 W. This decreases the weight by 48 grams with 1 less TEG and decrease the mass of the structure by approximately 25% of the design weight of 1189 grams, making a reduction of 297 grams. This decrease in mass (and the fin efficiency changes above) would increase the power density from 33 W/kg in FIGS. 28 to 60 W/kg in a redesigned module.

Figure 29:
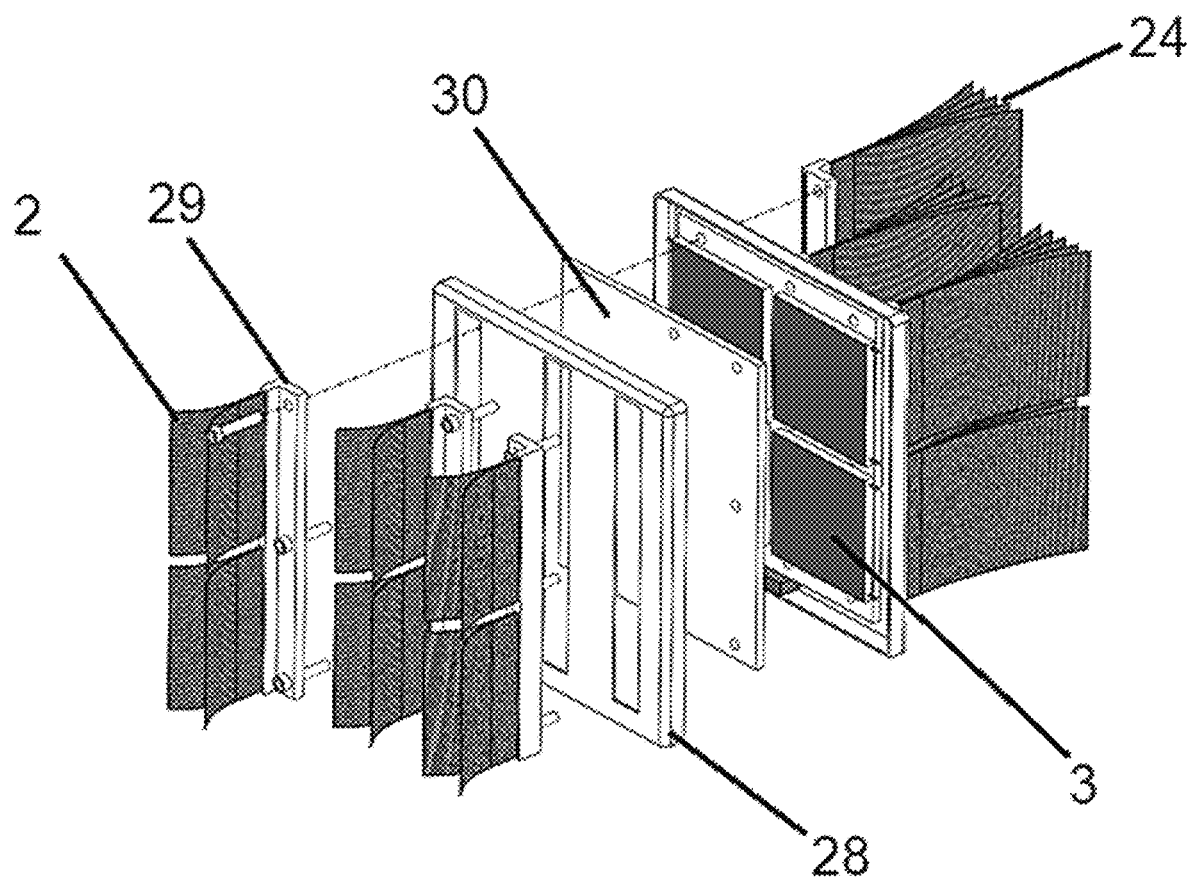
FIG. 29 is an illustration of an assembly process of the heat exchanger system of FIG. 28.

To construct the above module, traditional end fittings 29 are bolted thru two aluminum plate 30 interfaces on opposite sides of the TEGs 3 as shown in FIG. 29. The aluminum interface 30 material is mated against the 4 TEGs 3 on both sides of the TEGs. A low conductivity stainless steel bolt with a thermally non-conductive washer isolating the hot and cold sides from each other is used to hold the assembly together by running it thru holes in the interface material and thru holes in the TEG and screwed into the end fitting on the other side. Washers that are not thermally conductive will separate the bolts from the aluminum plate. These bolts will be approximately 2 inches apart. Thus, in a 2×2 TEG array, 3 bolts per end fitting are needed for 3 end fittings on each side. This bolt system enables the aluminum plate to be pressured to an adequate amount to establish good thermal contact with the TEG. This allows the TEG and the heat exchanger to be taken apart in the field so that parts can be interchanged.

Example 8—Side-Mounted and End-Mounted Configurations

Figure 52:
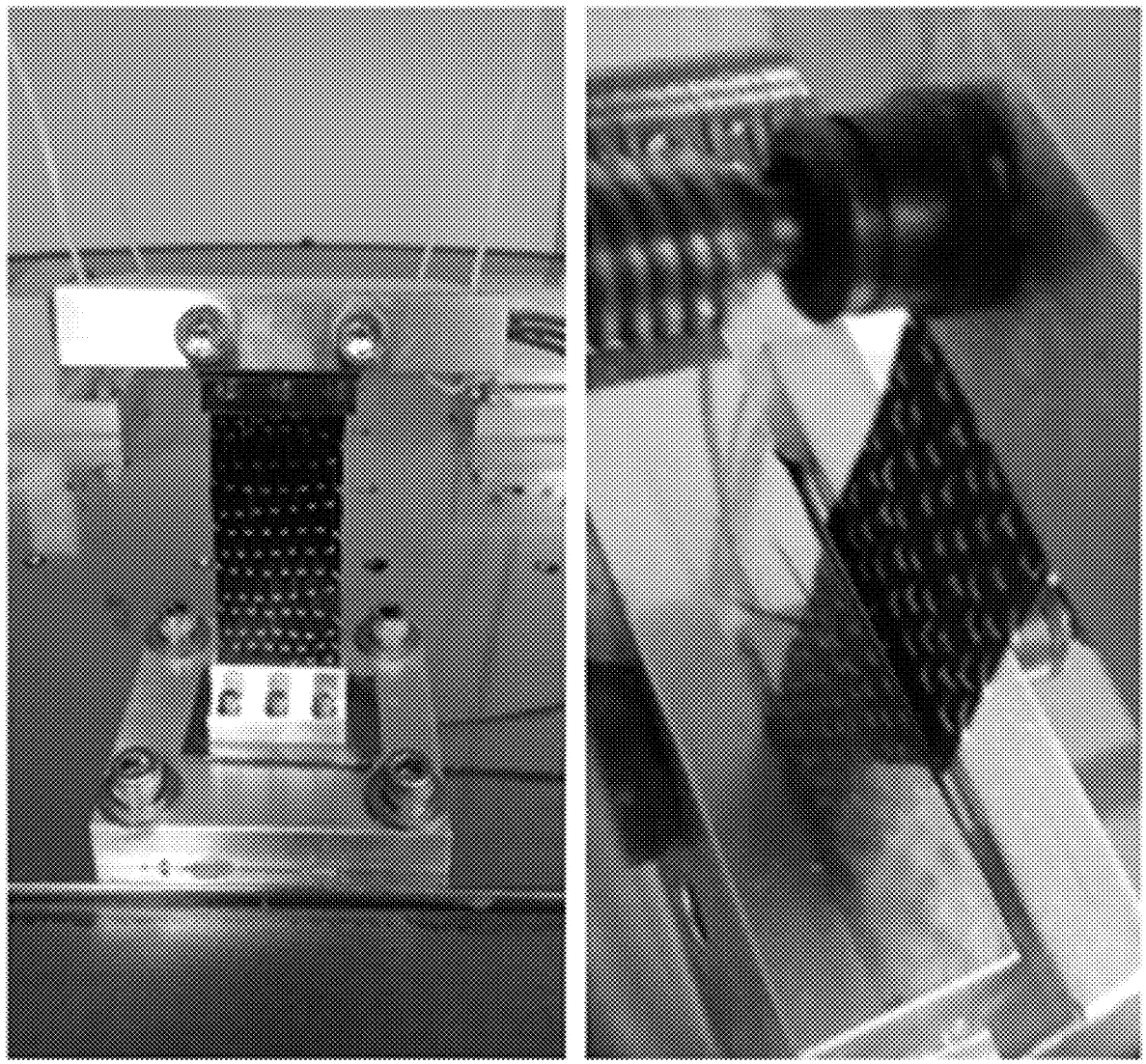
FIG. 52 displays photographs test set-ups of the end-mounted strap (left) and the side mounted strap (right).

Two single layer breadboard straps were made; one in the standard end-mounted configuration (see FIG. 52, right) and one in a side-mounted configuration (see FIG. 52, left). The end-mounted strap places the graphite fibers perpendicular to the heat source and the fibers are in direct contact with the heat source to minimize thermal resistances at the interface contacts. The data from this strap was compared to the data from the 2-layer breadboard strap to find any efficiency losses. The conductance of the single layer strap was 0.033 W/m-K, half of that of the 2-layer strap, as expected. This data was also compared to the side-mounted strap.

The side-mounted strap was assembled with the last 0.5 inches of the graphite fibers sandwiched and epoxied between two thin aluminum plates. In this configuration, the fibers are parallel to the heat source and separated by a thin aluminum plate. The conductance of this configuration came out at 0.066 W/m-K, much higher than expected. It is believed this is due to the thin aluminum plates used, cutting down the resistance losses due to a thick end fitting configuration.

Four new straps were then assembled and tested in order to confirm the results seen with the side mounted straps. The tested straps were configured as follows: one 4-layer side mounted (SM) strap, one 4-layer end mount (EM) strap, one 12-layer SM strap, and one 12-layer EM strap.

In addition, two more 4-layer SM straps, with the ends of the each GHex™ sheet spaced at 3.5 mm and 7 mm from each other ("staggered") in the fittings, were made and tested to see if there would be any performance improvements. The "staggered" results row in the table is for a thermal connection configuration that puts a single layer of Ghex in direct contact with the aluminum thermal connection to reduce the thermal resistance of heat movement thru multiple layers of Ghex. The distance of 3.5 mm is the amount of single layer Ghex that is in direct contact. The results are outline below in Table 10 below.

TABLE 10

Conductance testing results of SM and EM GHex ™ straps.

| Strap | C (W/K) |
|---|---|
| 4-layer, EM | 0.110 |
| 4-layer, SM | 0.147 |
| 12-layer, EM | 0.227 |
| 12-layer, SM | 0.184 |
| 4-layer, SM, 3.5 mm staggered | 0.156 |
| 4-layer, SM, 7 mm staggered | 0.201 |

Though the 4-layer SM strap performed better than the 4-layer EM strap, similar to the 1-layer versions, these results suggest that there are efficiency losses associated with the SM configuration when increasing the number of layers. When comparing the 1-layer, 4-layer, and 12-layer versions of the EM straps, there is approximately a 5% decrease in expected performance due to efficiency loss per sheet of GHex™ that is added to the assembly. The SM version may perform much better than the EM when there are fewer sheets, but the SM configuration experiences a much higher drop in efficiency of about 25% per layer of GHex™. This means that the SM configuration may become more ineffective as compared to the EM configuration as the number of layers is increased, as seen in Table 10 when comparing the data between the 12-layer EM and SM versions. However, the side mounted configuration can eliminate the need to remove the cold side fins in order to position the system within a confined space or to accommodate movement of the system, and so may provide necessary physical flexibility to the system.

Example 9—Coatings and Carbon Fiber Composites Using Resins

In certain embodiments, coatings and resins are applied to the carbon fiber sheets and woven cloths to provide improved durability to physical damage, protection from fire damage, conductivity, structural support, and/or other desired properties. For example, polymer resins are cured under heat and pressure to create a composite woven carbon fiber material with varying rigidity. Such materials can be molded to desired shapes. Alternatively, or in addition to such resins, thin coatings can be added to protect and improve the performance of the carbon fibers.

Coatings include, but are not limited to, boron nitride, especially hexagonal boron nitride. Boron nitride has high conductivity properties similar to that of graphite, and is often used as a thermal interface material. Such coatings can be applied using know deposition techniques, but are preferably applied using methods such as spraying or with a plasma type deposition chamber.

Carbon fiber reinforced composite materials are widely used in aerospace and commercial automotive applications for their light weight and high strength properties that make them the preferred structural material. The polymer resin and carbon fibers are laminated (i.e., cured under heat and pressure) to create a molded part that is completely encapsulated by the polymer resin which provides environmental resistance to environmental exposures as well as adds variable stiffness, impact, and wear resistance.

One resin that will be applied is the well characterized TRD-9 commercial epoxy resin that is widely used in defense and aerospace environments. The mechanical and environmental properties of the more traditional carbon composites are well known and widely published. Most of the laminating resins for defense, aerospace, and automotive applications use epoxy resins that are formulated for structural properties (e.g., strength, rigidity) at service temperatures below 180° C. A general purpose structural epoxy resin such as Fiberite 976 resin at 28-34% final resin content is also a potential useful candidate formulation. This system is generally laminated or cured using either an autoclave process or a vacuum bag oven cure process.

The thermal properties testing of carbon fiber composites have been focused on a thermal endurance under a 120° C. to 180° C. continuous operating temperatures and the effects of these temperatures on physical and structural properties. In the present application, a composite is needed that can withstand a temperature range from −40° C. to over 800° C. If the coatings or resins reduce thermal conductivity of the carbon fiber sheets, a modified or filled resin may be used to provide suitable thermal conductive properties. For example, a composite resin may be filled as much as 10% by volume to increase thermal conductivity by the addition of graphite flake or powder or short fiber of the same formulation as the carbon fiber.

Example 10—Improved Heat Exchanger Applications

There are a large number of applications and areas in which the carbon fiber heat exchanger technology described herein could be integrated with. These include, but are not limited to the following:

Improved Heat Exchangers in Commercial Products—

The heat exchangers described herein are lightweight and more efficient than conventional heat exchangers. As a result, these heat exchangers are able to replace conventional heat exchangers found in a number of commercial electronics such as fans, heat fins, etc. The present invention is also able to significantly reduce the mass of portable thermoelectric generation systems.

Avionics—

Commercial aircraft companies, particularly the airline industries across the globe, are heavily focused on reduction of the mass of the plane. The mass dictates such critical factors as fuel usage and even the allowable number of passengers or cargo on a plane. By reducing the mass of current thermal management systems, the present heat exchanger product is able to reduce costs and potentially improve the performance of aircraft by replacing the existing copper, aluminum, and other thermal management components found in the avionics bays.

UAV's and Other Unmanned Vehicles—

Many drone/unmanned vehicle manufacturers have similar issues in that heat pipes, traditional thermal straps, and active cooling systems, either are not providing enough cooling capacity or they weigh too much. The present heat exchanger technology provides a benefit to UAV technology/products due to the simplified, lower weight, and improved thermal management systems.

Rocket Nozzle Cooling—

In applications like rocket nozzle and thruster cooling, operating temperatures can reach 1400K-1600K; well above the melting point of traditional heat exchangers and thermal strap materials. Thus, there is a need for flexible thermal strap technology with the ability to transfer heat more efficiently than current materials. However, a GWC made entirely of graphite fiber and other high-temperature resistant materials, would survive these operating temperatures and provide 20-30 times the conductance of materials that are currently used, which average at just 25-40 W/(m-K).

Improved Graphite Thermal Straps—

The potential benefits of a woven sheet of high conductance graphite over existing graphite fiber ropes or thin, extremely delicate pyrolytic graphite (PGS) and graphene sheets is significant. This material could be used in place of any other carbon/graphite-based thermal strap products currently on the market. Not only would the woven sheet material offer improved flexibility over current graphite rope technology, but it would offer far greater durability than PGS straps, a delicate film, susceptible to tearing from simple mishandling, large scale range of motion, flexing on the lateral axis, and typical shock and vibration profiles. Unlike PGS/Graphene Sheet, and Aluminum or Copper Foil Straps, the graphite woven sheet strap would offer flexibility on all 3 axes. It will also include the low profile-to-high thermal performance ratio that made bulky, stiff aluminum and copper foil strap counterparts popular in low profile/volume-restricted applications (as commonly found in spacecraft/satellite electronics boxes).

STATEMENTS REGARDING INCORPORATION BY REFERENCE AND VARIATIONS

All references throughout this application, for example patent documents including issued or granted patents or equivalents; patent application publications; and non-patent literature documents or other source material are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

The terms and expressions which have been employed herein are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments, exemplary embodiments and optional features, modification and variation of the concepts herein disclosed may be resorted to by those skilled in the art, and that such modifications and variations are considered to be within the scope of this invention. The specific embodiments provided herein are examples of useful embodiments of the present invention and it will be apparent to one skilled in the art that the present invention may be carried out using a large number of variations of the devices, device components, methods and steps set forth in the present description. As will be obvious to one of skill in the art, methods and devices useful for the present embodiments can include a large number of optional device components, compositions, materials, combinations and processing elements and steps.

Every device, system, combination of components or method described or exemplified herein can be used to practice the invention, unless otherwise stated.

When a group of substituents is disclosed herein, it is understood that all individual members of that group and all subgroups, including any device components, combinations, materials and/or compositions of the group members, are disclosed separately. When a Markush group or other grouping is used herein, all individual members of the group and all combinations and subcombinations possible of the group are intended to be individually included in the disclosure.

Whenever a range is given in the specification, for example, a number range, a temperature range, a time range, or a composition or concentration range, all intermediate ranges and subranges, as well as all individual values included in the ranges given are intended to be included in the disclosure. It will be understood that any subranges or individual values in a range or subrange that are included in the description herein can be excluded from the claims herein.

All patents and publications mentioned in the specification are indicative of the levels of skill of those skilled in the art to which the invention pertains. References cited herein are incorporated by reference herein in their entirety to indicate the state of the art as of their publication or filing date and it is intended that this information can be employed herein, if needed, to exclude specific embodiments that are in the prior art.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. In each instance herein any of the terms "comprising", "consisting essentially of" and "consisting of" may be replaced with either of the other two terms. The invention illustratively described herein suitably may be practiced in the absence of any element or elements and/or limitation or limitations, which are not specifically disclosed herein.

One of ordinary skill in the art will appreciate that compositions, materials, components, methods and/or processing steps other than those specifically exemplified can be employed in the practice of the invention without resort to undue experimentation. All art-known functional equivalents, of any such compositions, materials, components, methods and/or processing steps are intended to be included in this invention. The terms and expressions which have been employed are used as terms of description and not of limitation, and there is no intention in the use of such terms and expressions of excluding any equivalents of the features shown and described or portions thereof, but it is recognized that various modifications are within the scope of the invention claimed. Thus, it should be understood that although the present invention has been specifically disclosed by exemplary embodiments and optional features, modification and variation of the concepts herein disclosed may be resorted to by those skilled in the art, and that such modifications and variations are considered to be within the scope of this invention as defined by the appended claims.

It must be noted that as used herein and in the appended claims, the singular forms "a", "an", and "the" include plural reference unless the context clearly dictates otherwise. Thus, for example, reference to "a layer" includes a plurality of layers and equivalents thereof known to those skilled in the art, and so forth. As well, the terms "a" (or "an"), "one or more" and "at least one" can be used interchangeably herein. It is also to be noted that the terms "comprising", "including", and "having" can be used interchangeably. The expression "of any of claims XX-YY" (wherein XX and YY refer to claim numbers) is intended to provide a multiple dependent claim in the alternative form, and in some embodiments is interchangeable with the expression "as in any one of claims XX-YY."

Unless defined otherwise, all technical and scientific terms used herein have the same meanings as commonly understood by one of ordinary skill in the art to which this invention belongs. Although any methods and materials similar or equivalent to those described herein can be used in the practice or testing of the present invention, the preferred methods and materials are described.

We claim:

1. A heat exchanger comprising:
   a) one or more flexible carbon fiber sheets, each of the one or more flexible carbon fiber sheets having a first end and a second end and comprising a plurality of carbon fibers oriented in a direction extending from the first end to the second end, wherein the one or more flexible carbon fiber sheets are thermally anisotropic in the direction extending from the first end to the second end, wherein the one or more flexible carbon fiber sheets have a bend radius less than or equal to 10 inches; and
   b) a support structure comprising one or more holding regions, wherein the one or more flexible carbon fiber sheets are connected to the support structure at the one or more holding regions,
   wherein the one or more flexible carbon fiber sheets are held in a flat form by fiberglass thread, and wherein the plurality of carbon fibers are held in place with the fiberglass thread such that the plurality of carbon fibers are oriented in a single direction extending from the first end of the flexible carbon fiber sheet to the second end of the carbon fiber sheet, and the fiberglass thread forms a cross-thread.

2. A heat exchanger system comprising:
   the heat exchanger of claim 1,
   a high temperature heat source in thermal communication with the first ends of the one or more flexible carbon fiber sheets;
   a lower temperature source in thermal communication with the second ends of the one or more flexible carbon fiber sheets; and
   at least one of: (i) a first fluid contacting the high temperature heat source and the one or more flexible carbon fiber sheets at or near the first ends, and (ii) a second fluid contacting the lower temperature source and the one or more flexible carbon fiber sheets at or near the second ends;
   wherein, when the first fluid and second fluid are both present, the first fluid and second fluid are, independently from one another, a liquid or a gas.

3. The heat exchanger system of claim 2, wherein the high temperature heat source is a first surface of a thermoelectric generator, and the one or more flexible carbon fiber sheets are able to transfer heat away from the first surface of the thermoelectric generator.

4. The heat exchanger system of claim 2, wherein the high temperature heat source is an electronic device or an enclosure of an electronic device.

5. The heat exchanger system of claim 2, wherein the high temperature heat source and/or the lower temperature source is a fluid conduit.

6. The heat exchanger system of claim 2, wherein the first fluid, second fluid, or both, are air.

7. The heat exchanger system of claim 2, wherein the first or second fluid is a gas and the other fluid is a liquid.

8. The heat exchanger system of claim 2, wherein the first ends of the one or more flexible carbon fiber sheets are in direct physical contact with the high temperature heat source, and wherein heat transfer at the first ends one end of the one or more flexible carbon fiber sheets occurs substantially only by conduction, and heat transfer at the second ends of the one or more flexible carbon fiber sheets occurs substantially only by convection or substantially only by convection and radiation.

9. The heat exchanger system of claim 2, wherein heat transfer between the one or more flexible carbon fiber sheets and the lower temperature source occurs substantially only by convection or substantially only by convection and radiation through the second fluid.

10. The heat exchanger system of claim 2, wherein heat transfer between the one or more flexible carbon fiber sheets and the high temperature heat source occurs substantially only by convection or substantially only by convection and radiation through the first fluid.

11. The heat exchanger of claim 1 wherein the one or more flexible carbon fiber sheets comprise one or more graphite fiber sheets and the plurality of carbon fibers comprise a plurality of graphite fibers.

12. The heat exchanger of claim 11, wherein the plurality of graphite fibers are woven to form the one or more graphite fiber sheets, wherein the one or more graphite fiber sheets have a thermal conductivity of at least 400 W m-1 K-1.

13. The heat exchanger of claim 11 comprising 10 or more graphite fiber sheets.

14. The heat exchanger of claim 1, wherein the one or more flexible carbon fiber sheets have a bend radius less than or equal to 1 inch.

15. The heat exchanger of claim 1, wherein the carbon fiber sheets have a bend radius selected from the range of 1 mm to 5 inches, a vibration resistance of at least 800 Hz, and a shock resistance of at least 1,000 Hz.

16. The heat exchanger of claim 1, wherein the one or more flexible carbon fiber sheets have a thermal conductivity of at least 800 W m-1 K-1.

17. The heat exchanger of claim 1, wherein the one or more flexible carbon fiber sheets have a per unit mass thermal conductance that is at least five times greater than the per unit mass thermal conductance of copper.

18. The heat exchanger of claim 1, wherein the one or more flexible carbon fiber sheets are capable of withstanding temperatures of at least 600° C., and have a bend radius less than or equal to 2 inches.

19. The heat exchanger of claim 1, wherein the plurality of carbon fibers comprise pitch-based fibers.

20. A method for transferring heat comprising the steps of:
a) providing a heat exchanger, said heat exchanger comprising:
   i) one or more flexible carbon fiber sheets, each of the one or more flexible carbon fiber sheets having a first end and a second end and comprising a plurality of carbon fibers oriented in a direction extending from the first end to the second end, wherein the one or more flexible carbon fiber sheets are thermally anisotropic in the direction extending from the first end to the second end, wherein the one or more flexible carbon fiber sheets have a bend radius less than or equal to 10 inches, and
   ii) a support structure comprising one or more holding regions, wherein the one or more flexible carbon fiber sheets are connected to the support structure at the one or more holding regions;
b) positioning the first ends of the one or more flexible carbon fiber sheets to be in thermal communication with a high temperature heat source, and the second ends of the one or more flexible carbon fiber sheets to be in thermal communication with a lower temperature source;
c) transferring heat between the high temperature heat source and the lower temperature source, wherein the first fluid and second fluid are, independently from one another, a liquid or a gas,
wherein the one or more flexible carbon fiber sheets are held in a flat form by fiberglass thread, and wherein the plurality of carbon fibers are held in place with the fiberglass thread such that the plurality of carbon fibers are oriented in a single direction extending from the first end of the flexible carbon fiber sheet to the second end of the carbon fiber sheet, and the fiberglass thread forms a cross-thread.

21. The method of claim 20 wherein the one or more flexible carbon fiber sheets are each a woven graphite fiber sheet.

22. The method of claim 20 wherein heat transfer between the one or more flexible carbon fiber sheets and the lower temperature source occurs substantially only by convection or substantially only by convection and radiation through a second fluid.

23. The method of claim 20, wherein the high temperature heat source is an electronic device or an enclosure of an electronic device.

24. The heat exchanger of claim 1, wherein each of the one or more flexible carbon fiber sheets is encapsulated within a flexible structural shell comprising a metal or synthetic fibers.

* * * * *